(12) United States Patent
Lyu et al.

(10) Patent No.: US 11,525,669 B2
(45) Date of Patent: Dec. 13, 2022

(54) LASER PROJECTION MODULE, DEPTH CAMERA AND ELECTRONIC DEVICE

(71) Applicant: Guangdong Oppo Mobile Telecommunications Corp., Ltd., Guangdong (CN)

(72) Inventors: Jie Lyu, Guangdong (CN); Caiquan Cheng, Guangdong (CN); Kan Peng, Guangdong (CN); Xinglong You, Guangdong (CN); Xin Yang, Guangdong (CN); Yuhu Jia, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 553 days.

(21) Appl. No.: 16/484,705

(22) PCT Filed: Jan. 30, 2019

(86) PCT No.: PCT/CN2019/073949
§ 371 (c)(1),
(2) Date: Aug. 8, 2019

(87) PCT Pub. No.: WO2019/165879
PCT Pub. Date: Sep. 6, 2019

(65) Prior Publication Data
US 2021/0356256 A1 Nov. 18, 2021

(30) Foreign Application Priority Data

Feb. 27, 2018 (CN) .......................... 201810161928.6
Feb. 27, 2018 (CN) ......................... 201810162402.X
(Continued)

(51) Int. Cl.
*G02B 27/20* (2006.01)
*G01B 11/22* (2006.01)
(Continued)

(52) U.S. Cl.
CPC .............. *G01B 11/22* (2013.01); *G02B 7/022* (2013.01); *G02B 7/025* (2013.01); *G02B 27/30* (2013.01);
(Continued)

(58) Field of Classification Search
CPC ................... G01B 11/22; G06T 7/521; G06T 2207/10028; G02B 7/022; G02B 7/025;
(Continued)

(56) References Cited

U.S. PATENT DOCUMENTS

2011/0114857 A1   5/2011  Akerman et al.
2011/0249239 A1  10/2011  Seo et al.
2012/0206046 A1*  8/2012  Huang ................... G02B 27/20
                                                                  315/118

FOREIGN PATENT DOCUMENTS

CN      100368849 C  *  2/2008
CN      102062952 A      5/2011
(Continued)

OTHER PUBLICATIONS

India Office Action for IN Application 201917036388 dated Jan. 28, 2021. (5 pages).
(Continued)

*Primary Examiner* — Patrick E Demosky
(74) *Attorney, Agent, or Firm* — Young Basile Hanlon & MacFarlane, P.C.

(57) ABSTRACT

A laser projection module is provided. The laser projection module includes a substrate assembly, a lens barrel assembly, a light source, a diffractive optical element and a collimation element. The lens barrel assembly includes a
(Continued)

lens barrel and a stop member connected to the lens barrel. The lens barrel is disposed on the substrate assembly and configured to define a receiving cavity together with the substrate assembly. The light source is disposed on the substrate assembly, accommodated in the receiving cavity, and configured to emit laser to the receiving cavity. The diffractive optical element and the collimation element are accommodated in the receiving cavity. The light source, the collimation element and the diffractive optical element are sequentially disposed in an optical path of the light source. The stop member is configured to prevent the diffractive optical element from moving in a light-emitting direction of the laser projection module.

4 Claims, 30 Drawing Sheets

(30) Foreign Application Priority Data

| Feb. 27, 2018 | (CN) | 201810162420.8 |
| Feb. 27, 2018 | (CN) | 201820278549.0 |
| Feb. 27, 2018 | (CN) | 201820278745.8 |
| Feb. 27, 2018 | (CN) | 201820280990.2 |
| Feb. 27, 2018 | (CN) | 201820281035.0 |
| Aug. 22, 2018 | (CN) | 201821367897.1 |

(51) Int. Cl.
| *G06T 7/521* | (2017.01) |
| *G02B 7/02* | (2021.01) |
| *G02B 27/30* | (2006.01) |
| *G02B 27/42* | (2006.01) |
| *H04N 5/225* | (2006.01) |

(52) U.S. Cl.
CPC .......... *G02B 27/4205* (2013.01); *G06T 7/521* (2017.01); *H04N 5/2252* (2013.01); *H04N 5/2256* (2013.01); *G06T 2207/10028* (2013.01)

(58) Field of Classification Search
CPC .... G02B 27/30; G02B 27/4205; G02B 27/20; H04N 5/2252; H04N 5/2256; H01S 5/02253; H01S 5/02415; H01S 5/0222; H01S 5/02212
See application file for complete search history.

(56) References Cited

FOREIGN PATENT DOCUMENTS

| CN | 103309137 A | 9/2013 |
| CN | 204790290 U | 11/2015 |
| CN | 105324631 A | 2/2016 |
| CN | 106461901 A | 2/2017 |
| CN | 206209271 U | 5/2017 |
| CN | 107102506 A | 8/2017 |
| CN | 107257938 A | 10/2017 |
| CN | 107608167 A | 1/2018 |
| CN | 108181777 A | 6/2018 |
| CN | 108344374 A | 7/2018 |
| CN | 207780464 U | 8/2018 |
| CN | 208110247 U | 11/2018 |
| EP | 3142200 A1 | 3/2017 |
| KR | 20120007668 A | 1/2012 |
| TW | 201316070 A | 4/2013 |
| WO | 2016160704 A1 | 10/2016 |

OTHER PUBLICATIONS

English translation of OA for TW application 108106939 dated Jan. 15, 2020.
OA for EP application 19752412.7 dated Mar. 3, 2020.

* cited by examiner

US 11,525,669 B2

LASER PROJECTION MODULE, DEPTH CAMERA AND ELECTRONIC DEVICE

CROSS-REFERENCE TO RELATED APPLICATION(S)

The present application is a 371 application of International Patent Application No. PCT/CN2019/073949, filed on Jan. 30, 2019, which claims priority to Chinese Patent Application Nos. 201820280990.2, 201810162402.X, 201820281035.0, 201810161928.6, 201810162420.8, 201820278549.0 and 201820278745.8, all filed on Feb. 27, 2018, and Chinese Patent Application No. 201821367897.1, filed on Aug. 22, 2018, the entire disclosure of all of which are hereby incorporated by reference.

TECHNICAL FIELD

The present disclosure relates to fields of optics and electronic technique, and more particularly to a laser projection module, a depth camera and an electronic device.

BACKGROUND

The existing projection module generally includes a frame, a light source, a collimation lens, a diffractive optical element and so on. The collimation lens is configured to collimate or concentrate the laser emitted from the light source of the projection module. The diffractive optical element (DOE) is configured to project the collimated or concentrated laser into a laser pattern. However, the diffractive optical element is usually adhered to the upper end of the frame by glue, but exposed to the outside of the frame, and thus tends to fall off.

SUMMARY

Embodiments of the present disclosure provide a laser projection module, a depth camera and an electronic device.

The laser projection module according to embodiments of the present disclosure includes a substrate assembly, a lens barrel assembly, a light source, a diffractive optical element and a collimation element. The lens barrel assembly includes a lens barrel and a stop member coupled to the lens barrel. The lens barrel is disposed on the substrate assembly and configured to define a receiving cavity together with the substrate assembly. The light source is disposed on the substrate assembly, accommodated in the receiving cavity, and configured to emit laser to the receiving cavity. The diffractive optical element and the collimation element are accommodated in the receiving cavity. The light source, the collimation element and the diffractive optical element are sequentially disposed in an optical path of the light source. The stop member is configured to prevent the diffractive optical element from moving in a light-emitting direction of the laser projection module.

The depth camera according to embodiments of the present disclosure includes a laser projection module and an image acquirer. The laser projection module includes a substrate assembly, a lens barrel assembly, a light source, a diffractive optical element and a collimation element. The lens barrel assembly includes a lens barrel and a stop member coupled to the lens barrel. The lens barrel is disposed on the substrate assembly and configured to define a receiving cavity together with the substrate assembly. The light source is disposed on the substrate assembly, and accommodated in the receiving cavity. The diffractive optical element and the collimation element are accommodated in the receiving cavity. The stop member is configured to prevent the diffractive optical element from moving in a light-emitting direction of the laser projection module. The image acquirer is configured to acquire the laser pattern projected by the laser projection module into a target space and reflected back by a target object after modulation.

The electronic device according to embodiments of the present disclosure includes a housing and a depth camera. The depth camera is arranged in the housing and configured to be exposed from the housing. The depth camera includes a laser projection module and an image acquirer. The laser projection module includes a substrate assembly, a lens barrel assembly, a light source, a diffractive optical element and a collimation element. The lens barrel assembly includes a lens barrel and a stop member coupled to the lens barrel. The lens barrel is disposed on the substrate assembly and configured to define a receiving cavity together with the substrate assembly. The light source is disposed on the substrate assembly, and accommodated in the receiving cavity. The diffractive optical element and the collimation element are accommodated in the receiving cavity. The stop member is configured to prevent the diffractive optical element from moving in a light-emitting direction of the laser projection module. The image acquirer is configured to acquire the laser pattern projected by the laser projection module into a target space and reflected back by a target object after modulation.

Additional aspects and advantages of the present disclosure will be given in the following description, some of which will become apparent from the following description or be learned from practices of the present disclosure.

BRIEF DESCRIPTION OF DRAWINGS

The above and/or additional aspects and advantages of the present disclosure will become apparent and easy to understand from descriptions of the embodiments with reference to the drawings.

DETAILED DESCRIPTION

Figure 1:
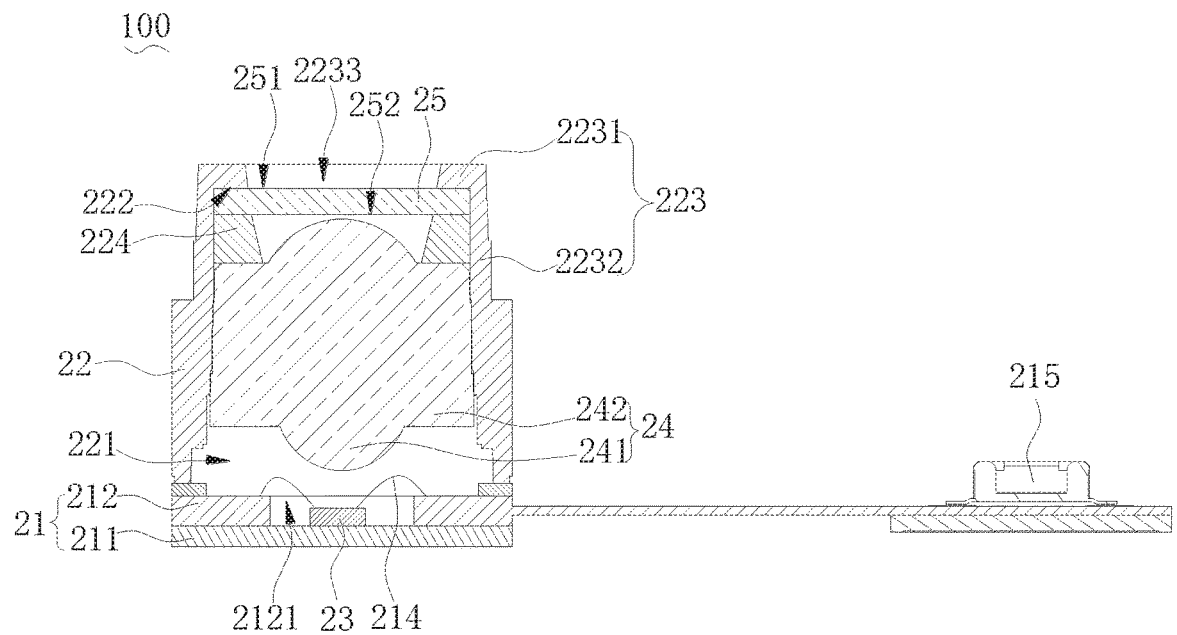
FIGS. 1 to 6 are schematic views illustrating a laser projection module according to a first part of embodiments of the present disclosure.

Embodiments of the present disclosure are further described with reference to the accompanying drawings. Same or similar reference signs represent the same or similar components or components that have the same or similar functions from beginning to end.

Moreover, the embodiments described below with reference to the accompanying drawings are exemplary, are merely used to explain the present disclosure, and cannot be construed as a limitation to the present disclosure.

In the descriptions of the present disclosure, it should be noted that, unless otherwise expressly specified and limited, the first feature "on" or "under" the second feature may be that the first and second features are in direct contact, or that the first and second features are in indirect contact through an intermediate medium. Moreover, the first feature "up", "above" and "on" the second feature may be that the first feature is directly above or obliquely above the second feature, or merely be that the first feature has a level higher than the second feature. The first feature "down", "below" and "under" the second feature may be that the first feature is directly below or obliquely below the second feature, or merely be that the first feature has a level less than the second feature.

Embodiments of the present disclosure provide a laser projection module. The laser projection module includes: a lens barrel assembly; a diffractive optical element accommodated in the lens barrel assembly; and a collimation element accommodated in the lens barrel assembly.

In some embodiments, the laser projection module further includes a substrate assembly and a light source, the lens barrel assembly is disposed on the substrate assembly and defines a receiving cavity together with the substrate assembly, the lens barrel assembly includes an abutting surface arranged in the receiving cavity and opposite to the substrate assembly, and the light source is disposed on the substrate assembly and accommodated in the receiving cavity. The collimation element is accommodated in the receiving cavity, the diffractive optical element is accommodated in the receiving cavity and abuts against the abutting surface, the light source, and the collimation element and the diffractive optical element are sequentially disposed in an optical path of the light source.

In some embodiments, the substrate assembly includes a circuit board, and the light source and the lens barrel assembly are disposed on the circuit board.

In some embodiments, the substrate assembly includes a substrate and a circuit board carried on the substrate, the circuit board is provided with a via hole, and the light source is carried on the substrate and accommodated in the via hole.

In some embodiments, the substrate is made of a metal material.

In some embodiments, the lens barrel assembly includes a lens barrel, and the lens barrel includes a top wall and an annular peripheral wall extending from the top wall. The peripheral wall is disposed on the substrate assembly, the top wall is provided with a light through hole communicating with the receiving cavity, and the abutting surface is a surface of the top wall in the receiving cavity.

In some embodiments, the laser projection module further includes a spacer ring arranged between the diffractive optical element and the collimation element, and two sides facing away from each other of the spacer ring abut against the collimation element and the diffractive optical element, respectively.

In some embodiments, the collimation element includes an optical portion and a mounting portion disposed around the optical portion, the optical portion includes two curved surfaces on two sides facing away from each other of the collimation element, the mounting portion abuts against the spacer ring, and one of the curved surfaces of the optical portion extends into the spacer ring.

In some embodiments, the lens barrel assembly includes a lens barrel and a protection cover, the lens barrel includes a top and a bottom facing away from each other, the lens barrel is provided with a through hole penetrating the top and the bottom, the bottom is carried on the substrate assembly, and an annular bearing stage is provided on an inner wall of the lens barrel and extends towards a center of the through hole. The protection cover is disposed on the top, two sides facing away from each other of the diffractive optical element abut against the protection cover and the bearing stage, respectively, and the abutting surface is a surface of the protection cover abutting against the diffractive optical element.

In some embodiments, the protection cover is made of a metal material.

In some embodiments, the protection cover is provided with a light through hole, and the light through hole is aligned with the through hole.

In some embodiments, the protection cover is made of a light transparent material.

In some embodiments, the collimation element includes an optical portion and a mounting portion disposed around the optical portion, the optical portion includes two curved surfaces on the two sides facing away from each other of the collimation element, the mounting portion abuts against the bearing stage, and one of the curved surfaces of the optical portion extends into the bearing stage.

In some embodiments, the lens barrel assembly includes a lens barrel and a protection cover, the lens barrel includes a top wall and an annular peripheral wall extending from the top wall, the peripheral wall is disposed on the substrate assembly, and the top wall is provided with a light through hole communicating with the receiving cavity. The protection cover is disposed on the top wall and includes a baffle and an annular side wall extending from the baffle, the baffle is provided with a light emitting through hole, the diffractive optical element is carried on the top wall and accommodated in the protection cover, two sides facing away from each other of the diffractive optical element abut against the protection cover and the top wall, respectively, and the abutting surface is a surface of the protection cover abutting against the diffractive optical element.

In some embodiments, the collimation element includes an optical portion and a mounting portion disposed around the optical portion, the optical portion includes two curved surfaces on the two sides facing away from each other of the collimation element, the mounting portion abuts against the top wall, and one of the curved surfaces of the optical portion extends into the light through hole.

In some embodiments, the lens barrel assembly includes: a lens barrel, the lens barrel including a first end surface and a second end surface facing away from each other and being provided with a receiving cavity passing through the first end surface and the second end surface, the first end surface being recessed towards the second end surface to define a mounting groove communicating with the receiving cavity, the diffractive optical element being mounted in the mounting groove, and the collimation element being mounted in the receiving cavity and arranged between the second end surface and the diffractive optical element; and a connecting member mounted on a side of the lens barrel where the first end surface is, and the diffractive optical element being clamped between the connecting member and a bottom surface of the mounting groove.

In some embodiments, the laser projection module further includes: a circuit board, the lens barrel is carried on the circuit board; and a light source carried on the circuit board and accommodated in the receiving cavity. The light source is opposite to the collimation element and configured to emit laser to the collimation element, the collimation element is configured to collimate the laser emitted from the light source, and the diffractive optical element is configured to project the laser collimated by the collimation element into a laser pattern.

In some embodiments, the lens barrel further includes an inner surface located in the receiving cavity and an outer surface facing away from the inner surface, and the outer surface is provided with an external thread. The connecting member includes a top wall and a connecting side wall extending from a side of the top wall, the connecting side wall is disposed around the top wall and is provided with an internal thread, the internal thread is screwed with the external thread to mount the connecting member to the lens barrel, and the top wall abuts agaisnt the diffractive optical element.

In some embodiments, the lens barrel further includes an inner surface located in the receiving cavity and an outer surface facing away from the inner surface, the outer surface of the lens barrel is recessed towards the receiving cavity to provide an annular notch, and a side surface of the notch is provided with an external thread. The connecting member includes a top wall and a connecting side wall extending from a side of the top wall, the connecting side wall is disposed around the top wall and is provided with an internal thread, the internal thread is screwed with the external thread to mount the connecting member to the lens barrel, the top wall abuts against the diffractive optical element, and an outer surface of the connecting side wall is flush with an outer surface of the barrel.

In some embodiments, the connecting member includes a top wall, a connecting side wall and a retaining portion, the top wall is provided with a light through hole in a center thereof, the connecting side wall extends from a side of the top wall and surrounds the light through hole, the top wall and the connecting side wall together define a mounting cavity which communicates with the light through hole, the retaining portion extends from the top wall towards a side where the mounting cavity is and surrounds the light through hole, and the diffractive optical element is clamped between the retaining portion and a bottom surface of the mounting groove.

In some embodiments, the lens barrel further includes an inner surface located in the receiving cavity and an outer surface facing away from the inner surface, and the inner surface enclosing the mounting groove is provided with an internal thread. The connecting member has a cylindrical shape, and an outer side surface of the connecting member is provided with an external thread, and the external thread is screwed with the internal thread to mount the connecting member in the mounting groove.

In some embodiments, the laser projection module further includes an annular elastic member, and the annular elastic member is disposed between the connecting member and the diffractive optical element.

In some embodiments, the lens barrel includes a barrel side wall and an annular position limiting ring extending from the barrel side wall towards a side where the receiving cavity is, the position limiting ring and the barrel side wall define an engaging groove together, and an inner surface of the barrel side wall enclosing the engaging groove is provided with an internal thread. The laser projection module further includes an annular pressing ring, the annular pressing ring is provided with an external thread, the external thread is screwed with the internal thread to mount the pressing ring in the engaging groove, and the collimation element is clamped between the pressing ring and the position limiting ring.

In some embodiments, the laser projection module further includes a substrate assembly and a light source, and the lens barrel assembly includes a lens barrel and a protection cover. The lens barrel includes a barrel side wall disposed on the substrate assembly and defines a receiving cavity together with the substrate assembly. The lens barrel includes a position limiting protrusion protruding inwards from the barrel side wall. The light source is disposed on the substrate assembly and configured to emit laser to the receiving cavity, the collimating component is received in the receiving cavity, the diffractive optical element is mounted on the position limiting protrusion, and the light source, the collimation element and the diffractive optical element are sequentially disposed in an optical path of the light source. The protection cover is engaged with the lens barrel, the protection cover includes a protection top wall provided with a light through hole corresponding to the diffractive optical element, and the diffractive optical element is arranged between the position limiting protrusion and the protection top wall.

In some embodiments, the lens barrel includes a first end surface and a second end surface facing away from each other, the second end surface is joined to the substrate assembly, the position limiting protrusion is arranged between the first end surface and the second end surface, and the protection top wall abuts against the first end surface.

In some embodiments, the lens barrel includes a first end surface and a second end surface facing away from each other, the second end surface is joined to the substrate assembly, the first end surface coincides with an upper surface of the position limiting protrusion, and the protection top wall abuts against the diffractive optical element.

In some embodiments, the protection cover further includes a protection side wall extending from a periphery of the protection top wall, the protection cover is covered on the lens barrel, and the protection side wall is fixedly connected to the barrel side wall.

In some embodiments, an outer surface of the barrel side wall is provided with a glue receiving groove, and the protection side wall is provided a glue dispensing hole at a position corresponding to the glue receiving groove so as to allow glue to enter the glue receiving groove via the glue dispensing hole.

In some embodiments, the glue dispensing hole corresponds to an inner side wall of the glue receiving groove, and the inner side wall is inclined and connected between an inner bottom wall of the glue receiving groove and the outer surface of the barrel side wall.

In some embodiments, the protection cover further includes an elastic first hook protruding inwards from the protection side wall, and the lens barrel further includes a second hook protruding outwards from the inner bottom wall of the glue receiving groove. The first hook is engaged with the second hook when the protection cover is disposed on the lens barrel.

In some embodiments, the protection side wall is provided with a relief hole at a position corresponding to the first hook, and the relief hole is configured to provide a deformation space when the first hook abuts against the second hook and is elastically deformed in the process of disposing the protection cover to the lens barrel.

In some embodiments, the second hook is provided with a guiding inclined surface, the guiding inclined surface gradually runs away from the inner bottom wall along a direction in which the protection cover is sleeved onto the lens barrel, and the first hook abuts against the guiding inclined surface during the process of covering the lens barrel with the protection cover.

In some embodiments, the protection side wall includes a plurality of protection segments which are sequentially connected end to end, and each protection segment is provided with the first hook and the glue dispensing hole.

In some embodiments, each protection side wall is provided with at least two glue dispensing holes, and the first hook is arranged between the at least two glue dispensing holes.

In some embodiments, the first hook is arranged at a middle portion of the corresponding protection segment, and the at least two glue dispensing holes of each protection segment are symmetrically distributed with respect to the first hook.

In some embodiments, the position limiting protrusion has a continuous annular shape; or a plurality of the position limiting protrusions are provided and spaced apart from one another.

In some embodiments, the laser projection module further includes a substrate assembly and a light source, and the lens barrel assembly includes a lens barrel and a protection cover. The lens barrel includes a barrel side wall disposed on the substrate assembly and defines a receiving cavity together with the substrate assembly. The lens barrel includes a position limiting protrusion protruding inwards from the barrel side wall and a fixing protrusion protruding outwards from the barrel side wall. The light source is disposed on the substrate assembly and configured to emit laser to the receiving cavity, the collimating component is received in the receiving cavity, the diffractive optical element is mounted on the position limiting protrusion, and the light source, the collimation element and the diffractive optical element are sequentially disposed in an optical path of the light source. The protection cover is disposed on the lens barrel, and includes a protection top wall and a protection side wall extending from the protection top wall. The protection top wall is provided with a light through hole which corresponds to the diffractive optical element, and the protection side wall is provided with a fixing hole, the fixing protrusion protrudes into the fixing hole, and the diffractive optical element is arranged between the position limiting protrusion and the protection top wall.

In some embodiments, the lens barrel includes a first end surface and a second end surface facing away from each other, the second end surface is joined with the substrate assembly, the position limiting protrusion is arranged between the first end surface and the second end surface, and the protection top wall abuts against the first end surface.

In some embodiments, the lens barrel includes a first end surface and a second end surface facing away from each other, and the second end surface is joined with the substrate assembly, the first end surface coincides with an upper surface of the position limiting protrusion, and the protection top wall abuts against the diffractive optical element.

In some embodiments, the position limiting protrusion includes a position limiting surface, the diffractive optical element is mounted on the position limiting surface, and the lens barrel is provided with a glue receiving groove in the position limiting surface.

In some embodiments, the position limiting protrusion is provided with a light via hole which corresponds to the light through hole, and the glue receiving groove is spaced apart from the light via hole.

In some embodiments, a plurality of the glue receiving grooves are provided, and the plurality of the glue receiving grooves are uniformly distributed at a periphery of the light via hole around an axis of the light via hole.

In some embodiments, the position limiting protrusion has a continuous annular shape; or a plurality of the position limiting protrusions are provided and spaced apart from one another.

In some embodiments, the protection side wall includes a plurality of protection segments which are sequentially connected end to end, at least two protection segments are provided with the fixing hole, the number of the fixing protrusions is identical to the number of the fixing holes, a position of the fixing protrusion corresponds to a position of the fixing hole, and each fixing protrusion protrudes into the corresponding fixing hole.

In some embodiments, at least two opposite protection segments are provided with the fixing hole.

In some embodiments, the fixing protrusion is provided with a guiding inclined surface, the guiding inclined surface gradually runs away from the barrel side wall along a direction in which the protection cover is sleeved onto the lens barrel, and the protection segment abuts against the guiding inclined surface during the process of disposing the protection cover to in the lens barrel.

In some embodiments, the light source includes an edge-emitting laser, and the edge-emitting laser includes a light emitting surface facing the collimation element.

In some embodiments, the laser projection module further includes a fixing member for fixing the edge-emitting laser to the substrate assembly.

In some embodiments, the fixing member includes a sealant arranged between the edge-emitting laser and the substrate assembly, and the sealant is a thermal conductive adhesive.

In some embodiments, the fixing member includes a support frame arranged on the substrate assembly, and the edge-emitting laser is fixed to the support frame.

In some embodiments, the laser projection module further includes a substrate assembly and a light source, and the lens barrel assembly includes a lens barrel and a protection cover. The lens barrel is disposed on the substrate assembly and defines a receiving cavity together with the substrate assembly. The lens barrel includes a barrel side wall, and the barrel side wall is provided with a side-wall groove. The light source is disposed on the substrate assembly and configured to emit laser to the receiving cavity, the collimating component is accommodated in the receiving cavity, the diffractive optical element is accommodated in the receiving cavity, and the light source, the collimation element and the diffractive optical element are sequentially disposed in an optical path of the light source. The protection cover includes a protection top wall and a protection side wall extending from the protection top wall, the protection top wall is provided with a light through hole which corresponds to the diffractive optical element, the protection side wall extends into the side-wall groove and is engaged with the barrel side wall, and the protection cover is configured to prevent the diffractive optical element from moving in a light-emitting direction of the laser projection module.

In some embodiments, the lens barrel includes a position limiting protrusion protruding from the barrel side wall into the receiving cavity, and the diffractive optical element is mounted on the position limiting protrusion and arranged between the position limiting protrusion and the protection top wall.

In some embodiments, the lens barrel includes a first end surface and a second end surface facing away from each other, the second end surface is joined to the substrate assembly, the lens barrel further includes a joint surface located between the first end surface and the second end surface, the protection top wall is joined to the joint surface, the position limiting protrusion is arranged between the second end surface and the joint surface, and the protection top wall is arranged between the joint surface and the first end surface.

In some embodiments, the position limiting protrusion includes a position limiting surface, the diffractive optical element is mounted on the position limiting surface, and the position limiting protrusion is provided with a light via hole corresponding to the light through hole.

In some embodiments, the barrel side wall further defines a position limiting groove, the position limiting groove is formed in a groove bottom of the side-wall groove, the protection cover includes an elastic hook protruding inwards from the protection side wall, and the hook protrudes into the position limiting groove to be engaged with the position limiting groove.

In some embodiments, the protection side wall is provided with a relief hole at a position corresponding to the hook, and the relief hole is configured to provide a deformation space when the hook abuts against the groove bottom and is elastically deformed in a process of disposing the protection cover on the lens barrel.

In some embodiments, the lens barrel includes a joint surface, the protection top wall is joined to the joint surface, and the lens barrel further includes a position limiting corner protruding from the joint surface. The protection side wall includes a plurality of protection segments, the protection top wall defines a position limiting notch, the position limiting notch spaces two adjacent protection segments apart from each other, and the position limiting corner is fitted with the position limiting notch.

In some embodiments, the light source includes an edge-emitting laser, the edge-emitting laser includes a light emitting surface facing the collimation element.

In some embodiments, the laser projection module further includes a fixing member for fixing the edge-emitting laser to the substrate assembly.

In some embodiments, the fixing member includes a sealant arranged between the edge-emitting laser and the substrate assembly, and the sealant is a thermal conductive adhesive.

In some embodiments, the fixing member includes at least two elastic support frames disposed on the substrate assembly, the at least two support frames together define a receiving space configured to receive the edge-emitting laser, and the at least two support frames are configured to support the edge-emitting laser.

Embodiments of the present disclosure provide a depth camera, including: a laser projection module according to above embodiments of the present disclosure; and an image acquirer configured to acquire a laser pattern projected by the laser projection module into a target space and reflected back by a target object after modulation.

In some embodiments, the depth camera further includes a processor. The processor is connected to the laser projection module and the image acquirer, respectively, and is configured to process the laser pattern to obtain a depth image.

Embodiments of the present disclosure provide an electronic device, including: a housing; and a depth camera according to above embodiments of the present disclosure. The depth camera is disposed in the housing.

Embodiments of the present disclosure provide a laser projection module 100. The laser projection module 100 includes a lens barrel assembly, a diffractive optical element and a collimation element. The diffractive optical element is accommodated in the lens barrel assembly, and the collimation element is accommodated in the lens barrel assembly.

In the laser projection module 100 according to the embodiment of the present disclosure, the diffractive optical element is arranged and accommodated in the lens barrel assembly, such that it is not easy for the diffractive optical element to be detached from the lens barrel assembly. The laser projection module 100 will be described below in five parts (first part, second part, third part, fourth part and fifth part) of embodiments.

FIGS. 1 to 6 are descriptions of the first part of embodiments of the present disclosure. It should be noted that the first part of embodiments of the present disclosure may be independent from the remaining parts (the second part, the third part, the fourth part, the fifth part) of embodiments of the present disclosure. Certainly, it can be understood that those skilled in the art can also combine the first part of embodiments of the present disclosure with the rest parts (the second part, the third part, the fourth part, the fifth part) of embodiments of the present disclosure in the case of no technical obstacles, without being limited by differences of element names and reference signs.

As illustrated in FIG. 1, a laser projection module 100 according to the first part of embodiments of the present disclosure includes a substrate assembly 21, a lens barrel assembly 22, a light source 23, a collimation element 24 and a diffractive optical element 25. The lens barrel assembly 22 is disposed on the substrate assembly 21 and defines a receiving cavity 221 together with the substrate assembly 21. The lens barrel assembly 22 includes an abutting surface 222 which is arranged in the receiving cavity 221 and opposite to the substrate assembly 21. The light source 23 is disposed on the substrate assembly 21 and accommodated in the receiving cavity 221. The collimation element 24 is accommodated in the receiving cavity 221. The diffractive optical element 25 is accommodated in the receiving cavity 221 and abuts against the abutting surface 222. The light source 23, the collimation element 24 and the diffractive optical element 25 are sequentially disposed in an optical path of the light source 23.

Specifically, the light source 23 is disposed on the substrate assembly 21, and the collimation element 24 and the diffractive optical element 25 may be fixed in the receiving cavity 221 of the lens barrel assembly 22, for example, being fixed to the lens barrel assembly 22 by adhering. The diffractive optical element 25 abuts against the abutting surface 222 to prevent the diffractive optical element 25 from falling out of the lens barrel assembly 22 in a light-emitting direction.

When the laser projection module 100 is assembled, the diffractive optical element 25, the collimation element 24, and the substrate assembly 21 on which the light source 23 is mounted are sequentially placed in the lens barrel assembly 22. The light source 23 may be first disposed on the substrate assembly 21, and then the substrate assembly 21 carried with the light source 23 is combined with the lens barrel assembly 22.

The laser projection module 100 according to the first part of embodiments of the present disclosure may be used for stereoscopic imaging. Specifically, light beams emitted by the light source 23 are collimated or concentrated by the collimation element 24, then expanded by the diffractive optical element 25 and further emitted outwards in a certain laser pattern which is projected to a surface of a target object. In some embodiments, the laser pattern modulated by the target object may be acquired by an infrared camera (which may be an image acquirer 200 illustrated in FIG. 7), and a depth image of the target object is obtained by analyzing and calculating the modulated laser pattern.

The laser projection module 100 according to the first part of embodiments of the present disclosure abuts the diffractive optical element 25 by the abutting surface 222 of the lens barrel assembly 22 to accommodate the diffractive optical element 25 in the receiving cavity 221. The laser projection module 100 has a simple structure and is convenient to assemble, and it is possible to prevent the diffractive optical element 25 from falling off in the light-emitting direction.

As further illustrated in FIG. 1, the laser projection module 100 according to the first part of embodiments of the present disclosure includes the substrate assembly 21, the lens barrel assembly 22, the light source 23, the collimation element 24 and the diffractive optical element 25. The light source 23, the collimation element 24 and the diffractive optical element 25 are sequentially arranged in the optical path of the light source 23.

The substrate assembly 21 includes a substrate 211 and a circuit board 212 carried on the substrate 211.

The substrate 211 is configured to carry the lens barrel assembly 22, the light source 23 and the circuit board 212. The material of the substrate 211 may be plastic, for example, at least one of Polyethylene Glycol Terephthalate (PET), Polymethyl Methacrylate (PMMA), Polycarbonate (PC), and Polyimide (PI). That is to say, the substrate 211 may be made of a single plastic material of any one of PET, PMMA, PC or PI. As a result, the substrate 211 is light in weight and has sufficient support strength.

The circuit board 212 is provided with a via hole 2121. The circuit board 212 may be any one of a printed circuit board (PCB), a flexible circuit board (FPC), and a rigid-flex board. One end of the circuit board 212 is connected to the connector 215 via a flexible circuit board. In other embodiments, a part of the circuit board 212 may also be located within the receiving cavity 221, while another part of the circuit board 212 protrudes out of the lens barrel assembly 22. Specifically, one end of the circuit board 212 is located in the receiving cavity 221 and is configured to carry the light source 23, and the other end of the circuit board 212 protrudes out and is connected to the connector 215. The connector 215 may be connected to other electronic devices such as a main board of an electronic device.

The lens barrel assembly 22 is disposed on the substrate assembly 21 and defines the receiving cavity 221 together with the substrate assembly 21. The lens barrel assembly 22 includes the abutting surface 222 that is located within the receiving cavity 221 and opposite the substrate 211. Specifically, in this embodiment, the lens barrel assembly 22 includes a lens barrel 223. The lens barrel 223 has a top wall 2231 and an annular peripheral wall 2232 extending from the top wall 2231. The peripheral wall 2232 is disposed on the substrate assembly 21, and the top wall 2231 is provided with a light through hole 2233 communicating with the receiving cavity 221. The abutting surface 222 is a surface of the top wall 2231 located in the receiving cavity 221. The light through hole 2233 corresponds to the light source 23, and the laser pattern projected by the diffractive optical element 25 is emitted through the light through hole 2233. The peripheral wall 2232 may be fixed to the circuit board 212, such as by adhering via glue.

The light source 23 is configured to emit laser. The light source 23 is carried on the substrate 211 and accommodated in the via hole 2121. The via hole 2121 has a size corresponding to the size of the light source 23. That is, the size of the via hole 2121 is larger than the size of the light source 23, or the size of the via hole 2121 is equivalent to the size of the light source 23. The light source 23 may include a semiconductor substrate and a laser emitter disposed on the semiconductor substrate. The semiconductor substrate is disposed on the substrate 211. The laser emitter may be a Vertical Cavity Surface Emitting Laser (VCSEL). The semiconductor substrate may be provided with a single laser emitter, or an array laser consisting of a plurality of laser emitters. Specifically, the plurality of laser emitters are arranged on the semiconductor substrate in a regular or irregular two-dimensional pattern. The light source 23 also includes a cathode and an anode. The anode and the cathode are connected to positive and negative electrodes of the circuit board 212 via wires 214, respectively.

The collimation element 24 is configured to collimate the laser emitted by the light source 23. The collimation element 24 is accommodated in the receiving cavity 221. The collimation element 24 is an optical lens. Specifically, the collimation element 24 includes an optical portion 241 and a mounting portion 242 disposed around the optical portion 241. The optical portion 241 has two curved surfaces on two sides of the collimation element 24, and the two sides of the collimation element 24 face away from each other.

The diffractive optical element (DOE) 25 is accommodated in the receiving cavity 221. The diffractive optical element 25 includes a first end surface 251 and a second end surface 252 facing away from each other, and the first end surface 251 abuts against the abutting surface 222. More specifically, the diffractive optical element 25 is aligned with the light through hole 2233 of the lens barrel assembly 22, and the top wall 2231 abuts against the diffractive optical element 25 to fix the diffractive optical element 25 in the receiving cavity 221, such that the diffractive optical element 25 will not fall out of the receiving cavity 221 in the light-emitting direction. The diffractive optical element 25 has a diffractive structure on its surface, and the laser collimated by the collimation element 24 may be projected into a laser pattern corresponding to the diffractive structure. The diffractive optical element 25 may be made of glass or a composite plastic such as PET.

When the above laser projection module 100 is assembled, the diffractive optical element 25, the collimation element 24, and the substrate assembly 21 on which the light source 23 is mounted are sequentially placed in the lens barrel assembly 22 along the optical path. The first end surface 251 of the diffractive optical element 25 abuts against the abutting surface 222, the second end surface 252 is opposite to one curved surface of the optical portion 241, and the other curved surface of the optical portion 241 is opposite to the light source 23. The light source 23 may be mounted on the substrate assembly 21 first, and then the substrate assembly 21 provided with the light source 23 is combined with the lens barrel assembly 22.

In the laser projection module 100 according to the first part of embodiments of the present disclosure, the top wall 2231 of the lens barrel assembly 22 abuts against the diffractive optical element 25 to accommodate the diffractive optical element 25 in the receiving cavity 221. The laser projection module 100 has a simple structure and is easy to assemble, and the diffractive optical element 25 can be prevented from falling off in the light-emitting direction. In addition, the circuit board 212 of the substrate assembly 21 is provided with the via hole 2121 and the light source 23 is received in the via hole 2121, which reduces a thickness of the laser projection module 100 in a direction of the optical path.

In some embodiments, the substrate 211 may also be made of a heat dissipating material. For example, the substrate 211 is made of a non-conductive ceramic material which possesses good thermal conductivity and good stability. Further, the substrate 211 may also be made of a metal material, for example, any one of aluminum, gold and copper, or an alloy of any one of aluminum, gold and copper. As a result, the substrate 211 may dissipate heat of the light source 23 while carrying the light source 23 and the lens barrel assembly 22, thereby improving the service life of the laser projection module 100.

Figure 2:
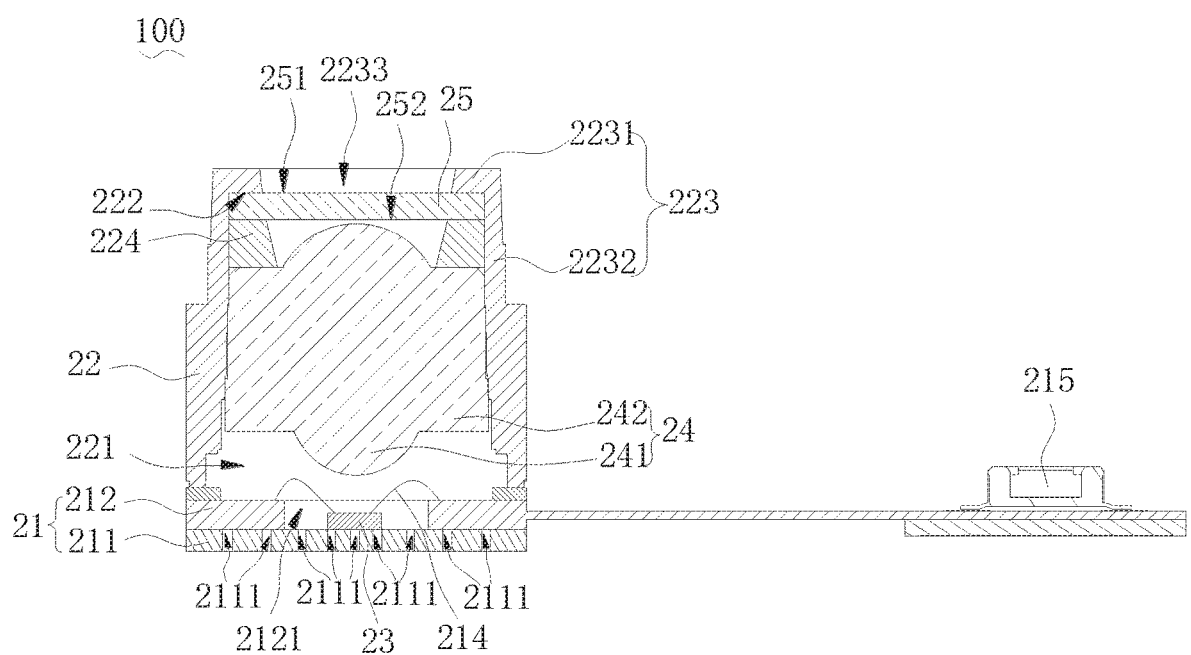

As illustrated in FIG. 2, in some embodiments, the substrate 211 is provided with a heat dissipation hole 2111 which may be a blind hole formed in a side of the substrate 211 adjacent to the light source 23, or be a through hole. The shape of the heat dissipation hole 2111 may be circular or rectangular. Further, one heat dissipation hole 2111 may be provided, and the one heat dissipation hole 2111 is formed in the substrate 211 at a position corresponding to the light source 23. A plurality of the heat dissipation holes 2111 may also be provided. The plurality of the heat dissipation holes 2111 may be arranged in the substrate 211 by a form of a matrix, or may be closely arranged adjacent to the light source 23 (as illustrated in FIG. 2).

In other embodiments, the heat dissipation hole 2111 may also be filled with thermal silicone grease or heat conductive materials (such as silver, copper, gold, etc.) for heat dissipation. When the material of the substrate 211 is ceramic and is provided with the heat dissipation hole 2111 as described above, the heat dissipation hole 2111 is filled with the thermal silicone grease or heat conductive materials (such as silver, copper, gold, etc.) to dissipate heat. Thus, the obtained thermal conductivity is better than the thermal conductivity of the substrate 211 directly made of a ceramic material. If the material of the substrate 211 is a metal material and is provided with the heat dissipation hole 2111 as described above, the heat dissipation hole 2111 is filled with a metal having a thermal conductivity better than that of the metal material. For example, when the material of the substrate 211 is aluminum, copper is injected into the heat dissipation hole 2111, and for another example, when the material of the substrate 211 is copper, gold is injected into the heat dissipation hole 2111. Thus, the obtained thermal conductivity is better than the thermal conductivity of the substrate 211 directly made of a metal material having a low thermal conductivity and a low cost, and the obtained cost is lower than the cost of the substrate 211 directly made of a metal material having a high thermal conductivity and a high cost. When the material of the substrate 211 is plastic and is provided with the heat dissipation hole 2111 as described above, the heat dissipation hole 2111 is filled with the thermal silicone grease or heat conductive materials (such as silver, copper, gold, etc.). The substrate 211 plays a supporting role on one hand, and functions as a heat sink on the other hand. Further, such substrate 211 provides a weight lighter than the quality of the substrate 211 directly made of a heat dissipating material (a metal material or a ceramic material).

Figure 3:
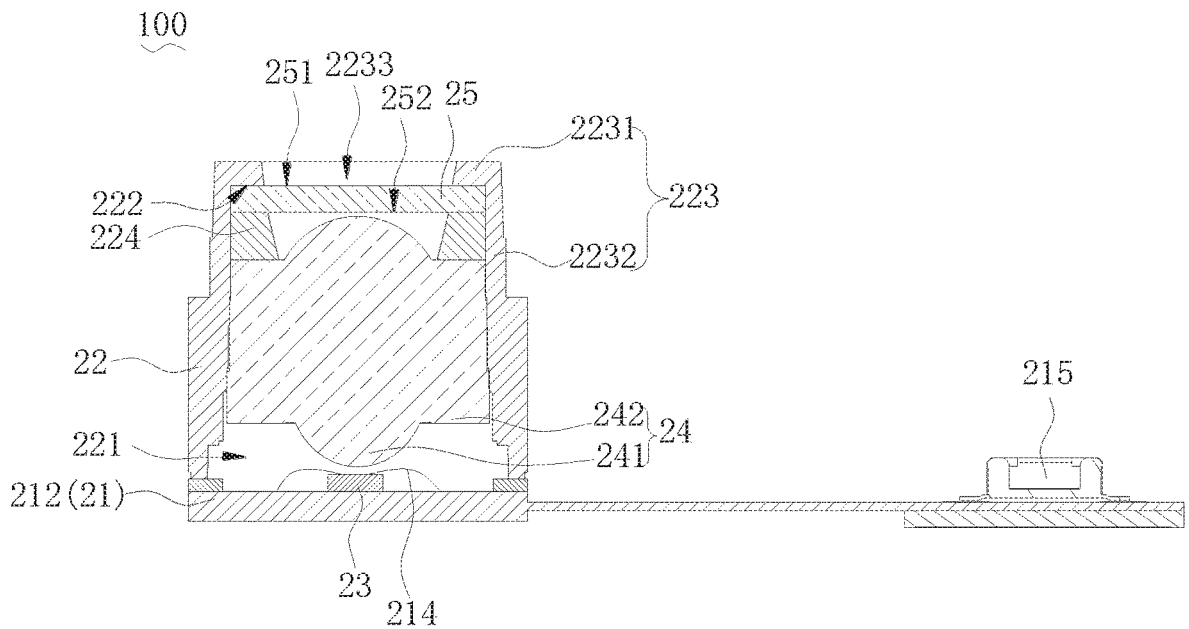

As illustrated in FIG. 3, in some embodiments, the substrate assembly 21 may only include the circuit board 212, and the light source 23 and the lens barrel assembly 22 are carried on the circuit board 212. The peripheral wall 2232 of the lens barrel 223 is adhered to the circuit board 212 by glue. As a result, the thickness of the laser projection module 100 is reduced. In other embodiments, the circuit board 212 may be provided with a groove, the light source 23 is arranged in the groove and connected thereto through pads. Consequently, the thickness of the laser projection module 100 is further reduced.

As illustrated in FIG. 1, in some embodiments, the laser projection module 100 further includes a spacer ring 224 disposed between the diffractive optical element 25 and the collimation element 24, and two sides facing away from each of the spacer ring 224 abut against the collimation element 24 and the diffractive optical element 25, respectively. The spacer ring 224 is arranged between the collimation element 24 and the diffractive optical element 25. Specifically, the spacer ring 224 is carried on and around the mounting portion 242 of the collimation element 24, and one curved surface of the optical portion 241 extends into the spacer ring 224. One side of the spacer ring 224 abuts against the mounting portion 242, and the other side of the spacer ring 224 abuts against the diffractive optical element 25. As a result, the spacer ring 224 can space the diffractive optical element 25 apart from the collimation element 24 without increasing the thickness of the laser projection module 100. In other embodiments, a relative position between the diffractive optical element 25 and the collimation element 24 can be adjusted by using spacer rings 224 of different thicknesses, so as to achieve a great optical effect.

Figure 4:
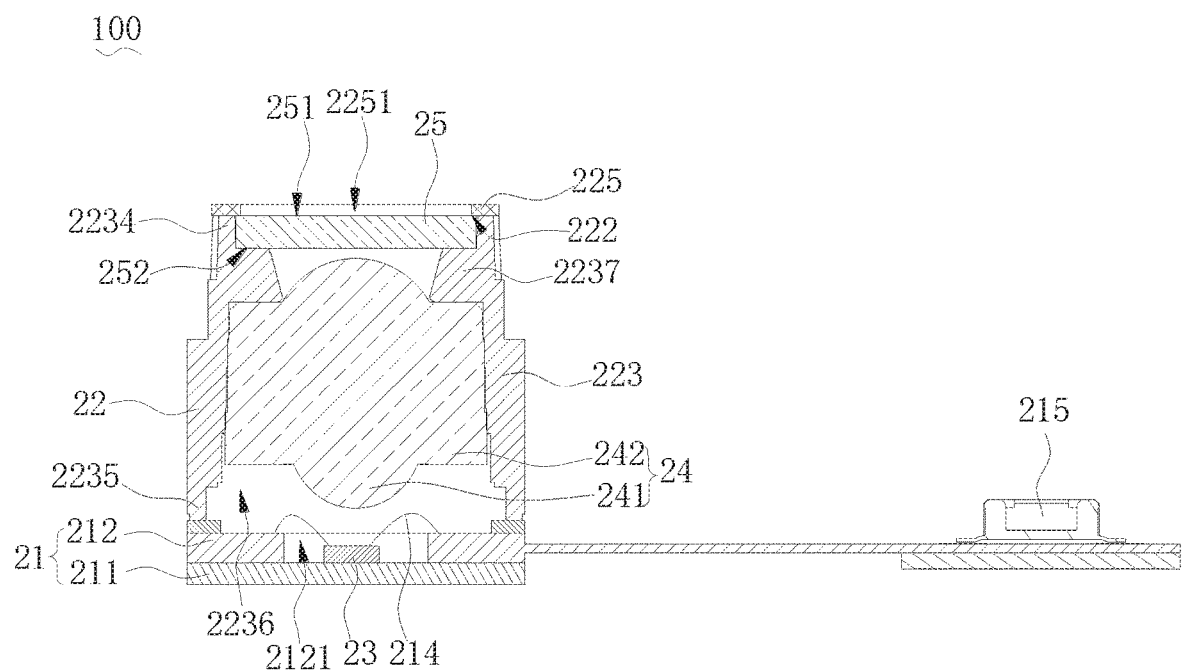

As illustrated in FIG. 4, in some embodiments, the structure of the lens barrel assembly 22 and position relationships between the structure of the lens barrel assembly 22 and the collimation element 24 as well as the diffractive optical element 25 according to the above embodiments may be changed as follows. The lens barrel assembly 22 includes a lens barrel 223 and a protection cover 225. The lens barrel 223 includes a top 2234 and a bottom 2235 facing away from each other and is formed with a through hole 2236 penetrating the top 2234 and the bottom 2235. The bottom 2235 is carried on the substrate assembly 21. An annular bearing stage 2237 is provided on an inner wall of the lens barrel 223 and extends towards a center of the through hole 2236. The protection cover 225 is disposed on the top 2234. The two sides facing away from each of the diffractive optical element 25 abut the protection cover 225 and the bearing stage 2237, respectively. The abutting surface 222 is a surface of the protection cover 225 abutting against the diffractive optical element 25.

Specifically, the diffractive optical element 25 has a first end surface 251 and a second end surface 252 facing away from each other. The protection cover 225 may be fitted over the top 2234 or adhered to the top 2234 by glue. The protection cover 225 abuts against the first end surface 251.

That is, the abutting surface 222 abuts against the diffractive optical element 25 to prevent the diffractive optical element 25 from falling off the through hole 2236 in the light-emitting direction.

In some embodiments, the protection cover 225 is made of a metal material such as silver nanowire, metal silver wire, copper sheet, or the like. The protection cover 225 made of a metal material is provided with a light through hole 2251 (as illustrate in FIG. 4). The light through hole 2251 is aligned with the through hole 2236 and the laser pattern projected by the diffractive optical element 25 is emitted through the light through hole 2251. The light through hole 2251 has an aperture smaller than at least one of a width or a length of the diffractive optical element 25, so as to accommodate the diffractive optical element 25 in the through hole 2236.

Figure 5:
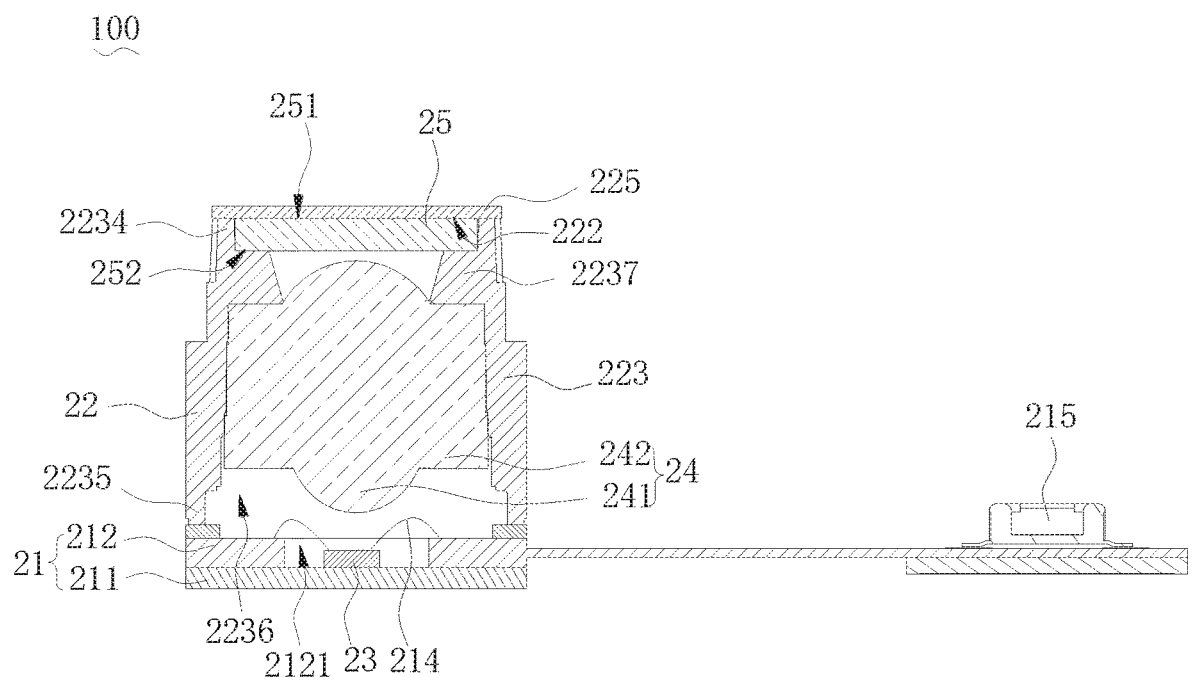

As illustrated in FIG. 4 and FIG. 5, in some embodiments, the protection cover 225 may also be made of a light transparent material, such as glass, polymethyl methacrylate (PMMA), polycarbonate (PC), polyimide (Polyimide, PI), or the like. Since the light transparent materials such as glass, PMMA, PC, and PI all have excellent light transmission properties, the light through hole 2251 may not be formed in the protection cover 225. Consequently, the protection cover 225 may prevent the diffractive optical element 25 from being exposed to the outside of the lens barrel assembly 22 while preventing the diffractive optical element 25 from falling off, thereby making the diffractive optical element 25 waterproof and dustproof. In other embodiments, the protection cover 225 may also be provided with the light through hole 2251 which is aligned with the through hole 2236.

As illustrated in FIG. 4, in some embodiments, the collimation element 24 includes an optical portion 241 and a mounting portion 242 disposed around the optical portion 241. A bearing stage 2237 is arranged between the top 2234 and the bottom 2235 and is also arranged between the diffractive optical element 25 and the collimation element 24. The optical portion 241 has two curved surfaces on two sides facing away from each of the collimation element 24, the mounting portion 242 abuts against the bearing stage 2237, and one of the curved surfaces of the optical portion 241 extends into the bearing stage 2237. As a result, the bearing stage 2237 can bear the diffractive optical element 25, and also space the collimation element 24 apart from the diffractive optical element 25 without increasing the thickness of the laser projection module 100.

When the laser projection module 100 is assembled, the collimation element 24 and the substrate assembly 21 provided with the light source 23 are sequentially placed into the through hole 2236 from the bottom 2235 of the lens barrel assembly 22 along the optical path. The light source 23 may be mounted on the substrate assembly 21 first, and then the substrate assembly 21 provided with the light source 23 is fixed to the bottom 2235. The diffractive optical element 25 is placed in the through hole 2236 from the top 2234 in a direction opposite to the optical path and is carried on the bearing stage 2237, and then the protection cover 225 is mounted. The first end surface 251 of the diffractive optical element 25 abuts against a surface (the abutting surface 222) of the protection cover 225 which is adjacent to the through hole 2236. The second end surface 252 is opposite to one curved surface of the optical portion 241, and the other curved surface of the optical portion 241 is opposite to the light source 23. The laser projection module 100 has a simple structure and is convenient to assemble.

Figure 6:
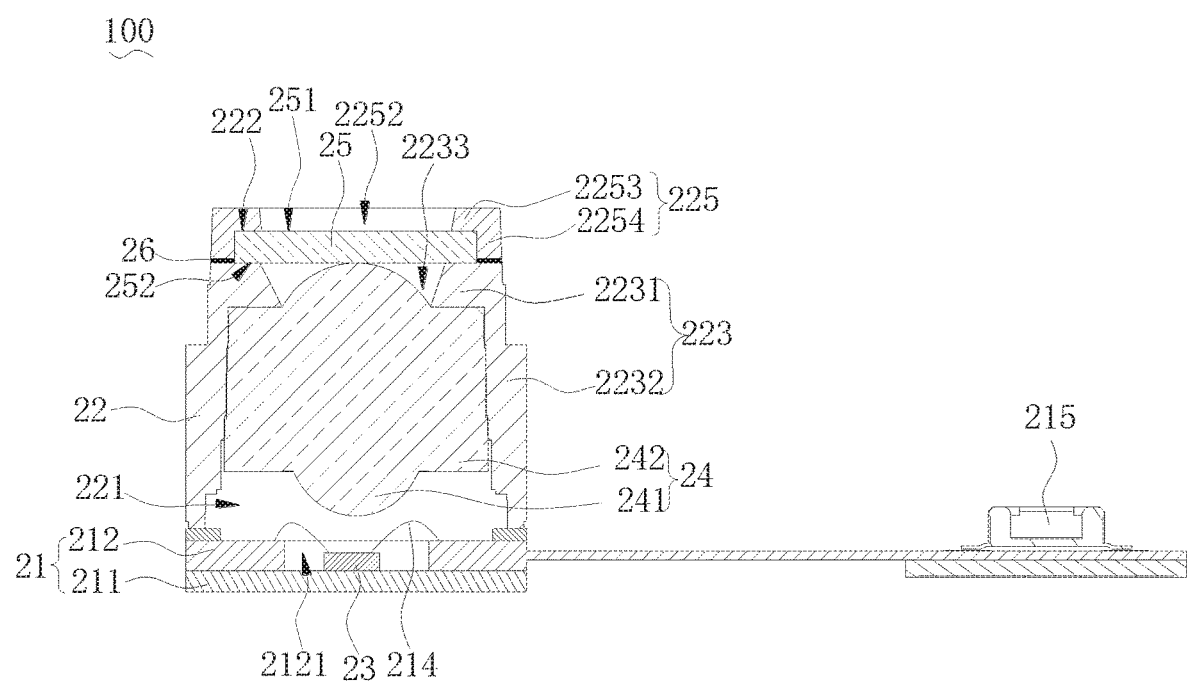

As illustrated in FIG. 6, in some embodiments, the structure of the lens barrel assembly 22 and position relationships between the structure of the lens barrel assembly 22 and the collimation element 24 as well as the diffractive optical element 25 according to the above embodiments may be changed as follows. The lens barrel assembly 22 includes a lens barrel 223 and a protection cover 225. The lens barrel 223 includes a top wall 2231 and an annular peripheral wall 2232 extending from the top wall 2231. The peripheral wall 2232 is disposed on the substrate assembly 21, and the top wall 2231 is provided with a light through hole 2233 communicating with the receiving cavity 221. The protection cover 225 is disposed on the top wall 2231, and includes a baffle 2253 having a light emitting through hole 2252 therein and an annular side wall 2254 extending from the baffle 2253. The diffractive optical element 25 is carried on the top wall 2231 and is accommodated in the protection cover 225. Two sides facing away from each of the diffractive optical element 25 abut against the protection cover 225 and the top wall 2231, respectively. The abutting surface 222 is a surface of the protection cover 225 abutting against the diffractive optical element 25.

Specifically, the diffractive optical element 25 has a first end surface 251 and a second end surface 252 facing away from each other. The diffractive optical element 25 is carried on the top wall 2231. The first end surface 251 abuts against the surface (the abutting surface 222) of the baffle 2253 adjacent to the light through hole 2233. The second end surface 252 abuts against the top wall 2231. The light through hole 2233 is aligned with the receiving cavity 221, and the light emitting through hole 2252 is aligned with the light through hole 2233. The top wall 2231, the annular side wall 2254, and the baffle 2253 abut against the diffractive optical element 25, so as to prevent the diffractive optical element 25 from falling out of the protection cover 225 in the light-emitting direction. In some embodiments, the protection cover 225 is adhered to the top wall 2231 by glue.

As illustrated in FIG. 6, in some embodiments, the collimation element 24 includes an optical portion 241 and a mounting portion 242 disposed around the optical portion 241. The optical portion 241 has two curved surfaces on two sides facing away from each other of the collimation element 24, the mounting portion 242 abuts against the top wall 2231, and one of the curved surfaces of the optical portion 241 extends into the light through hole 2233.

When the laser projection module 100 is assembled, the collimation element 24 and the substrate assembly 21 provided with the light source 23 are sequentially placed into the receiving cavity 221 from the bottom of the annular peripheral wall 2232 of the lens barrel assembly 22 along the optical path. The light source 23 may be mounted on the substrate assembly 21 first, and then the substrate assembly 21 provided with the light source 23 is combined with the lens barrel assembly 22. The diffractive optical element 25 is carried on the top wall 2231 in a direction opposite to the optical path, and then the protection cover 225 is mounted on the top wall 2231, such that the diffractive optical element 25 is accommodated in the protection cover 225. As a result, the laser projection module 100 is simple to assemble. In other embodiments, the diffractive optical element 25 may be reversely disposed in the protection cover 225, and then the diffractive optical element 25 and the protection cover 225 may be mounted together on the top wall 2231. In this case, the first end surface 251 of the diffractive optical element 25 abuts against the abutting surface 222 (not illustrated), the second end surface 252 of the diffractive optical element 25 abuts against the top wall 2231 and is opposite to one curved surface of the optical portion 241, and the other curved surface of the optical portion 241 is opposite to the light source 23. As a result, the laser projection module 100 is further simpler to assemble.

FIGS. 7-12 are descriptions of the second part of embodiments of the present disclosure. It should be noted that the second part of embodiments of the present disclosure may be independent from the remaining parts (the first part, the third part, the fourth part, the fifth part) of embodiments of the present disclosure. Certainly, it can be understood that those skilled in the art can also combine the second part of embodiments of the present disclosure with the rest parts of embodiments of the present disclosure in the case of no technical obstacles, without being limited by differences of element names and reference signs.

Figure 7:
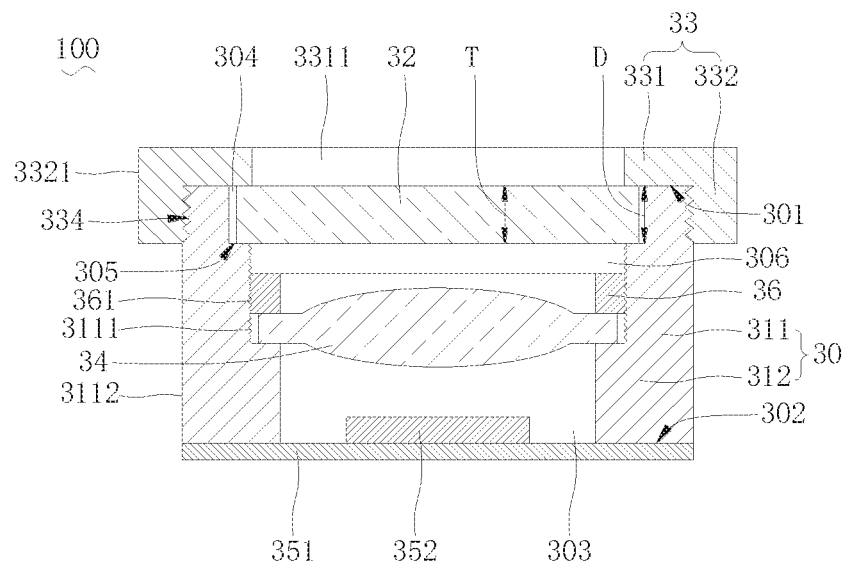
FIGS. 7 to 12 are schematic views illustrating a laser projection module according to a second part of embodiments of the present disclosure.

As illustrated in FIG. 7, the laser projection module 100 according to the second part of embodiments of the present disclosure includes a lens barrel 30, a diffractive optical element 32, a connecting member 33 and a collimation element 34. The lens barrel 30 includes a first end surface 301 and a second end surface 302 facing away from each other. The lens barrel 30 defines a receiving cavity 303 passing through the first end surface 301 and the second end surface 302. The first end surface 301 is recessed towards the second end surface 302 to define a mounting groove 304 which communicates with the receiving cavity 303. The diffractive optical element 32 is mounted in the mounting groove 304. The connecting member 33 is mounted to a side of the lens barrel 30 where the first end surface 301 is located, and the diffractive optical element 32 is clamped between the connecting member 33 and a bottom surface 305 of the mounting groove 304. The collimation element 34 is mounted in the receiving cavity 303 and is arranged between the second end surface 302 and the diffractive optical element 32. The lens barrel 30 and the connecting member 33 are included in a lens barrel assembly.

Figure 8:
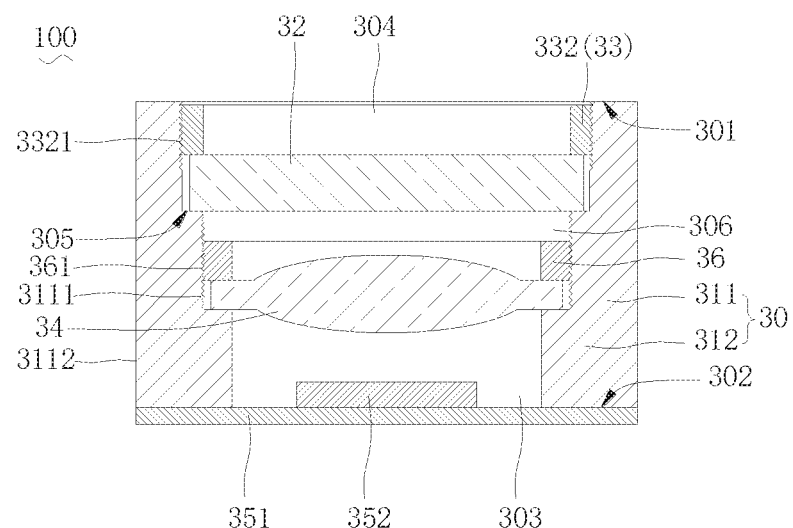
Figure 9:
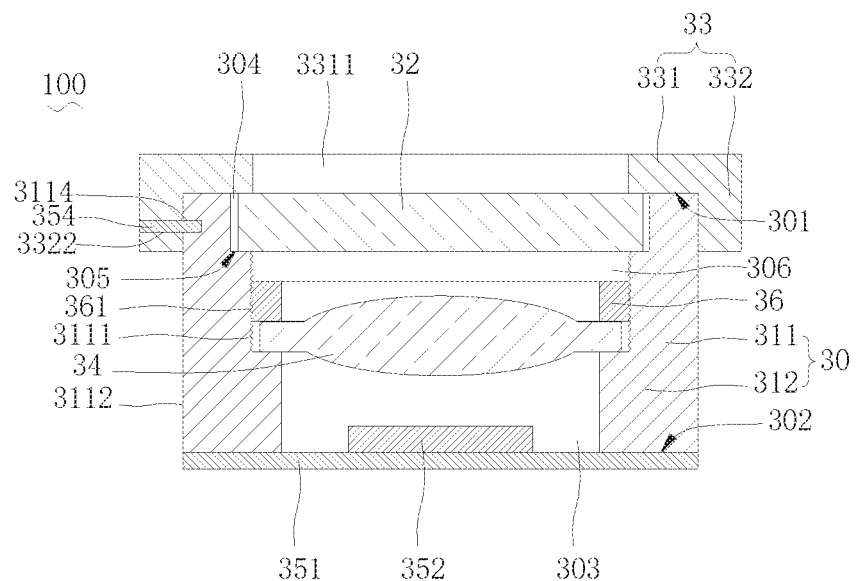

The connecting member 33 may be mounted on the lens barrel 30 through screw connection, locking-member connection or the like. For example, as illustrated in FIG. 7, when the connecting member 33 includes a top wall 331 and a connecting side wall 332, the connecting member 33 (the connecting side wall 332) is provided with an internal thread, and the lens barrel 30 is provided with an external thread. In this case, the internal thread of the connecting member 33 is screwed with the external thread of the lens barrel 30 to mount the connecting member 33 on the lens barrel 30. As illustrated in FIG. 8, when the connecting member 33 has a cylindrical structure (the connecting member 33 includes an annular connecting side wall 332), an outer side surface 3321 of the connecting member 33 is provided with an external thread, and an inner surface 3111 of the lens barrel 30 is provided with an internal thread. In this case, the external thread of the connecting member 33 is screwed with the internal thread of the lens barrel 30 to mount the connecting member 33 on the lens barrel 30. Or, as illustrated in FIG. 9, when the connecting member 33 includes a connecting side wall 332, an outer surface of the lens barrel 30 defines a first positioning hole 3114 therein, and a second positioning hole 3322 corresponding to the first positioning hole 3114 is defined in the connecting member 33 (the connecting side wall 332). A locking member 354 passes through the second positioning hole 3322 and is disposed in the first positioning hole 3114, so as to mount the connecting member 33 on the lens barrel 30.

When the connecting member 33 is mounted on the lens barrel 30, the connecting member 33 abuts against the diffractive optical element 32 and the diffractive optical element 32 abuts against the bottom surface 305 of the mounting groove 304, such that the diffractive optical element 32 is clamped between the connecting member 33 and the bottom surface 305.

In the laser projection module 100 according to the second part of embodiments of the present disclosure, the mounting groove 304 is formed in the lens barrel 30, the diffractive optical element 32 is mounted in the mounting groove 304, and the connecting member 33 is mounted on the lens barrel 30, such that the diffractive optical element 32 is clamped between the connecting member 33 and the bottom surface 305 of the mounting groove 304, thereby fixing the diffractive optical element 32 to the lens barrel 30. The laser projection module 100 according to the second part of embodiments of the present disclosure avoids the use of glue to fix the diffractive optical element 32 to the lens barrel 30, which prevents the gaseous glue from be diffused and solidified on the surface of the diffractive optical element 32 to affect the microstructure of the diffractive optical element 32 after the glue is volatilized into a gaseous state, and also prevents the diffractive optical element 32 from falling off from the lens barrel 30 when the adhesive force is reduced due to aging of the glue connecting the diffractive optical element 32 with the lens barrel 30.

As illustrated in FIG. 7, the laser projection module 100 according to the second part of embodiments of the present disclosure includes a lens barrel 30, a diffractive optical element 32, a connecting member 33, a collimation element 34, a circuit board 351, a light source 352 and a pressing ring 36.

The lens barrel 30 includes an annular barrel side wall 311 and an annular position limiting ring 312. The annular barrel side wall 311 encloses a receiving cavity 303. The barrel side wall 311 (the barrel 30) includes an inner surface 3111 located in the receiving cavity 303 and an outer surface 3112 facing away from the inner surface 3111. The barrel side wall 311 has a first end surface 301 and a second end surface 302 facing away from each other, and the receiving cavity 303 passes through the first end surface 301 and the second end surface 302. The first end surface 301 is recessed towards the second end surface 302 to form a mounting groove 304 which communicates with the receiving cavity 303. The bottom surface 305 of the mounting groove 304 is located on a side of the mounting groove 304 away from the first end surface 301. A depth D of the mounting groove 304 is a distance between the first end surface 301 and the bottom surface 305. The outer surface 3112 of the barrel side wall 311 has a circular cross section at an end of the barrel side wall 311 where the first end surface 301 is, and the outer surface 3112 of the barrel side wall 311 is formed with an external thread at the end of the barrel side wall 311 where the first end surface 301 is. Specifically, the external thread is formed on the outer surface 3112 having the circular cross section of the barrel side wall 311 at the end where the first face 301 is. An outer contour (or the outer surface 3112) of the barrel side wall 311 may also have a regular polygonal cross section. For example, the outer contour of the barrel side wall 311 may have a square or regular-hexagon cross section.

The position limiting ring 312 protrudes from the inner surface 3111 of the barrel side wall 311 towards a center of the lens barrel 30. The position limiting ring 312 of the present embodiment is located at an end of the barrel side wall 311 where the second end surface 302 is. A surface of the position limiting ring 312 facing away from the second end surface 302 encloses an engaging groove 306 together with the barrel side wall 311, and the engaging groove 306 is located between the position limiting ring 312 and the mounting groove 304. An internal thread is formed on the inner surface 3111 of the barrel side wall 311 which encloses the engaging groove 306.

The circuit board 351 is disposed to the second end surface 302 of the lens barrel 30 and closes an end of the receiving cavity 303. The circuit board 351 may be a flexible circuit board or a printed circuit board.

The light source 352 is carried on the circuit board 351 and accommodated in the receiving cavity 303. The light source 352 is configured to emit laser towards a side of the lens barrel 30 where the first end surface 301 (the mounting groove 304) is located. The light source 352 includes a Vertical Cavity Surface Emitting Laser (VCSEL) chip, which includes a plurality of VCSEL light sources arranged in an array.

The collimation element 34 is mounted in the engaging groove 306 and abuts against the position limiting ring 312. The collimation element 34 is an element for collimation, and is configured to collimate the laser emitted by the source 352 and transmit the collimated laser towards the side where the mounting groove 304 is. The collimation element 34 may be a biconvex lens.

The pressing ring 36 has an annular shape, and an outer circumferential surface 361 of the pressing ring 36 is provided with an external thread. The external thread of the pressing ring 36 is engaged with the internal thread on the inner surface 3111 of the barrel side wall 311 which encloses the engaging groove 306, so as to mount the pressing ring 36 in the engaging groove 306. The pressing ring 36 abuts against the collimation element 34, such that the collimation element 34 is clamped between the pressing ring 36 and the position limiting ring 312.

The diffractive optical element 32 is mounted in the mounting groove 304 and abuts against the bottom surface 305 of the mounting groove 304. A diffractive structure is provided on a surface of the diffractive optical element 32 adjacent to the bottom surface 305. The diffractive optical element 32 projects the laser collimated by the collimation element 34 into a laser pattern corresponding to the diffractive structure. The diffractive optical element 32 may be made of glass or of a composite plastic such as PET.

The connecting member 33 includes the top wall 331 and the connecting side wall 332 extending from a side of the top wall 331. The top wall 331 is provided with a light through hole 3311 in a center thereof, and the connecting side wall 332 is disposed around the top wall 331 and the light through hole 3311. The top wall 331 and the connecting side wall 332 together define a mounting cavity 334, and the light through hole 3311 communicates with the mounting cavity 334. An inner surface of the connecting side wall 332 has a circular cross section and is provided with an internal thread. The internal thread of the connecting side wall 332 is screwed with the external thread of the lens barrel 30 to mount the connecting member 33 on the lens barrel 30. The top wall 331 abuts against the diffractive optical element 32, such that the diffractive optical element 32 is clamped between the top wall 331 and the bottom surface 305 of the mounting groove 304. Specifically, a thickness T of the diffractive optical element 32 is greater than or equal to a depth D of the mounting groove 304 so as to enable the top wall 331 to abut against the diffractive optical element 32. The outer contour (the outer side surface 3321) of the connecting member 33 has a circular or regular polygonal cross section. For example, the outer contour of the connecting member 33 may have a square or regular-hexagonal cross section.

In the laser projection module 100 according to the second part of embodiments of the present disclosure, the mounting groove 304 is formed in the lens barrel 30, the diffractive optical element 32 is mounted in the mounting groove 304, and the connecting member 33 is mounted on the lens barrel 30, such that the diffractive optical element 32 is clamped between the connecting member 33 and the bottom surface 305 of the mounting groove 304, thereby fixing the diffractive optical element 32 to the lens barrel 30. The laser projection module 100 according to the second part of embodiments of the present disclosure avoids the use of glue to fix the diffractive optical element 32 to the lens barrel 30, which prevents the gaseous glue from be diffused and solidified on the surface of the diffractive optical element 32 to affect the microstructure of the diffractive optical element 32 after the glue is volatilized into a gaseous state, and also prevents the diffractive optical element 32 from falling off from the lens barrel 30 when the adhesive force is reduced due to aging of the glue connecting the diffractive optical element 32 with the lens barrel 30.

Figure 10:
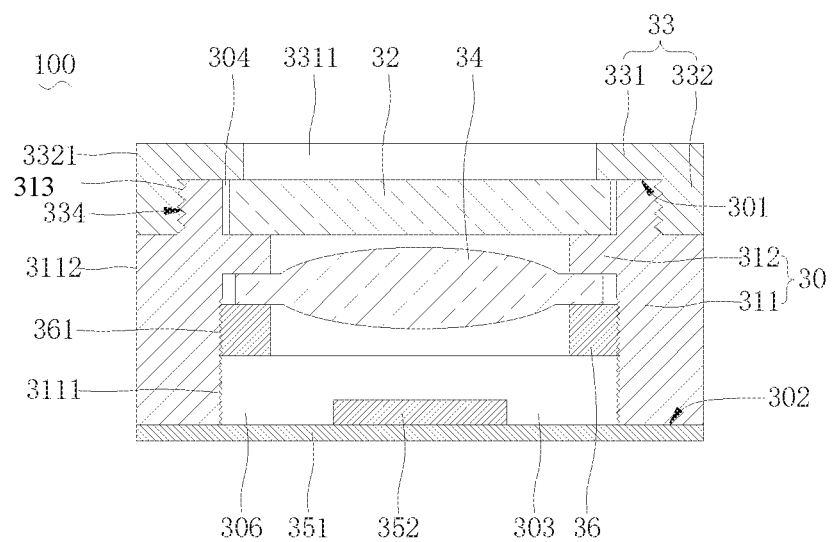

As illustrated in FIG. 10, in some embodiments, the position limiting ring 312 is arranged between the first end surface 301 and the second end surface 302. The position limiting ring 312 and an end of the barrel side wall 311 adjacent to the first end surface 301 define the mounting groove 304 together. The diffractive optical element 32 is mounted in the mounting groove 304 and abuts against the position limiting ring 312. An end surface of the position limiting ring 312 adjacent to the mounting groove 304 is the bottom surface 305 of the mounting groove 304. In this case, the position limiting ring 312 and another end of the barrel side wall 311 adjacent to the second end surface 302 define the engaging groove 306 together, and the collimation element 34 is mounted in the engaging groove 306 and abuts against the position limiting ring 312. The diffractive optical element 32 and the collimation element 34 are arranged on two sides of the position limiting ring 312 which face away from each other.

As illustrated in FIG. 10, in some embodiments, the lens barrel 30 (or the barrel side wall 311) further includes an inner surface 3111 arranged in the receiving cavity 303 and an outer surface 3112 facing away from the inner surface 3111. The outer surface 3112 of the lens barrel 30 is recessed towards the receiving cavity 303 to form an annular notch 313, and the notch 113 is provided with an external thread on a side surface thereof. The internal thread of the connecting member 33 is screwed with the external thread of the lens barrel 30 to mount the connecting member 33 on the lens barrel 30. The top wall 331 abuts against the diffractive optical element 32, and the outer side surface 3321 of the connecting side wall 332 is flush with the outer surface 3112 of the lens barrel 30.

Specifically, the cross section of the outer surface 3112 of the lens barrel 30 has a same shape as the cross section of the outer side surface 3321 of the connecting member 33. Both the cross section of the outer surface 3112 of the lens barrel 30 and the cross section of the outer side surface 3321 of the connecting member 33 may have a circular, triangular, quadrangular, pentagonal, hexagonal or arbitrary polygonal shape. When the cross section of the outer surface 3112 of the lens barrel 30 has a circular shape, the cross section of the outer side surface 3321 of the connecting member 33 also has a circular shape. When the cross section of the outer surface 3112 of the lens barrel 30 has a quadrangular shape, the cross section of the outer side surface 3321 of the connecting member 33 also has a quadrangular shape. When the cross section of the outer surface 3112 of the lens barrel 30 has a hexagonal shape, the cross section of the outer side surface 3321 of the connecting member 33 also has a hexagonal shape.

The outer surface of the connecting side wall 332 of the laser projection module 100 in the present embodiment is flush with the outer surface 3112 of the lens barrel 30, such that the appearance of the laser projection module 100 is beautiful.

Figure 11:
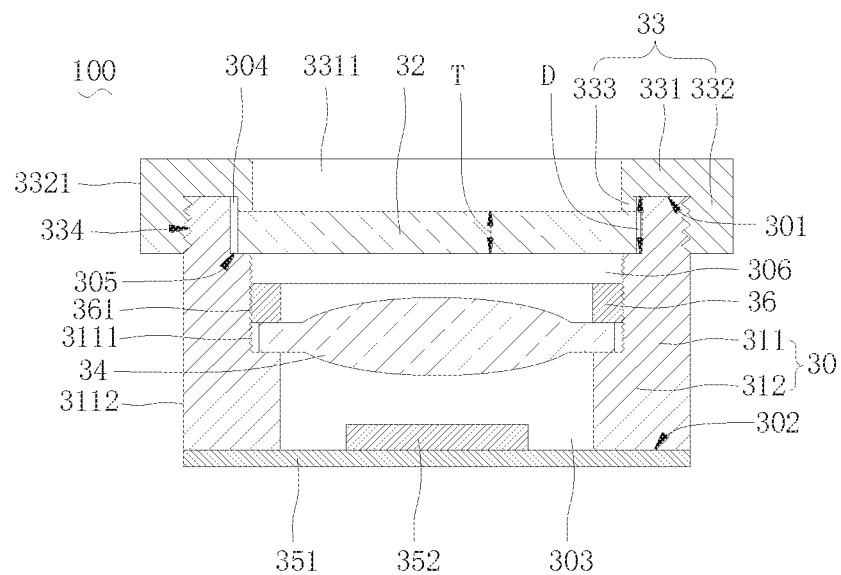

As illustrated in FIG. 11, in some embodiments, the connector 33 further includes an annular retaining portion 333. The retaining portion 333 extends from the top wall 331 towards the mounting cavity 334 and surrounds the light through hole 3311. The diffractive optical element 32 is clamped between the retaining portion 333 and the bottom surface 305 of the mounting groove 304.

The inner contour (the inner surface 3111) of the barrel side wall 311 at the mounting groove 304 is has a circular cross section. An outer contour of the retaining portion 333 has a circular cross section. The cross section of the outer contour of the retaining portion 333 has a diameter smaller than the diameter of the cross section of the inner contour (inner surface 3111) of the barrel side wall 311 at the mounting groove 304. As a result, when the depth D of the mounting groove 304 is greater than the thickness T of the diffractive optical element 32, the retaining portion 333 can also abut against the diffractive optical element 32, such that the diffractive optical element 32 can be clamped between the retaining portion 333 and the bottom surface 305 of the mounting groove 304.

Figure 12:
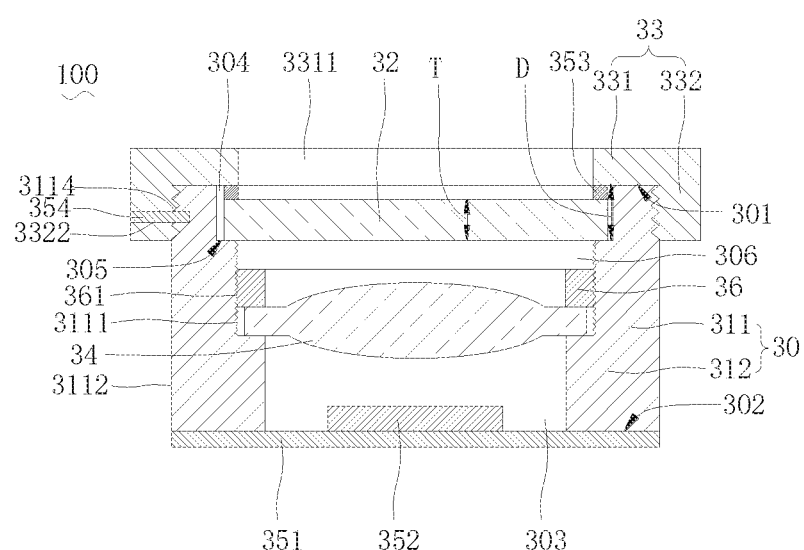

As illustrated in FIG. 12, in some embodiments, the laser projection module 100 further includes an annular elastic member 353 arranged between the diffractive optical element 32 and the connecting member 33.

Specifically, the elastic member 353 may be completely received in the mounting groove 304. In this case, the connecting member 33 includes a retaining portion 333 which abuts against the elastic member 353. The elastic member 353 and the diffractive optical element 32 are clamped between the retaining portion 333 and the bottom surface 305 of the mounting groove 304. Alternatively, one end of the elastic member 353 is received in the mounting groove 304, and the other end of the elastic member 353 protrudes out of the mounting groove 304 (i.e. being higher than the first end surface 301). In this case, the connecting member 33 may not include the retaining portion 333, and the top wall 331 directly abuts against the elastic member 353.

In the laser projection module 100 of the present embodiment, the elastic member 353 is provided between the diffractive optical element 32 and the top wall 331, such that the diffractive optical element 32 is more evenly pressed under the action (abutment) of the elastic member 353. Consequently, the diffractive optical element 32 can be more firmly fixed in the mounting groove 304, and the diffractive optical element 32 can be prevented from shaking with respect to the lens barrel 30 when the laser projection module 100 is subjected to a shock. Furthermore, in the laser projection module 100, the elastic member 353 is arranged between the top wall 331 and the bottom surface 305 of the mounting groove 304 to provide a great anti-loosening effect of the connecting member 33.

As illustrated in FIG. 12, in some embodiments, the lens barrel 30 is provided with a first positioning hole 3114 in the outer surface 3112. The connecting side wall 332 is provided with a second positioning hole 3322 which communicates with the mounting cavity 334 and corresponds to the first positioning hole 3114. The laser projection module 100 further includes a locking member 354, and the locking member 354 passes through the second positioning hole 3322 and is locked in the first positioning hole 3114.

Specifically, the first positioning hole 3114 may be a threaded hole, and thus the locking member 354 may be a screw. The first positioning hole 3114 may also be a blind hole, and thus the locking member 354 may be a pin.

In the laser projection module 100 according to the present embodiment, the locking member 354 connects the connecting member 33 with the lens barrel 30, such that the connecting member 33 is prevented from falling off from the lens barrel 30.

As illustrated in FIG. 8, in some embodiments, the inner surface 3111 enclosing the mounting groove 304 is provided with an internal thread. The connecting member 33 has a cylindrical shape, and the outer side surface 3321 of the connecting member 33 is provided with an external thread. The external thread of the connecting member 33 is screwed with the internal thread of the inner surface 3111 enclosing the mounting groove 304 so as to mount the connecting member 33 in the mounting groove 304.

FIGS. 13-29 are descriptions of the third part of the embodiments of the present disclosure. It should be noted that the third part of embodiments of the present disclosure may be independent from the remaining parts (the first part, the second part, the fourth part, the fifth part) of embodiments of the present disclosure. Certainly, it can be understood that those skilled in the art can also combine the third part of embodiments of the present disclosure with the rest parts (the first part, the second part, the fourth part, the fifth part) of embodiments of the present disclosure in the case of no technical obstacles, without being limited by differences of element names and reference signs.

Figure 13:
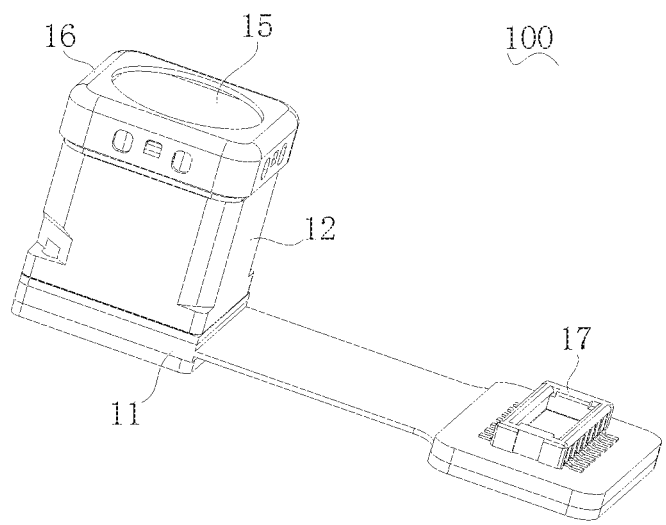
FIG. 13 is a perspective view illustrating a laser projection module according to a third part of embodiments of the present disclosure.
Figure 14:
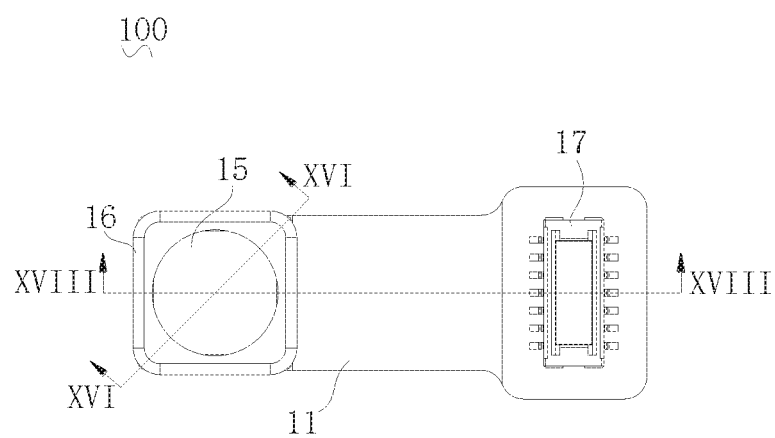
FIG. 14 is a plan view illustrating a laser projection module according to a third part of embodiments of the present disclosure.
Figure 15:
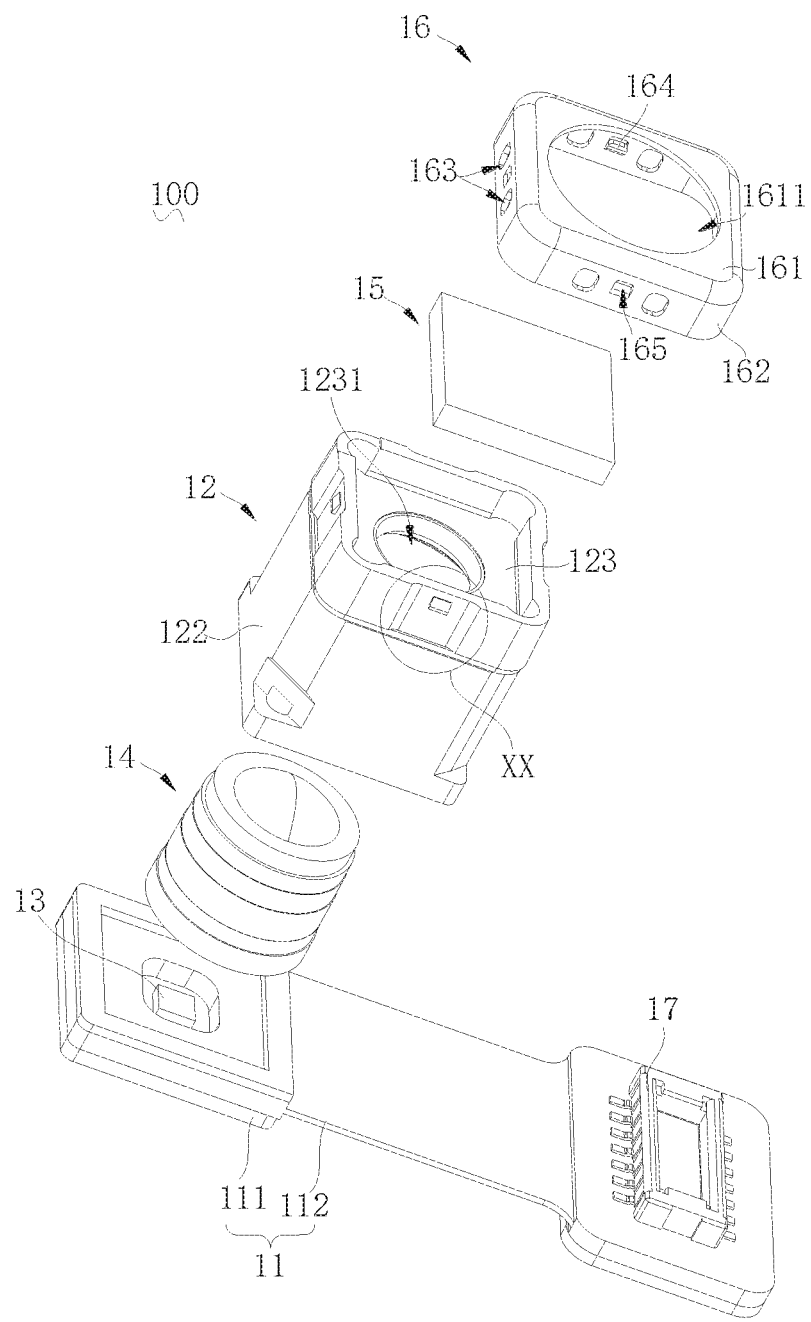
FIG. 15 is an exploded perspective view illustrating a laser projection module according to a third part of embodiments of the present disclosure.

As illustrated in FIGS. 13-15, the laser projection module 100 according to the third part of the embodiments of the present disclosure includes a substrate assembly 11, a lens barrel 12, a light source 13, a collimation element 14, a diffractive optical element 15 and a protection cover 16. The light source 13, the collimation element 14 and the diffractive optical element 15 are sequentially disposed in an optical path of the light source 13. Specifically, the lights emitted from the light source 13 sequentially pass through the collimation element 14 and the diffractive optical element 15. The lens barrel 12 and the protection cover 16 are included in the lens barrel assembly.

Figure 16:
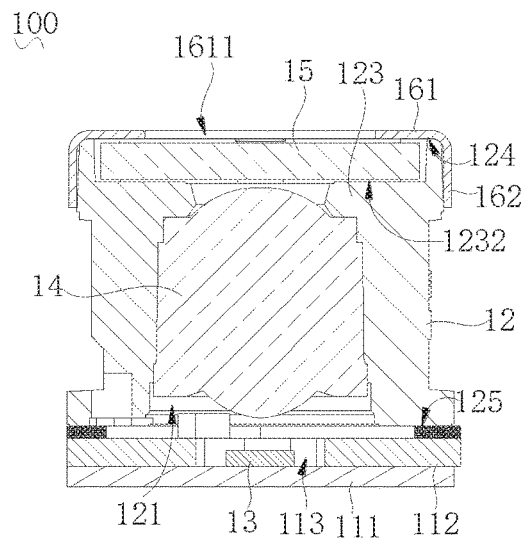
FIG. 16 is a sectional view of the laser projection module taken along line XVI-XVI in FIG. 14.

As illustrated in FIGS. 15 and 16, the substrate assembly 11 includes a substrate 111 and a circuit board 112 carried on the substrate 111. The substrate 111 is configured to carry the lens barrel 12, the light source 13 and the circuit board 112. The material of the substrate 111 may be plastic, such as at least one of Polyethylene Glycol Terephthalate (PET), Polymethyl Methacrylate (PMMA), Polycarbonate (PC), and Polyimide (PI). That is, the substrate 111 may be made of a single plastic material of any one of PET, PMMA, PC or PI. As a result, the substrate 111 is light in weight and has sufficient support strength.

The circuit board 112 may be any one of a printed circuit board, a flexible circuit board, and a rigid-flex board. The circuit board 112 may be provided with a via hole 113. The via hole 113 may be configured to accommodate the light source 13 therein. A part of the circuit board 112 is covered by the lens barrel 12, and another part thereof extends out and is connected to a connector 17. The connector 17 may connect the laser projection module 100 to a main board of the electronic device.

Figure 17:
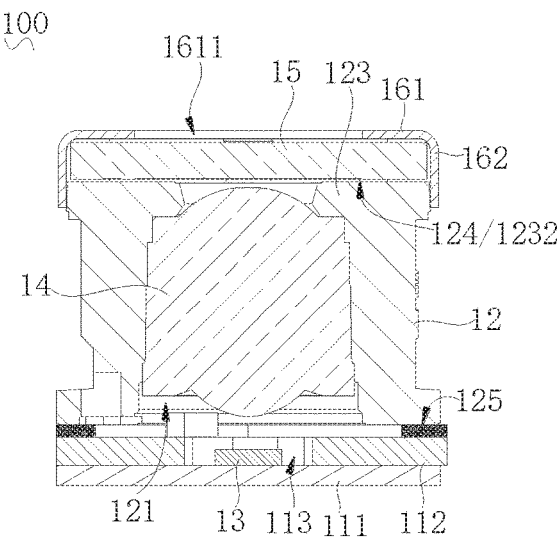
FIG. 17 is another sectional view of the laser projection module taken along line XVI-XVI in FIG. 14.
Figure 18:
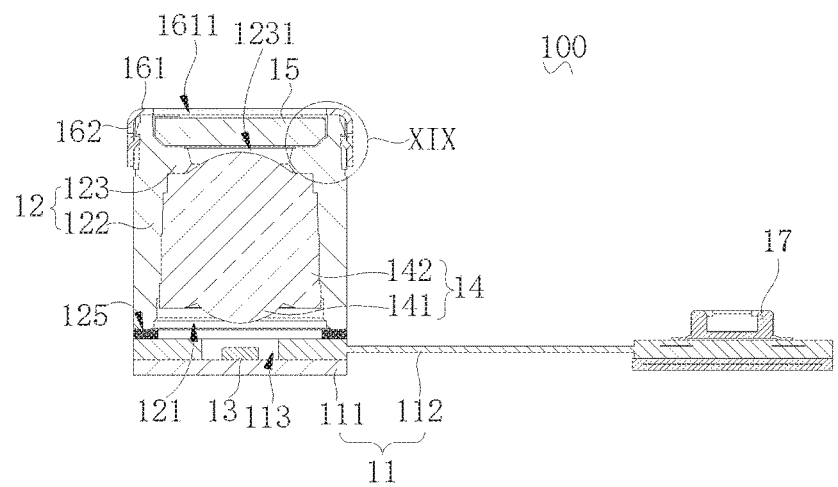
FIG. 18 is a sectional view of the laser projection module taken along line XVIII-XVIII in FIG. 14.

As illustrated in FIGS. 16-18, the lens barrel 12 is disposed on the substrate assembly 11 and defines a receiving cavity 121 together with the substrate assembly 11. Specifically, the lens barrel 12 may be connected to the circuit board 112 of the substrate assembly 11. The lens barrel 12 and the circuit board 112 may be bonded by adhesive to improve the airtightness of the receiving cavity 121. Certainly, the lens barrel 12 and the substrate assembly 11 may be connected in other specific connection manners, for example, by a snap connection. The receiving cavity 121 may be configured to accommodate the collimation element 14 and the diffractive optical element 15, and the receiving cavity 121 also serves as a part of the optical path of the laser projection module 100. In the third part of the embodiments of the present disclosure, the lens barrel 12 has a hollow cylindrical shape, and the lens barrel 12 includes a barrel side wall 122 and a position limiting protrusion 123.

Figure 19:
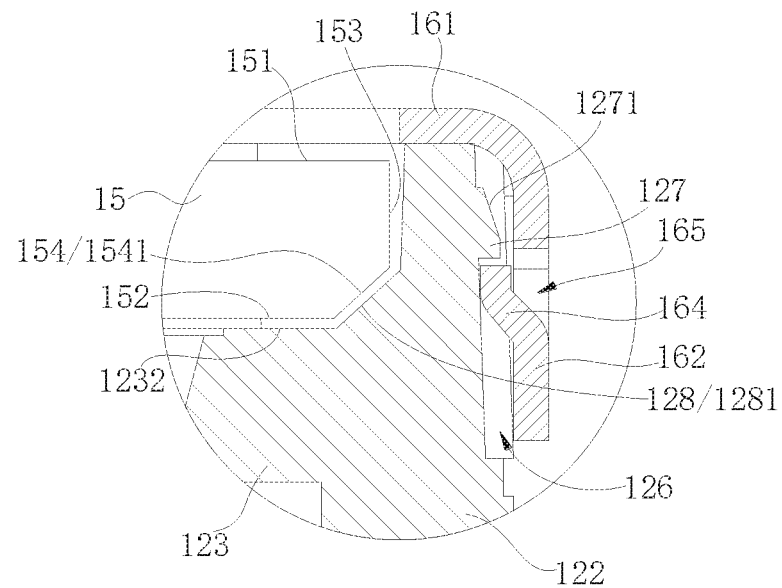
FIG. 19 is an enlarged schematic view illustrating a portion XIX of the laser projection module in FIG. 18.
Figure 20:
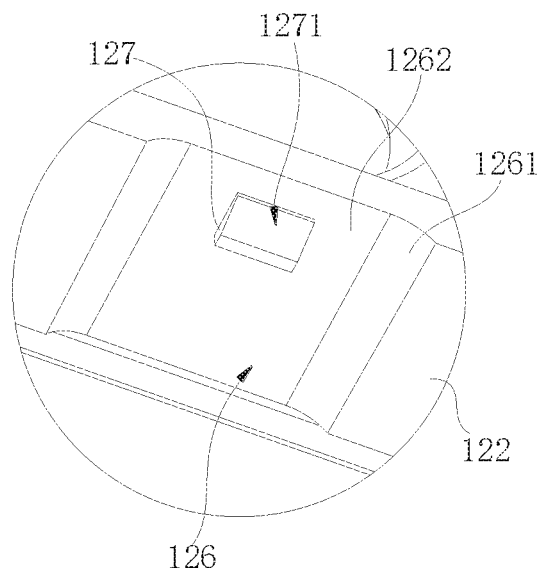
FIG. 20 is an enlarged schematic view illustrating a portion XX of the laser projection module in FIG. 15.

The barrel side wall 122 encloses the receiving cavity 121, and the outer wall of the barrel side wall 122 may be provided with a positioning structure and a mounting structure so as to fix the position of the laser projection module 100 when the laser projection module 100 is mounted in the electronic device. The lens barrel 12 includes a first end surface 124 and a second end surface 125 facing away each other. One opening of the receiving cavity 121 is formed in the second end surface 125 and the other opening thereof is formed in the first end surface 124. The second end surface 125 is joined to the circuit board 112, for example, being glued to the circuit board 112. The first end surface 124 may serve as a joint surface of the lens barrel 12 with the diffractive optical element 15 or the protection cover 16 or the like. As illustrated in FIGS. 19 and 20, the barrel side wall 122 is provided with a glue receiving groove 126 in its outer surface, and the glue receiving groove 126 may be formed from the first end surface 124 and extend towards the second end surface 125.

As illustrated in FIGS. 18 and 19, the position limiting protrusion 123 protrudes inwards from the barrel side wall 122. Specifically, the position limiting protrusion 123 protrudes from the barrel side wall 122 into the receiving cavity 121. The position limiting protrusion 123 may have a continuous annular shape, or a plurality of position limiting protrusions 123 may be provided and spaced apart from one another. The position limiting protrusion 123 encloses a light via hole 1231 which may serve as a part of the receiving cavity 121. The laser passes through the light via hole 1231 and then penetrates into the diffractive optical element 15. In the embodiment illustrated in FIG. 16, the position limiting protrusion 123 is located between the first end surface 124 and the second end surface 125. A part of the receiving cavity 121 between the position limiting protrusion 123 and the second end surface 125 may be configured to receive the collimation element 14. A part of the receiving cavity 121 between the position limiting protrusion 123 and the first end surface 124 may be configured to receive the diffractive optical element 15. Moreover, during the assembling of the laser projection module 100, when the diffractive optical element 15 abuts against the position limiting protrusion 123, it may be understood that the diffractive optical element 15 is mounted in place; when the collimation element 14 abuts against the position limiting protrusion 123, it may be understood that the collimation element 14 is mounted in place. The position limiting protrusion 123 includes a position limiting surface 1232. When the diffractive optical element 15 is mounted on the position limiting protrusion 123, the position limiting protrusion 123 is joined to the diffractive optical element 15.

As illustrated in FIG. 18, the light source 13 is disposed on the substrate assembly 11. Specifically, the light source 13 may be arranged on the circuit board 112 and electrically connected to the circuit board 112. The light source 13 may also be arranged on the substrate 111 and correspond to the via hole 113. In this case, the light source 13 may be electrically connected to the circuit board 112 through the arrangement of wires. The light source 13 is configured to emit laser, and the laser may be infrared light. In one example, the light source 13 may include a semiconductor substrate and a laser emitter disposed on the semiconductor substrate. The semiconductor substrate is arranged on the substrate 111. The laser emitter may be a Vertical Cavity Surface Emitting Laser (VCSEL). The semiconductor substrate may be provided with a single laser emitter or an array laser consisting of a plurality of laser emitters. Specifically, the plurality of laser emitters may be arranged on the semiconductor substrate in a regular or irregular two-dimensional pattern.

As illustrated in FIG. 18, the collimation element 14 may be an optical lens and is configured to collimate the laser emitted by the light source 13. The collimation element 14 is received in the receiving cavity 121 and may be assembled into the receiving cavity 121 in a direction from the second face 125 to the first face 124. The collimation element 14 includes an optical portion 141 and a mounting portion 14. The mounting portion 142 is configured to be engaged with the barrel side wall 122 and to secure the collimation element 14. In the third part of the embodiments of the present disclosure, the optical portion 141 has two curved surfaces on two sides facing away from each other of the collimation element 14.

As illustrated in FIGS. 18 and 19, the diffractive optical element 15 is mounted on the position limiting protrusion 123. Specifically, the diffractive optical element 15 is joined with the position limiting surface 1232 to be mounted on the position limiting protrusion 123. The outer surface of the diffractive optical element 15 includes a top surface 151, a bottom surface 152 and a side surface 153. The top surface 151 faces away from the bottom surface 152, and the side surface 153 is connected to the top surface 151 and the bottom surface 152. When the diffractive optical element 15 is mounted on the position limiting protrusion 123, the bottom surface 152 is joined with the position limiting surface 1232. In the third part of the embodiments of the present disclosure, the bottom surface 152 is provided with a diffractive structure, and the top surface 151 may be a smooth flat surface. The diffractive optical element 15 may project the laser collimated by the collimation element 14 into a laser pattern corresponding to the diffractive structure. The diffractive optical element 15 may be made of glass or of a composite plastic such as PET.

Figure 21:
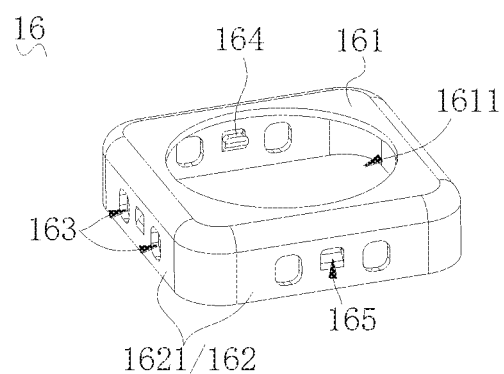
FIG. 21 is a perspective view of a protection cover of a laser projection module according to a third part of embodiments of the present disclosure.

As illustrated in FIGS. 18 and 19, the protection cover 16 is engaged to the lens barrel 12 to limit the position of the diffractive optical element 15. Specifically, the protection cover 16 serves to prevent the diffractive optical element 15 from coming out of the lens barrel 12 after the joining of the diffractive optical element 15 and the lens barrel 12 has failed. As illustrated in FIG. 21, the protection cover 16 includes a protection top wall 161 and a protection side wall 162.

The protection top wall 161 and the position limiting protrusion 123 are respectively located on two sides facing away from each other of the diffractive optical element 15. That is, the diffractive optical element 15 is located between the position limiting protrusion 123 and the protection top wall 161. Thus, even if the joining of the diffractive optical element 15 and the position limiting protrusion 123 fails, the diffractive optical element 15 will not fall off due to the limitation of the protection top wall 161. The protection top wall 161 is provided with a light through hole 1611, and the position of the light through hole 1611 corresponds to the diffractive optical element 15. The laser passes through the light via hole 1231, the diffractive optical element 15 and the light through hole 1611 in sequence, and then is emitted from the laser projection module 100. In the third part of the embodiments of the present disclosure, the protection top wall 161 has a rounded square shape in whole, and the light through hole 1611 may have a circular shape, a rectangular shape, an elliptical shape, a trapezoidal shape or the like. In the embodiment illustrated in FIG. 16, when the protection cover 16 is engaged to the lens barrel 12, the protection top wall 161 abuts against the first end surface 124. Further, the protection top wall 161 may also be joined with the first end surface 124 by glue or the like.

As illustrated in FIGS. 19-21, the protection side wall 162 extends from a periphery of the protection top wall 161. The protection cover 16 is arranged on the lens barrel 12 and covers the lens barrel 12. The protection side wall 162 is fixedly connected to the barrel side wall 122. The protection side wall 162 includes a plurality of protection segments 1621 which are sequentially connected end to end. Each protection segment 1621 is fixedly connected to the barrel side wall 122, and has a glue dispensing hole 163. The position of the glue dispensing hole 163 corresponds to the position of the glue receiving groove 126. After the protection cover 16 is covered on the lens barrel 12, the glue may be dispensed from the glue dispensing hole 163 into the glue receiving groove 126. The protection side wall 162 is fixedly connected to the barrel side wall 122 after the glue is cured. In an example, each protection segment 1621 is provided with a single glue dispensing hole 163. In another example, each protection segment 1621 is provided with a plurality of glue dispensing holes 163, such as two, three, four, and so on. In the third part of the embodiments of the present disclosure, each protection segment 1621 is provided with two glue dispensing holes 163, and the two glue dispensing holes 163 correspond to two inner side walls 1261 of the glue receiving groove 126, respectively, such that it is convenient for a user to simultaneously dispense the glue to both sides of the glue receiving groove 126, thus increasing the glue dispensing speed. Further, the inner side wall 1261 of the glue receiving groove 126 is inclined and connected between an inner bottom wall 1262 of the glue receiving groove 126 and the outer surface of the barrel side wall 122. That is, the inner side wall 1261 and the inner bottom wall 1262 not perpendicular, and the inner side wall 1261 and the outer surface of the barrel side wall 122 are not perpendicular. When the glue is injected to the inner side wall 1261, the glue easily flows to a middle portion of the glue receiving groove 126 under the guiding of the inner side wall 1261, which speeds up the filling of the glue receiving groove 126 with the glue.

Accordingly, in the laser projection module 100 according to the third part of the embodiments of the present disclosure, since the protection cover 16 is engaged with the lens barrel 12, the protection top wall 161 of the protection cover 16 and the position limiting protrusion 123 limit the position of the diffractive optical element 15 together, such that the diffractive optical element 15 will not fall off in the light-emitting direction, which prevents the laser from being emitted without passing through the diffractive optical element 15, thereby protecting the user and improving the safety.

As illustrated in FIG. 17, in some embodiments, the position limiting protrusion 123 may also be provided at the top of the lens barrel 12. Specifically, the position limiting surface 1232 of the position limiting protrusion 123 may be coincided with the first end surface 124. When the diffractive optical element 15 is mounted on the position limiting protrusion 123, the diffractive optical element 15 is joined to the first end surface 124. In this case, the protection top wall 161 abuts against the diffractive optical element 15, and the protection top wall 161 and the position limiting protrusion 123 clamp the diffractive optical element 15 together. Thus, the structure of the lens barrel 12 is simple, and the diffractive optical element 15 can be easily mounted on the position limiting protrusion 123.

As illustrated in FIGS. 19-21, in some embodiments, the protection cover 16 further includes an elastic first hook 164 protruding inwards from the protection side wall 162, and the lens barrel 12 further includes a second hook 127 protruding outwards from the inner bottom wall 1262 of the glue receiving groove 126. When the protection cover 16 is covered on the lens barrel 12, the first hook 164 is engaged with the second hook 127 to prevent the protection cover 16 from falling off from the lens barrel 12.

Specifically, the position of the first hook 164 corresponds to the position of the second hook 127. In the process of covering the lens barrel 12 with the protection cover 16, the first hook 164 abuts against the second hook 127 and is elastically deformed. When the protection cover 16 is mounted in place, the first hook 164 and the second hook 127 are engaged with each other along with a tactile feedback and a click sound of engagement in place. As a result, the protection cover 16 is more reliable in engagement with the lens barrel 12. The first hook 164 and the second hook 127 may first be engaged with each other before the protection cover 16 and the lens barrel 12 are bonded by glue, and thus the relative position of the protection cover 16 and the lens barrel 12 can be effectively fixed, which is conducive to dispensing glue.

As illustrated in FIGS. 19-21, in some embodiments, each protector side wall 1621 is provided with a first hook 164. Correspondingly, the plurality of glue receiving grooves 126 are also provided with a second hook 127. The position of the second hook 127 corresponds to the position of the first hooks 164. The plurality of first hooks 164 are simultaneously engaged with the corresponding second hooks 127, and thus the engagement of the protection cover 16 with the lens barrel 12 is more reliable. Specifically, the first hook 164 may correspond to a middle portion of the protection segments 1621, and the second hook 127 may correspond to a middle portion of the glue receiving grooves 126. When each protection segment 1621 is provided with at least two glue dispensing holes 163, and the first hook 164 is arranged between the at least two glue dispensing holes 163. More specifically, the at least two glue dispensing holes 163 of each protection segment 1621 are symmetrically distributed with respect to the first hook 164. Consequently, the glue is allowed to flow on both sides of the first hook 164 and the second hook 127 respectively, and the amount of the glue on both sides is equivalent, such that the bonding force is uniform.

As illustrated in FIGS. 19 and 21, in some embodiments, the protection side wall 162 is provided with a relief hole 165 at a position corresponding to the first hook 164. In the process of covering the lens barrel 12 with the protection cover 16, when the first hook 164 abuts against the second hook 127 and is elastically deformed, the relief hole 165 provides space for the elastic deformation of the first hook 164. That is, the first hook 164 is elastically deformed and protrudes into the relief hole 165. Specifically, when the first hook 164 abuts against the second hook 127, the first hook 164 is elastically deformed outwards, and hence the first hook 164 extends into the relief hole 165 to avoid a motion interference with the protection side wall 162. In addition, it is also convenient for the user to observe the engagement of the first hook 164 and the second hook 127 through the relief hole 165, for example, to determine whether all the first hooks 164 are engaged with the corresponding second hooks 127.

As illustrated in FIGS. 19 and 20, in some embodiments, the second hook 127 has a guiding inclined surface 1271, and the guiding inclined surface 1271 moves away from the inner bottom wall 1262 along a direction in which the protection cover 16 is sleeved onto the lens barrel 12. In the process of covering the lens barrel 12 with the protection cover 16, the first hook 164 abuts against the guiding inclined surface 1271. Since the guiding inclined surface 1271 is inclined with respect to the inner bottom wall 1262, during the engagement of the first hook 164 and the second hook 127, the abutting force applied to the first hook 164 by the second hook 127 is increased slowly and continuously, and a deformation amount of the first hook 164 is also continuously increased. Thus, the first hook 164 and the second hook 127 can be easily engaged with each other.

As illustrated in FIG. 19, in some embodiments, the lens barrel 12 is provided with a first position limiting portion 128, and the diffractive optical element 15 is provided with a second position limiting portion 154 on its outer surface. The first position limiting portion 128 is engaged with the second position limiting portion 154, when and only when the bottom surface 152 of the diffractive optical element 15 is joined with the position limiting protrusion 123. It can be understood that the bottom surface 152 of the diffractive optical element 15 is different from the top surface 151 thereof in structure, and the bottom surface 152 and the top surface 151 have different effects on the laser. In application, if the diffractive optical element 15 is reversed (the top surface 151 is joined with the position limiting protrusion 123), the diffractive optical element 15 will not diffract the laser into the desired laser pattern, and may even cause the laser to be emitted in a concentrated manner, thus tending to burn the user. The first position limiting portion 128 and the second position limiting portion 154 in the embodiment may be correctly fitted only when the bottom surface 152 is coupled to the position limiting protrusion 123. The first position limiting portion 128 will be correctly fitted with the second position limiting portion 154, only when the bottom surface 152 is joined with the position limiting protrusion 123. When the engagement relationship between the diffractive optical element 15 and the lens barrel 12 is not that the bottom surface 152 is joined with the position limiting surface 1232 of the position limiting protrusion 123, the first position limiting portion 128 and the second position limiting portion 154 will not correctly fitted with each other, which may be easily realized by the user, thereby preventing the diffractive optical element 15 from being mounted wrong.

As illustrated in FIG. 19, in some embodiments, the first position limiting portion 128 includes a first chamfer 1281, and the first chamfer 1281 is formed at an intersection of the position limiting protrusion 123 and the barrel side wall 122. Specifically, the first chamfer 1281 is formed at an intersection of the position limiting surface 1232 and the barrel side wall 122. The second positioning portion 154 includes a second chamfer 1541, and the second chamfer 1541 is formed at an intersection of the bottom surface 152 and the side surface 153 of the diffractive optical element 15. The angle of inclination of the first chamfer 1281 may be equal to that of the second chamfer 1541. It can be understood that if the user reverses the diffractive optical element 15, the top surface 151 will interfere with the second chamfer 1541, which causes the diffractive optical element 15 to be raised by the second chamfer 1541, and thus the user can easily realize that the diffractive optical element 15 is reversed. Therefore, the first chamfer 1281 and the second chamfer 1541 can prevent the diffractive optical element 15 from being reversed.

Figure 22:
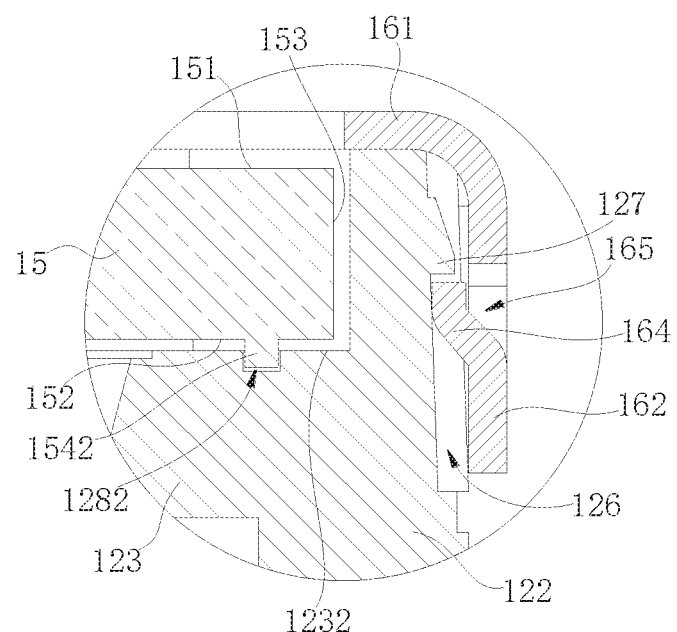
FIG. 22 is a partial schematic view of a laser projection module according to a third part of embodiments of the present disclosure.

As illustrated in FIG. 22, in some embodiments, the first position limiting portion 128 includes a position-limiting-surface recess 1282 formed in the position limiting surface 1232, and the second position limiting portion 154 includes a bottom-surface protrusion 1542 protruding from the bottom surface 152. When the bottom surface 152 is joined with the position limiting protrusion 123, the bottom-surface protrusion 1542 extends into the position-limiting-surface recess 1282. Specifically, the position of the bottom-surface protrusion 1542 corresponds to the position of the position-limiting-surface recess 1282, and the number of the bottom-surface protrusion 1542 is equal to the number of the position-limiting-surface recess 1282. The bottom-surface protrusion 1542 may have a cylindrical shape, a truncated-cone shape, a prismatic shape, or the like. It can be understood that if the user reverses the diffractive optical element 15, the bottom surface 152 faces upwards and the bottom-surface protrusion 1542 makes the diffractive optical element 15 uneven after being mounted, such that the user can easily realize that the diffractive optical element 15 is reversed. Thus, the bottom-surface protrusion 1542 and the position-limiting-surface recess 1282 may prevent the diffractive optical element 15 from being reversed.

Figure 23:
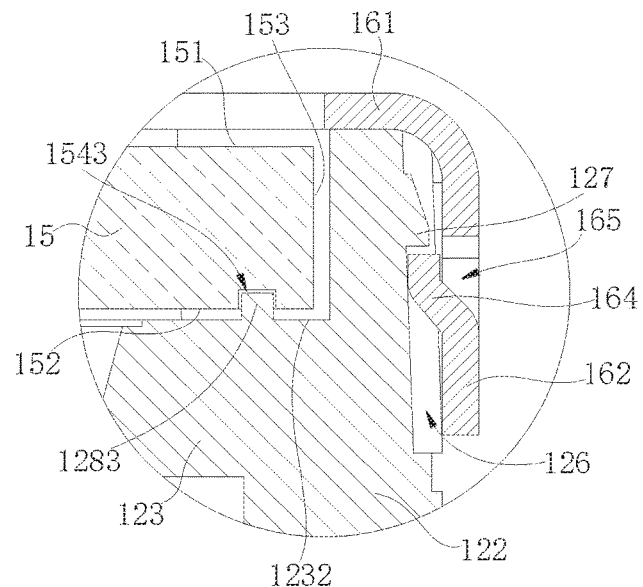
FIG. 23 is a partial schematic view of a laser projection module according to a third part of embodiments of the present disclosure.

As illustrated in FIG. 23, in some embodiments, the first position limiting portion 128 includes a position-limiting-surface protrusion 1283 protruding from the position limiting surface 1232, and the second position limiting portion 154 includes a bottom-surface recess 1543 provided in the bottom surface 152. When the bottom surface 152 is joined with the position limiting protrusion 123, the position-limiting-surface protrusion 1283 extends into the bottom-surface recess 1543. Specifically, the position of the position-limiting-surface protrusion 1283 corresponds to the position of the bottom-surface recess 1543, and the number of the position-limiting-surface protrusion 1283 is equal to the number of the bottom-surface recess 1543. The position-limiting-surface protrusion 1283 may have a cylindrical shape, a truncated-cone shape, a prismatic shape or the like. It can be understood that if the user reverses the diffractive optical element 15, the position-limiting-surface protrusion 1283 will interfere with the top surface 151, and thus the diffractive optical element 15 is raised by the position-limiting-surface protrusion 1283, such that the user can easily realize that the diffractive optical element 15 is reversed. Therefore, the position-limiting-surface protrusion 1283 and the bottom-surface recess 1543 can prevent the diffractive optical element 15 from being reversed.

Figure 24:
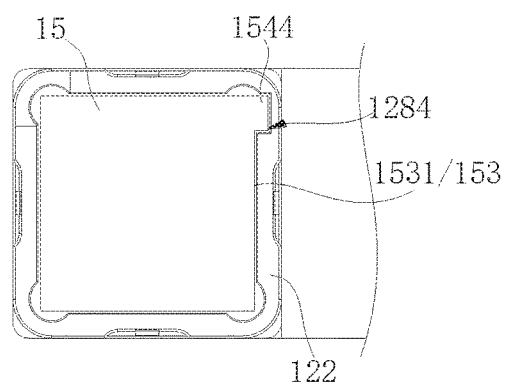
FIGS. 24 to 26 are plan views illustrating a laser projection module without a protection cover according to a third part of embodiments of the present disclosure.

As illustrated in FIG. 24, in some embodiments, the first position limiting portion 128 includes a barrel recess 1284 provided in the barrel side wall 122, and the second position limiting portion 154 includes a side protrusion 1544 which protrudes outwards from the side surface 153 of the diffractive optical element 15. When the bottom surface 152 is joined with the position limiting protrusion 123, the side protrusion 1544 extends into the barrel recess 1284. The position of the side protrusion 1544 corresponds to the position of the barrel recess 1284, and the number of the side protrusion 1544 is equal to the number of the barrel recess 1284. A section of the side protrusion 1544, which is taken along a plane parallel to the bottom surface 152, may have one or more shapes of a rectangle shape, a semicircle shape, a triangle shape, a trapezoid shape, and a circle. It can be understood that if the user reverses the diffractive optical element 15, the side protrusion 1544 will interfere with the barrel side wall 122, and thus the diffractive optical element 15 cannot be mounted on the position limiting protrusion 123, such that the user can easily realize that the diffractive optical element 15 is reversed. Thus, the side protrusion 1544 and the barrel recess 1284 can prevent the diffractive optical element 15 from being reversed.

Specifically, as illustrated in FIG. 24, in some embodiments, the side surface 153 includes a plurality of sub side surfaces 1531 which are sequentially connected end to end, and a single barrel recess 1284 and a single side protrusion 1544 are provided. The side protrusion 1544 is arranged on other portions than a middle portion of the sub side surface 1531. That is, when the number of the side protrusion 1544 is one, the side protrusion 1544 may be provided on the other portions than the middle portion of the sub side surface 1531, thus avoiding a case that the side protrusion 1544 is still able to protrude into the barrel recess 1284 when the user reverses the diffractive optical element 15, so as to further prevent the diffractive optical element 15 from being reversed.

Figure 25:
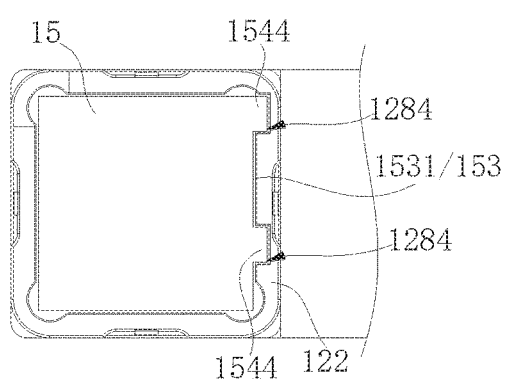

As illustrated in FIG. 25, in some embodiments, a plurality of barrel recesses 1284 and a plurality of side protrusions 1544 are provided, and the number of the barrel recesses 1284 is equal to the number of the side protrusions 1544. The shape of each side protrusion 1544 is the same with the shape of the corresponding barrel recess 1284. Different side protrusions 1544 have different shapes. The same shape of the side protrusion 1544 and the barrel recess 1284 means that the shape of an outer contour of the side protrusion 1544 is the same with the shape of a cavity of the barrel recess 1284. In the embodiment, since different side protrusions 1544 have different shapes, the side protrusion 1544 and the barrel recess 1284 which are not corresponding to each other cannot be completely fitted due to the different shapes, such that the user can easily realize whether the diffractive optical element 15 is correctly mounted.

Figure 26:
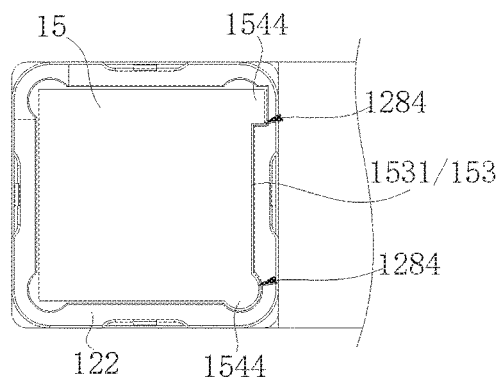

As illustrated in FIG. 26, in some embodiments, the side surface 153 includes a plurality of sub side surfaces 1531 which are connected end to end. A plurality of barrel recesses 1284 and a plurality of side protrusions 1544 are provided, and the number of the barrel recesses 1284 is equal to the number of the side protrusions 1544. The plurality of side protrusions 1544 are not symmetrical with respect to a middle portion of any one of the sub side surfaces 1531. In the embodiment illustrated in FIG. 26, the diffractive optical element 15 has a square shape in whole, and the side surface 153 includes four sub side surfaces 1531. The number of the side protrusions 1544 is two and both are arranged on one sub side surface 1531, and the two side protrusions 1544 are not symmetrical about the middle portion of any one of the sub side surfaces 1531. Certainly, one side protrusion 1544 may be arranged on a certain sub side surface 1531, and the other sub side surfaces 1531 may also be provided with the side protrusion 1544. However, the plurality of side protrusions 1544 are not symmetric about the middle position of any one of the sub side surfaces 1531. Thus, when the user reverses the diffractive optical element 15, at least one of the side protrusions 1544 will interfere with the barrel side wall 122, such that the user can easily realize that the diffractive optical element 15 is reversed.

As illustrated in FIG. 26, in some embodiments, a plurality of barrel recesses 1284 and a plurality of side protrusions 1544 are provided, and the number of the barrel recesses 1284 is equal to the number of the side protrusions 1544. The plurality of side protrusions 1544 are not spaced apart from one another by an equivalent angle. Specifically, when two side protrusions 1544 are provided, an included angle between respective connecting lines of the two side protrusions 1544 and a center of the diffractive optical elements 15 is not 180 degrees. When three side protrusions 1544 are provided, an included angle between respective connecting lines of at least two adjacent side protrusions 1544 and the center of the diffractive optical elements 15 is not 120 degrees. Thus, when the user reverses the diffractive optical element 15, at least one of the side protrusions 1544 will interfere with the barrel side wall 122, such that the user can easily realize that the diffractive optical element 15 is reversed.

Figure 27:
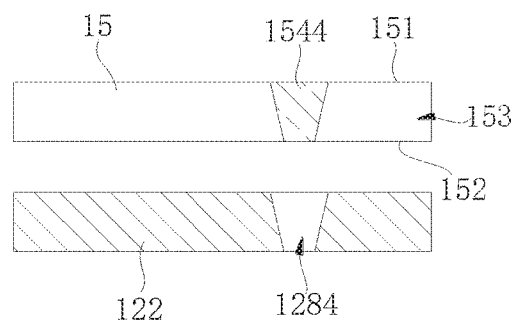
FIG. 27 is a schematic view illustrating a diffractive optical element and a barrel side wall according to a third part of embodiments of the present disclosure.

As illustrated in FIG. 27, in some embodiments, a size of the side protrusion 1544 gradually decreases and a size of the barrel recess 1284 also gradually decreases in a direction from the top surface 151 to the bottom surface 152. Further, the maximum size of the side protrusion 1544 is larger than the minimum size of the barrel recess 1284. When the user reverses the diffractive optical element 15, the side protrusion 1544 cannot fully protrude into the barrel recess 1284, but raise the diffractive optical element 15, such that the user can easily realize that the diffractive optical element 15 is reversed.

Figure 28:
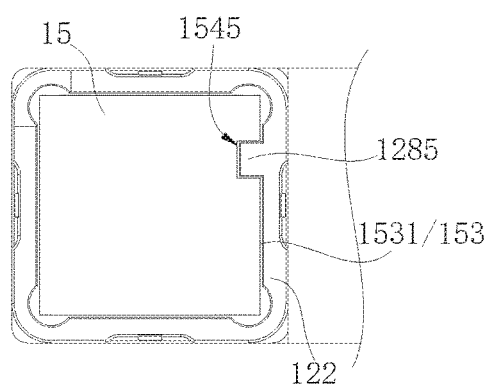
FIG. 28 is a plan view illustrating a laser projection module without a protection cover according to a third part of embodiments of the present disclosure.

As illustrated in FIG. 28, in some embodiments, the first position limiting portion 128 includes a barrel protrusion 1285 that protrudes from the barrel side wall 122, and the second position limiting portion 154 includes a side recess 1545 formed in the side surface 153. When the bottom surface 152 is joined with the position limiting protrusion 123, the barrel protrusion 1285 extends into the side recess 1545. The position of the barrel protrusion 1285 corresponds to the position of the side recess 1545, and the number of the barrel protrusion 1285 is equal to the number of the side recess 1545. A section of the barrel protrusion 1285, which is taken along a plane parallel to the bottom surface 152, may have one or more shapes of a rectangular shape, a semicircular shape, a triangular shape, a trapezoidal shape and a circular shape. It can be understood that if the user reverses the diffractive optical element 15, the barrel protrusion 1285 will interfere with the diffractive optical element 15, and thus the diffractive optical element 15 cannot be mounted on the position limiting protrusion 123, such that the user can easily realize that the diffractive optical element 15 is reversed. Therefore, the barrel protrusion 1285 and the side recess 1545 can prevent the diffractive optical element 15 from being reversed.

Specifically, as illustrated in FIG. 28, in some embodiments, the side surface 153 includes a plurality of sub side surfaces 1531 which are sequentially connected end to end, and a single side recess 1545 and a single barrel protrusion 1285 are provided. The side recess 1545 is arranged in other portions than a middle portion of the sub side surface 1531. That is, when the number of the side recess 1545 is one, the side recess 1545 may be provided in the other portions than the middle portion of the sub side surface 1531, thus avoiding a case that the barrel protrusion 1285 is still able to protrude into the side recess 1545 when the user reverses the diffractive optical element 15, so as to further prevent the diffractive optical element 15 from being reversed.

Figure 29:
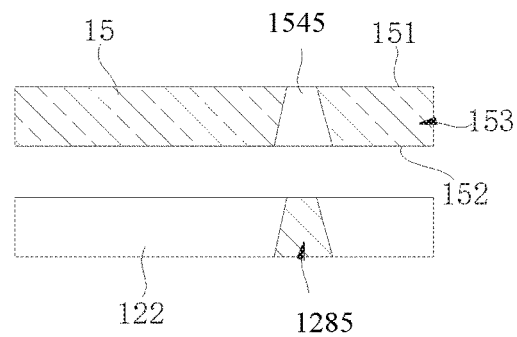
FIG. 29 is a schematic view illustrating a diffractive optical element and a barrel side wall according to a third part of embodiments of the present disclosure.

As illustrated in FIG. 29, in some embodiments, a size of the side recess 1545 gradually increases and a size of the barrel protrusion 1285 also gradually increases in a direction from the top surface 151 to the bottom surface 152. Further, the maximum size of the barrel protrusion 1285 is larger than the minimum size of the side recess 1545. When the user reverses the diffractive optical element 15, the barrel protrusion 1285 cannot fully protrude into the side recess 1545, but raise the diffractive optical element 15, such that the user can easily realize that the diffractive optical element 15 is reversed.

FIGS. 30-42 are descriptions of the fourth part of the embodiments of the present disclosure. It should be noted that the fourth part of embodiments of the present disclosure may be independent from the remaining parts (the first part, the second part, the third part, the fifth part) of embodiments of the present disclosure. Certainly, it can be understood that those skilled in the art can also combine the fourth part of embodiments of the present disclosure with the rest parts (the first part, the second part, the third part, the fifth part) of embodiments of the present disclosure in the case of no technical obstacles, without being limited by differences of element names and reference signs.

As illustrated in FIGS. 30-33, the laser projection module 100 according to the fourth part of the embodiments of the present disclosure includes a substrate assembly 41, a lens barrel 42, a light source 43, a collimation element 44, a diffractive optical element 45 and a protection cover 46. The light source 43, the collimation element 44 and the diffractive optical element 45 are sequentially disposed in an optical path of the light source 43. Specifically, lights emitted from the light source 43 sequentially pass through the collimation element 44 and the diffractive optical element 45. The lens barrel 42 and the protection cover 46 are included in the lens barrel assembly.

Figure 32:
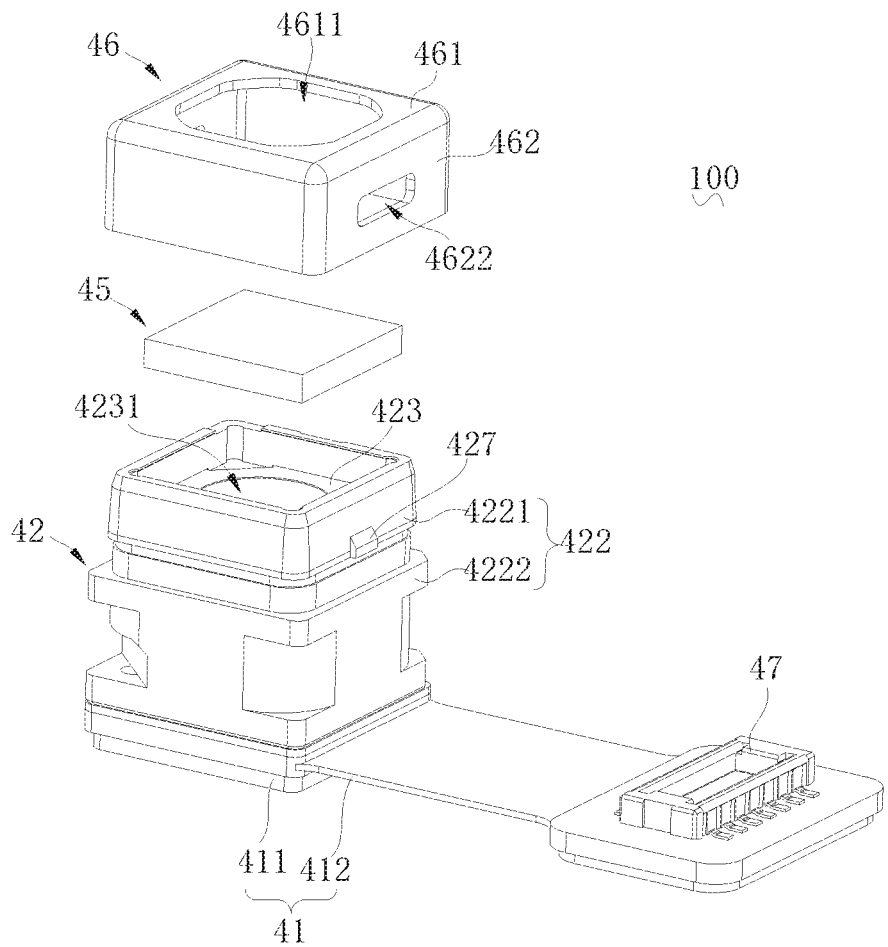
FIG. 32 is an exploded perspective view illustrating a laser projection module according to a fourth part of embodiments of the present disclosure.
Figure 33:
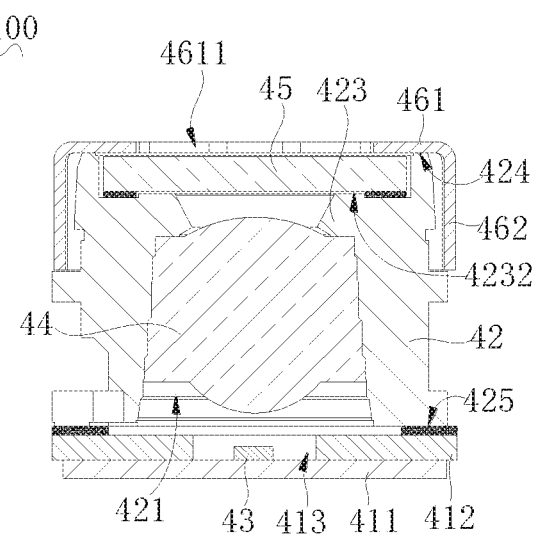
FIG. 33 is a sectional view of the laser projection module taken along line XXXIII-XXXIII in FIG. 31.

As illustrated in FIGS. 32 and 33, the substrate assembly 41 includes a substrate 411 and a circuit board 412 carried on the substrate 411. The substrate 411 is configured to carry the lens barrel 42, the light source 43 and the circuit board 412. The material of the substrate 411 may be plastic, such as at least one of Polyethylene Glycol Terephthalate (PET), Polymethyl Methacrylate (PMMA), Polycarbonate (PC), Polyimide (PI). That is, the substrate 411 may be made of a single plastic material of any one of PET, PMMA, PC or PI. As a result, the substrate 411 is light in weight and has sufficient support strength.

The circuit board 412 may be any one of a printed circuit board, a flexible circuit board, and a rigid-flex board. The circuit board 412 may be provided with a via hole 413. The via hole 413 may be configured to accommodate the light source 43 therein. A part of the circuit board 412 is covered by the lens barrel 42, and another part thereof extends out and is connected to a connector 47. The connector 47 may connect the laser projection module 100 to a main board of the electronic device.

Figure 34:
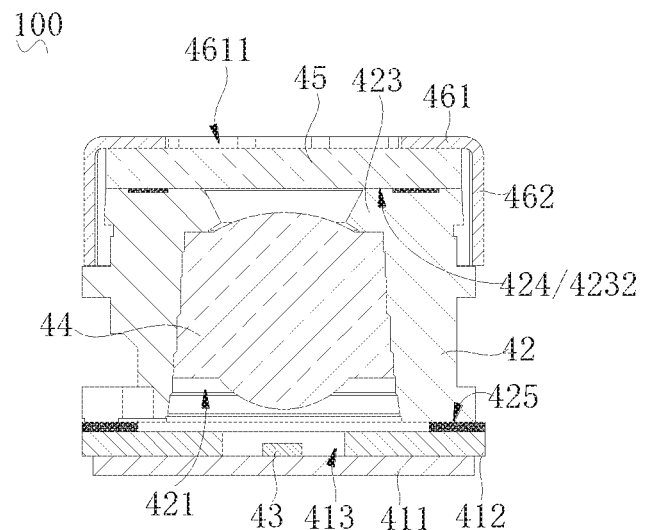
FIG. 34 is another sectional view of the laser projection module taken along line XXXIII-XXXIII in FIG. 31.
Figure 35:
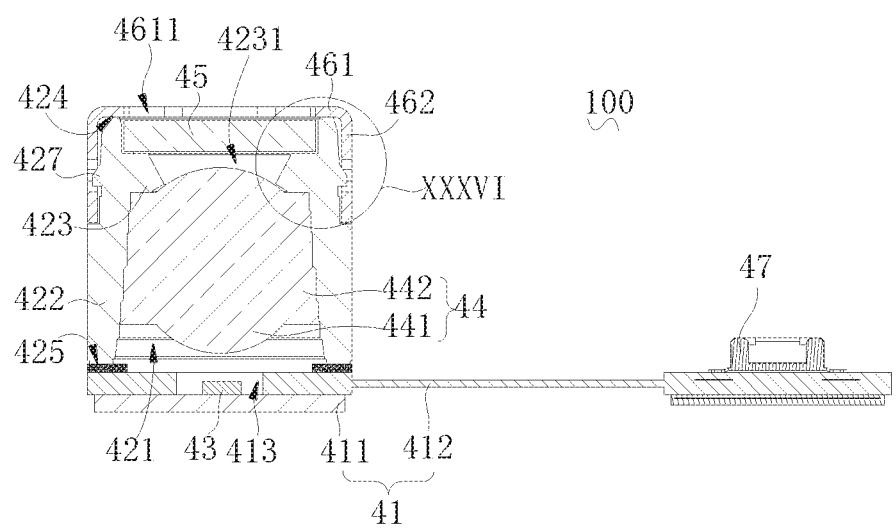
FIG. 35 is a sectional view of the laser projection module taken along line XXXV-XXXV in FIG. 31.

As illustrated in FIGS. 33-35, the lens barrel 42 is disposed on the substrate assembly 41 and defines a receiving cavity 421 together with the substrate assembly 41. Specifically, the lens barrel 42 may be connected to the circuit board 412 of the substrate assembly 41. The lens barrel 42 and the circuit board 412 may be bonded by adhesive to improve the airtightness of the receiving cavity 421. Certainly, the lens barrel 42 may be connected to the substrate assembly 41 in other specific manners, for example, by a snap connection. The receiving cavity 421 may be configured to accommodate the collimation element 44 and the diffractive optical element 45, and the receiving cavity 421 also serves as a part of the optical path of the laser projection module 100. In the fourth part of the embodiments of the present disclosure, the lens barrel 42 has a hollow cylindrical shape, and the lens barrel 42 includes a barrel side wall 422, a position limiting protrusion 423 and a fixing protrusion 427.

The barrel side wall 422 surrounds the receiving cavity 421, and an outer surface of the barrel side wall 422 may be provided with a positioning structure and a mounting structure, so as to fix the position of the laser projection module 100 when the laser projection module 100 is mounted in the electronic device. The lens barrel 42 includes a first end surface 424 and a second end surface 425 facing away from each other. One opening of the receiving cavity 421 is formed in the second end surface 425 and the other opening thereof is formed in the first end surface 424. The second end surface 425 is joined to the circuit board 412, for example, being glued to the circuit board 412, and the first end surface 424 may serve as a joint surface of the lens barrel 42 with the diffractive optical element 45 or the protection cover 46 or the like.

Figure 36:
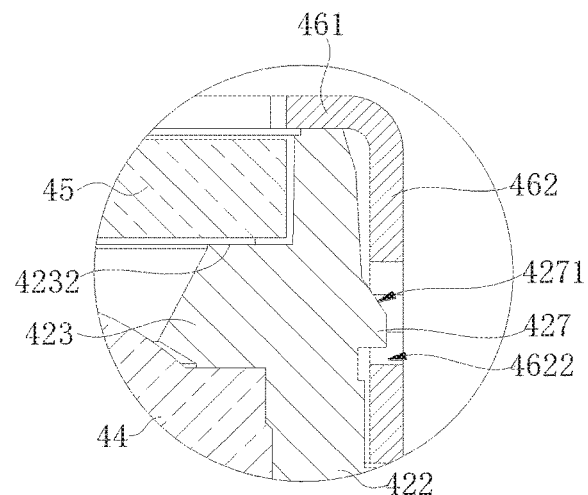
FIG. 36 is an enlarged schematic view illustrating a portion XXXVI of the laser projection module in FIG. 35.

As illustrated in FIGS. 35 and 36, the position limiting protrusion 423 protrudes inwards from the barrel side wall 422. Specifically, the position limiting protrusion 423 protrudes from the barrel side wall 422 into the receiving cavity 421. The position limiting protrusions 423 may have a continuous annular shape, or a plurality of position limiting protrusions 423 may be provided and spaced apart from one another. The position limiting protrusion 423 encloses a light via hole 4231 which may serve as a part of the receiving cavity 421. The laser passes through the light via hole 4231 and then penetrates into the diffractive optical element 45. In the embodiment illustrated in FIG. 33, the position limiting protrusion 423 is located between the first end surface 424 and the second end surface 425. A part of the receiving cavity 421 between the position limiting protrusion 423 and the second end surface 425 may be configured to receive the collimation element 44. A part of the receiving cavity 421 between the position limiting protrusion 423 and the first end surface 424 may be configured to receive the diffractive optical element 45. Furthermore, during the assembling of the laser projection module 100, when the diffractive optical element 45 abuts against the position limiting protrusion 423, it may be understood that the diffractive optical element 45 is mounted in place; when the collimation element 44 abuts against the position limiting protrusion 423, it may be understood that the collimation element 44 is mounted in place. The position limiting protrusion 423 includes a position limiting surface 4232. The position limiting surface 4232 is joined to the diffractive optical element 45, when the diffractive optical element 45 is mounted on the position limiting protrusion 423.

As illustrated in FIGS. 32, 35, 36 and 37, the fixing protrusion 427 protrudes outwards from the barrel side wall 422. Specifically, the fixing protrusion 427 protrudes outwards from an outer surface of the barrel side wall 422. The fixing protrusion 427 is closer to a position where the first end surface 424 is than the second end surface 425. In an example, a position of the fixing protrusion 427 may correspond to a position of the position limiting protrusion 423. In the fourth part of the embodiments of the present disclosure, the barrel side wall 422 includes a first section 4221 and a second section 4222 which are joined together. The first section 4221 and the second section 4222 may be integrally formed. The first end surface 424 is formed on the first section 4221 and the second end surface 425 is formed on the second section 4222. The outer contour of the first section 4221 has a smaller size than the outer contour of the second section 4222, and the fixing protrusion 427 is formed on the first section 4221, such that the total outer contour of the first section 4221 and the fixing protrusion 427 will not have a larger size than the outer contour of the second section 4222, after the fixing protrusion 427 protrudes from the first section 4221, and thus the fixing protrusion 427 will not increase the size of the outer contour of the lens barrel 42.

As illustrated in FIG. 35, the light source 43 is disposed on the substrate assembly 41. Specifically, the light source 43 may be disposed on the circuit board 412 and electrically connected to the circuit board 412. The light source 43 may also be disposed on the substrate 411 and correspond to the light via hole 413. In this case, the light source 43 may be electrically connected to the circuit board 412 through the arrangement of wires. The light source 43 is configured to emit laser, and the laser may be infrared light. In an example, the light source 43 may include a semiconductor substrate and a laser emitter disposed on the semiconductor substrate. The semiconductor substrate is arranged on the substrate 411. The laser emitter may be a Vertical Cavity Surface Emitting Laser (VCSEL). The semiconductor substrate may be provided with a single laser emitter or an array laser consisting of a plurality of laser emitters. Specifically, the plurality of laser emitters may be arranged on the semiconductor substrate in a regular or irregular two-dimensional pattern.

As illustrated in FIG. 35, the collimation element 44 may be an optical lens and is configured to collimate the laser emitted by the light source 43. The collimation element 44 is received in the receiving cavity 421 and may be assembled into the receiving cavity 421 in a direction from the second face 425 to the first face 424. The collimation element 44 includes an optical portion 441 and a mounting portion 442. The mounting portion 442 is configured to engage with the barrel side wall 422 so as to fix the collimation element 44 in the receiving cavity 421. In the fourth part of the embodiments of the present disclosure, the optical portion 441 includes two curved surfaces on two sides facing away from each other of the collimation element 44, and one of the curved surfaces of the collimation element 44 extends into the light via hole 4231.

As illustrated in FIGS. 35 and 36, the diffractive optical element 45 is mounted on the position limiting protrusion 423. Specifically, the diffractive optical element 45 is joined with the position limiting surface 4232 to be mounted on the position limiting protrusion 423. In the fourth part of the embodiments of the present disclosure, a surface of the diffractive optical element 45 joined to the position limiting surface 4232 is provided with a diffractive structure. The diffractive optical element 45 may project the laser collimated by the collimation element 44 into a laser pattern corresponding to the diffractive structure. The diffractive optical element 45 may be made of glass or of a composite plastic such as PET.

Figure 30:
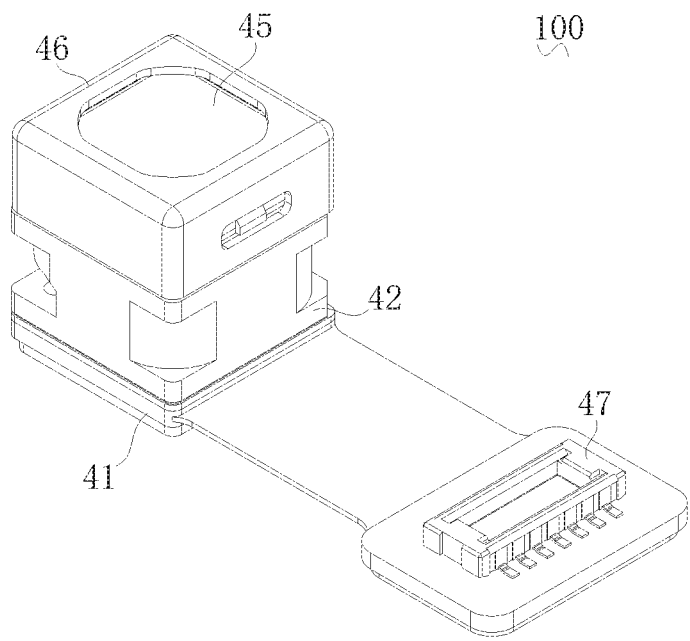
FIG. 30 is a perspective view illustrating a laser projection module according to a fourth part of embodiments of the present disclosure.
Figure 31:
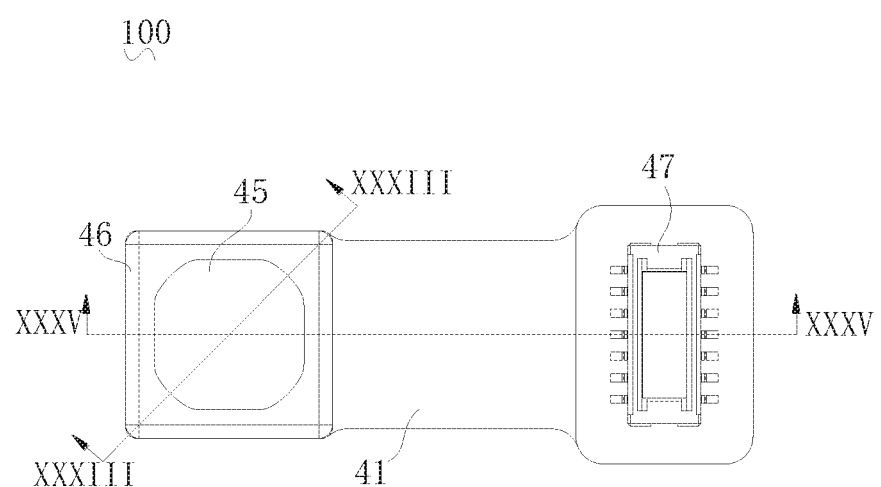
FIG. 31 is a plan view illustrating a laser projection module according to a fourth part of embodiments of the present disclosure.

As illustrated in FIG. 30, the protection cover 46 is engaged with the lens barrel 42 and configured to limit the position of the diffractive optical element 45. Specifically, the protection cover 46 serves to prevent the diffractive optical element 45 from coming out of the lens barrel 42 after the joining of the diffractive optical element 45 and the lens barrel 42 has failed. As illustrated in FIG. 32, the protection cover 46 includes a protection top wall 461 and a protection side wall 462.

As illustrated in FIGS. 35 and 36, the protection top wall 461 and the position limiting protrusion 423 are respectively located on two sides facing away from each other of the diffractive optical element 45, i.e. the diffractive optical element 45 is located between the position limiting protrusion 423 and the protection top wall 461. Thus, even if the joining of the diffractive optical element 45 with the position limiting protrusion 423 is failed, the diffractive optical element 45 will not fall off due to the limitation of the protection top wall 461. The protection top wall 461 is provided with a light through hole 4611, and a position of the light through hole 4611 corresponds to the diffractive optical element 45. The laser passes through the light via hole 4231, the diffractive optical element 45 and the light through hole 4611 in sequence, and then is emitted from the laser projection module 100. In the fourth part of the embodiments of the present disclosure, the protection top wall 461 has a rounded square shape in whole, and the light through hole 4611 may have a circular shape, a rectangular shape, an elliptical shape, a trapezoidal shape or the like. The light through hole 4611 has an aperture smaller than at least one of a width or a length of the diffractive optical element 45 so as to restrict the diffractive optical element 45 between the protection top wall 461 and the position limiting protrusion 423. In the embodiment illustrated in FIG. 33, when the protection cover 46 is engaged with the lens barrel 42, the protection top wall 461 abuts against the first end surface 424. Further, the protection top wall 461 may also be joined with the first end surface 424 by glue or the like.

Figure 38:
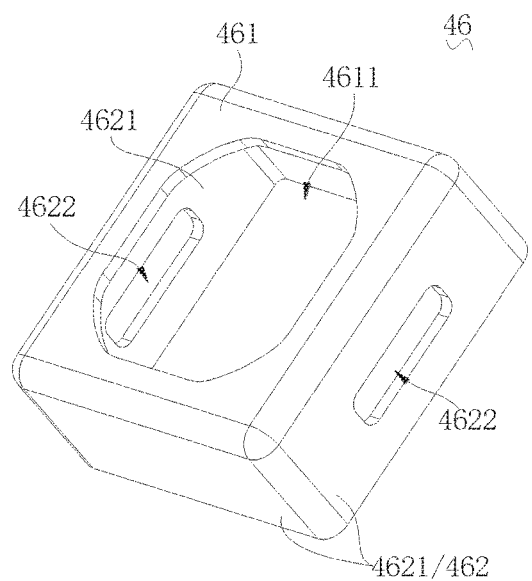
FIG. 38 is a perspective view illustrating a protection cover of a laser projector according to a fourth part of embodiments of the present disclosure.

As illustrated in FIGS. 35, 36 and 38, the protection side wall 462 extends from a periphery of the protection top wall 461. The protection cover 46 is covered on the lens barrel 42. The protection side wall 462 is fixedly connected to the barrel side wall 422. The protection side wall 462 is provided with a fixing hole 4622. When the lens barrel 42 is covered by the protection cover 46, the fixing protrusion 427 protrudes into the fixing hole 4622. Specifically, a position where the fixing hole 4622 is formed corresponds to a position where the fixing protrusion 427 is provided, and the protection cover 46 has certain elasticity. In the process of covering the lens barrel 42 with the protection cover 46, the fixing protrusion 427 abuts against the protection side wall 462. The fixing protrusion 427 pushes the protection side wall 462 outwards and the protection side wall 462 is elastically deformed. When mounted in place, the fixing protrusion 427 protrudes into the fixing hole 4622 and no longer pushes the protection side wall 462 outwards, and thus the protection side wall 462 is restored to the original shape, along with a tactile feedback and a click sound feedback of mounting in place. It can be understood that, when the lens barrel 42 is covered by the protection cover 46, if the protection side wall 462 is not pulled outwards by an external force, the protection cover 46 can always be covered on the lens barrel 42 due to a position limitation action of the fixing protrusion 427, such that the protection top wall 461 prevents the diffractive optical element 45 from coming out of the lens barrel 42.

Accordingly, in the laser projection module 100 according to the fourth part of the embodiments of the present disclosure, the diffractive optical element 45 is arranged between the position limiting protrusion 423 and the protection top wall 461. Moreover, since the fixing protrusion 427 may protrude into the fixing hole 4622 to fixedly connect the protection cover 46 with the lens barrel 42, the diffractive optical element 45 will not fall off in the light-emitting direction, which prevents the laser from being emitted without passing through the diffractive optical element 45, thereby protecting the user and improving the safety.

As illustrated in FIG. 34, in some embodiments, the position limiting protrusion 423 may also be provided at the top of the lens barrel 42. Specifically, the position limiting surface 4232 of the position limiting protrusion 423 may be coincided with the first end surface 424. When the diffractive optical element 45 is mounted on the position limiting protrusion 423, the diffractive optical element 45 is joined to the first end surface 424. Specifically, the first end surface 424 may be provided with a joining groove, and an adhesive may be arranged in the joining groove to bond the diffractive optical element 45 to the first end surface 424. In this case, the protection top wall 461 abuts against the diffractive optical element 45, and the protection top wall 161 and the position limiting protrusion 423 clamp the diffractive optical element 45 together. Thus, the structure of the lens barrel 42 is simple, and the diffractive optical element 45 can be easily mounted on the position limiting protrusion 423.

As illustrated in FIGS. 36 and 38, in some embodiments, the protection side wall 462 includes a plurality of protection segments 4621 which are connected end to end. At least two protection segments 4621 are provided with the fixing hole 4622. The numbers of the fixing protrusions 427 and the fixing holes 4622 are identical and the positions thereof are corresponding. Each fixing protrusion 427 protrudes into the corresponding fixing hole 4622. Thus, the plurality of fixing protrusions 427 are fitted with the fixing holes 4622, and the protection cover 46 will not be easily separated from the lens barrel 42 by the external force, thereby improving the reliability of the protection cover 46 being covered on the lens barrel 42. Specifically, at least two opposite protection segments 4621 are provided with the fixing hole 4622. Correspondingly, the barrel side wall 422 is provided with the fixing protrusions 427 in at least two opposite positions. In this case, if it is desired to pull the protection side wall 462 outwards to remove the protection cover 46, the at least two opposite protection segments 4621 need to be pulled to both sides, respectively. That is, a pulling force at least needs to be applied on both sides so as to prevent the protection side wall 462 from being deformed due to the pulling force applied on a single side, which otherwise will fail the fit of the fixing protrusion 427 and the fixing hole 4622, thereby further improving the reliability of the protection cover 46 being covered on the lens barrel 42.

As illustrated in FIG. 36, in some embodiments, the fixing protrusion 427 is provided with a guiding inclined surface 4271, and the guiding inclined surface 4271 gradually moves away from the barrel side wall 422 along a direction in which the protection cover 46 is sleeved onto the lens barrel 42. In the process of covering the lens barrel 42 with the protection cover 46, the protection side wall 462 abuts against the guiding inclined surface 4271. Since the guiding inclined surface 4271 is inclined with respect to the barrel side wall 422, the abutting force applied to the protection side wall 462 by the guiding inclined surface 4271 is slowly and continuously increased, and a deformation amount of the protection side wall 462 is also continuously increased, during the process of the protection side wall 462 abutting against the guiding inclined surface 4271, thus making it easy to cover the lens barrel 42 by the protection cover 46.

Figure 37:
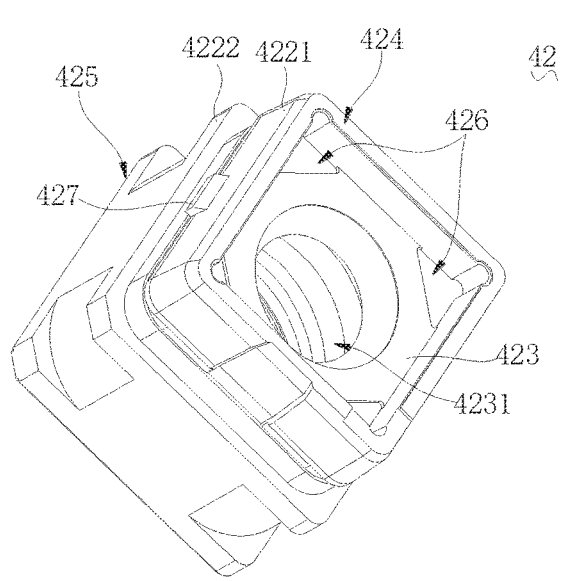
FIG. 37 is a perspective view illustrating a lens barrel of a laser projector according to a fourth part of embodiments of the present disclosure.

As illustrated in FIGS. 36 and 37, in some embodiments, the position limiting protrusion 423 includes a position limiting surface 4232, and the diffractive optical element 45 is mounted on the position limiting surface 4232. The lens barrel 42 is provided with a glue receiving groove 426 in the position limiting surface 4232. When the diffractive optical element 45 is mounted, glue may be dispensed in the glue receiving groove 426 first, and then the diffractive optical element 45 is mounted on the position limiting surface 4232. Under the bonding of the glue, the joining of the diffractive optical element 45 and the position limiting protrusion 423 is relatively reliable. Further, the glue may be accommodated in the glue receiving groove 426, so as to prevent the glue from overflowing from the glue receiving groove 426 to the diffractive structure of the diffractive optical element 45.

Specifically, the glue receiving groove 426 is spaced apart from the light via hole 4231 to prevent the glue in the glue receiving groove 426 from flowing into the light via hole 4231 to affect the transmission of the laser. A plurality of the glue receiving grooves 426 may be provided. The plurality of the glue receiving grooves 426 are evenly distributed at a periphery of the light via hole 4231 around an axis of the light through hole 1261. Thus, when the diffractive optical element 45 is bonded to the position limiting protrusion 423, the bonding force is relatively uniform and is not easy to fail.

Figure 39:
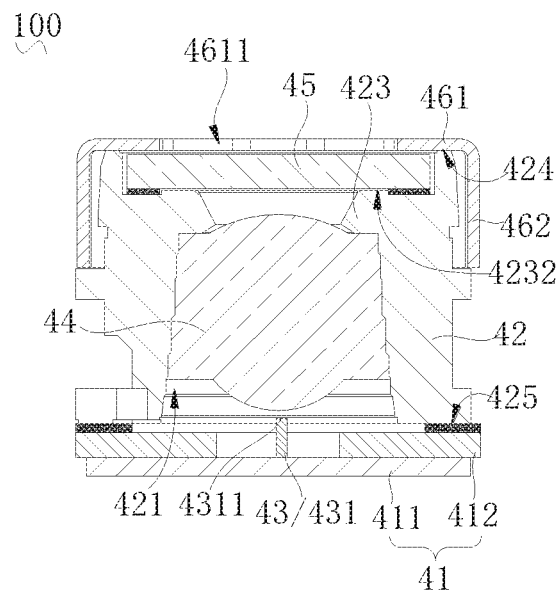
FIG. 39 is a further sectional view of the laser projection module taken along line XXXIII-XXXIII in FIG. 31.

As illustrated in FIG. 39, in some embodiments, the light source 43 includes an edge-emitting laser (EEL) 431. Specifically, the edge-emitting laser 431 may be a Distributed Feedback Laser (DFB). The edge-emitting laser 431 has a columnar shape in whole, and an end surface of the edge-emitting laser 431 away from the substrate assembly 41 is configured as a light emitting surface 4311. The laser is emitted from the light emitting surface 4311, and the light emitting surface 4311 faces the collimation element 44. The edge-emitting laser 431 is used as the light source. On one hand, the edge-emitting laser 431 has a lower temperature drift than the VCSEL array. On the other hand, since the edge-emitting laser 431 has a single-point light-emitting structure, no array structure needs to be provided and the manufacturing is easy, such that the cost of the light source of the laser projection module 100 is low.

Figure 40:
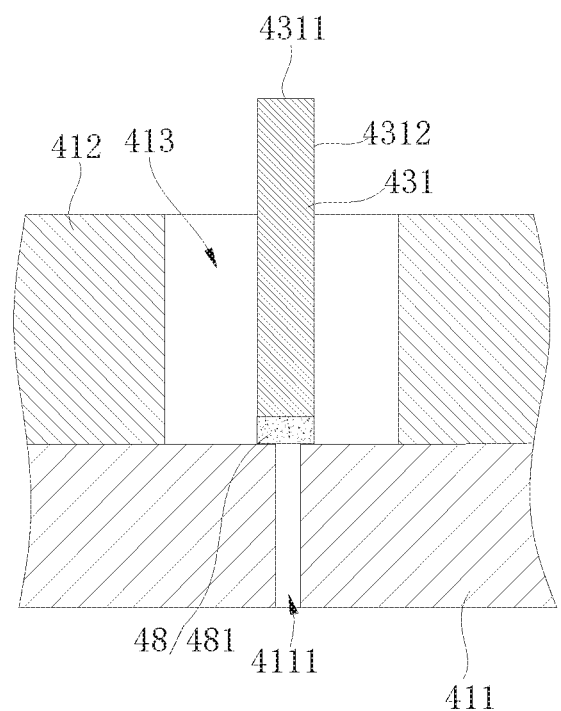
FIGS. 40 to 42 are partial schematic views of a laser projector according to a fourth part of embodiments of the present disclosure.
Figure 41:
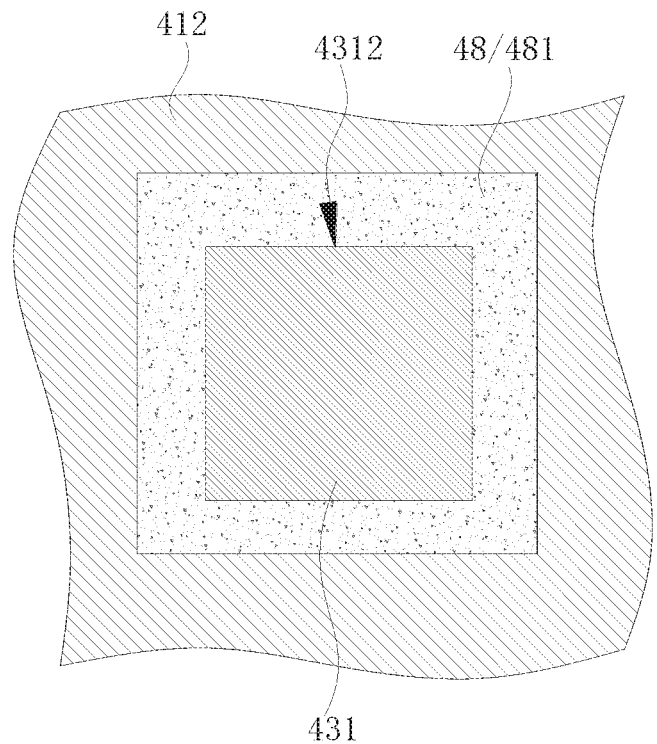

As illustrated in FIGS. 39 and 40, in some embodiments, the laser projection module 100 further includes a fixing member 48 for fixing the edge-emitting laser 431 to the substrate assembly 41. When the laser of the distributed feedback laser propagates, the power gain is obtained through feedbacks of a grating structure. In order to enhance the power of the distributed feedback laser, the injected current and/or the length of the distributed feedback laser need to be increased. Since increasing the injected current will increase the power consumption of the distributed feedback laser and cause a severe heat emission, in order to ensure that the distributed feedback laser can operate normally, it is required to increase the length of the distributed feedback laser, such that the distributed feedback laser generally has a slender structure. When the light-emitting surface 4311 of the edge-emitting laser 431 faces the collimation element 44, the edge-emitting laser 431 is arranged vertically. Since the edge-emitting laser 431 has the slender structure, the edge-emitting laser 431 tends to encounter accidents such as dropping, shifting or shaking. As such, the fixing member 48 is provided to fix the edge-emitting laser 431 so as to prevent the edge-emitting laser 431 from encountering accidents such as dropping, shifting or shaking.

Specifically, as illustrated in FIG. 40, in some embodiments, the fixing member 48 includes a sealant 481 arranged between the edge-emitting laser 431 and the substrate assembly 41. More specifically, a surface of the edge-emitting laser 431 facing away from the light emitting surface 4311 is bonded to the substrate assembly 41. In the example illustrated in FIG. 41, a side surface 4312 of the edge-emitting laser 431 may also be bonded to the substrate assembly 41. The sealant 481 wraps around the surrounding side surfaces 4312, or may bond only one of the side surfaces 4312 or some of the side surfaces 4312 to the substrate assembly 41. Further, the sealant 481 may be a thermal conductive adhesive to conduct heat generated by the operation of the light source 43 to the substrate assembly 41. In order to improve the heat dissipation efficiency, the substrate 411 may further be provided with a heat dissipation hole 4111, through which the heat generated during the operation of the light source 43 or the circuit board 412 may be dissipated. The heat dissipation hole 4111 may also be filled with the thermal conductive adhesive to further improve the heat dissipation performance of the substrate assembly 41.

Figure 42:
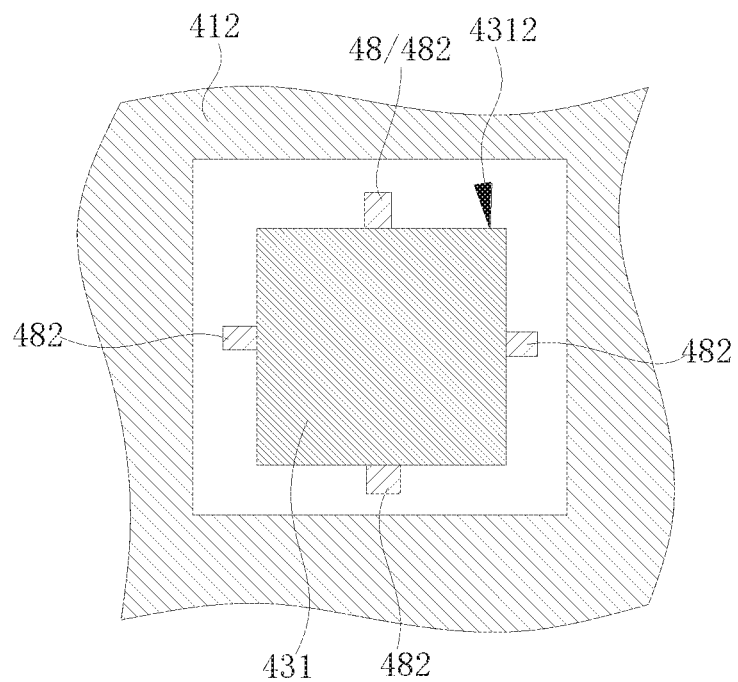
Figure 43:
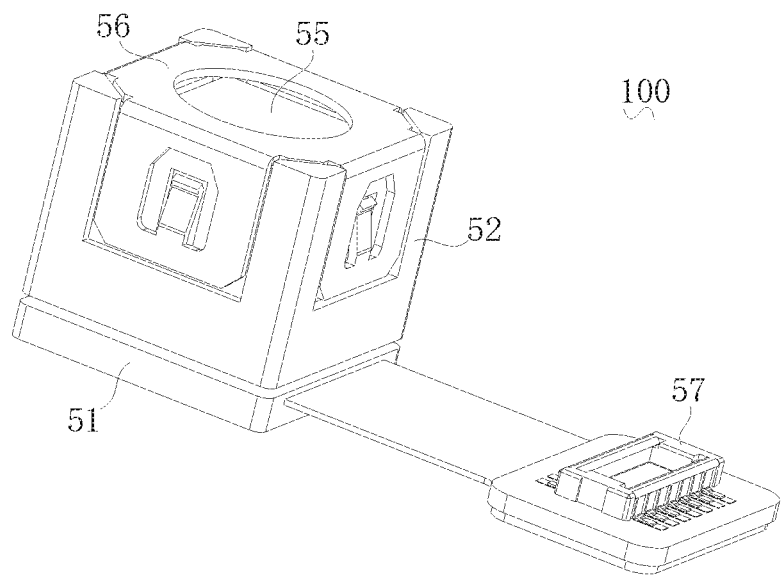
FIG. 43 is a perspective view illustrating a laser projection module according to a fifth part of embodiments of the present disclosure.
Figure 44:
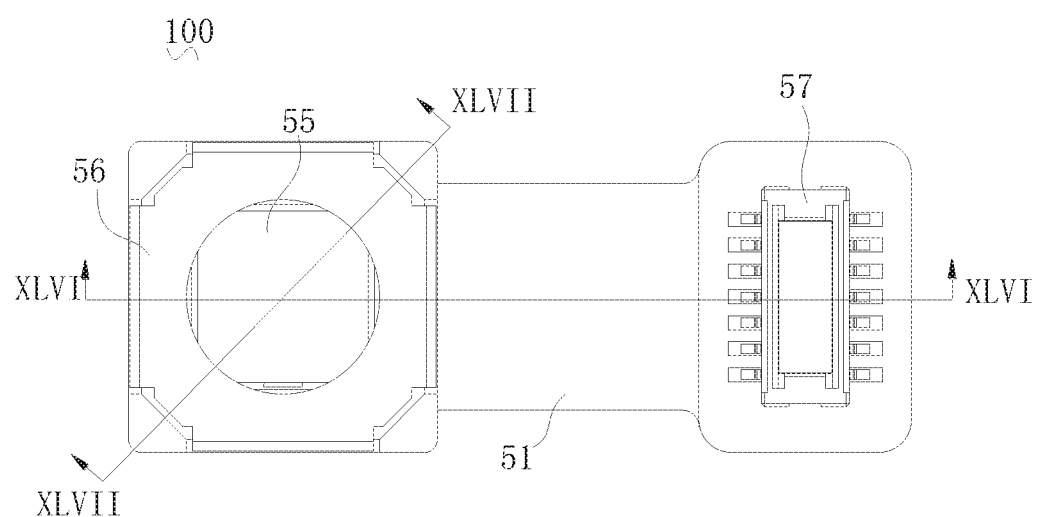
FIG. 44 is a plan view illustrating a laser projection module according to a fifth part of embodiments of the present disclosure.

As illustrated in FIG. 42, in some embodiments, the fixing member 48 includes a support frame 482 disposed on the substrate assembly 41, and the edge-emitting laser 431 is fixed to the support frame 482. A plurality of support frames 482 may be provided. The plurality of support frames 482 may surround the edge-emitting laser 431 together, and the edge-emitting laser 431 may be directly mounted among the plurality of support frames 482 during mounting. In an example, the plurality of support frames 482 clamp the edge-emitting laser 431 together, so as to further prevent the edge-emitting laser 431 from shaking.

In some embodiments, the substrate 411 may be omitted and the light source 43 may be directly fixed to the circuit board 412, so as to reduce the overall thickness of the laser projection module 100.

FIGS. 43-51 are descriptions of the fifth part of the embodiments of the present disclosure. It should be noted that the fifth part of embodiments of the present disclosure may be independent from the remaining parts (the first part, the second part, the third, the fourth part) of embodiments of the present disclosure. Certainly, it can be understood that those skilled in the art can also combine the fifth part of embodiments of the present disclosure with the rest parts (the first part, the second part, the third part, the fourth part) of embodiments of the present disclosure in the case of no technical obstacles, without being limited by differences of element names and reference signs.

As illustrated in FIGS. 43-46, the laser projection module 100 includes a substrate assembly 51, a lens barrel 52, a light source 53, a collimation element 54, a diffractive optical element 55 and a protection cover 56. The light source 53, the collimation element 54 and the diffractive optical element 55 are sequentially disposed in an optical path of the light source 53. Specifically, lights emitted from the light source 53 sequentially pass through the collimation element 54 and the diffractive optical element 55. The lens barrel 52 and the protection cover 56 are included in a lens barrel assembly.

Figure 46:
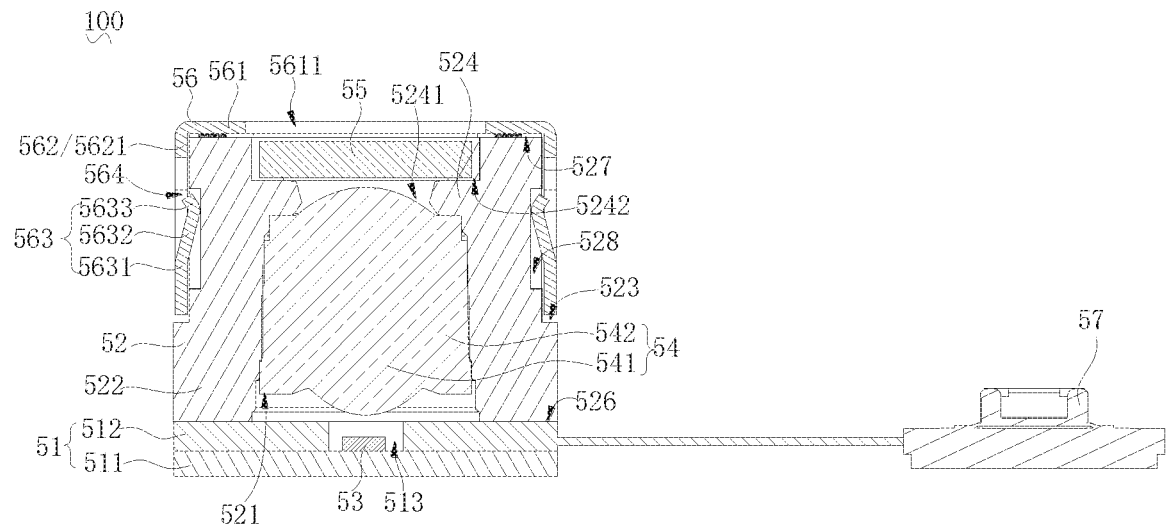
FIG. 46 is a sectional view of the laser projection module taken along line XLVI-XLVI in FIG. 44.
Figure 47:
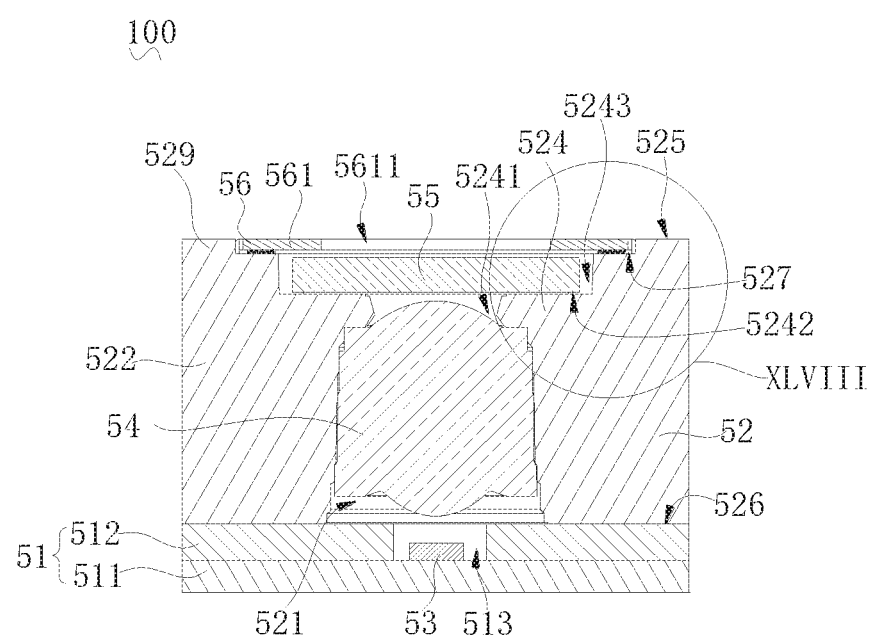
FIG. 47 is a sectional view of the laser projection module taken along line XLVII-XLVII in FIG. 44.

As illustrated in FIGS. 46 and 47, the substrate assembly 51 includes a substrate 511 and a circuit board 512 carried on the substrate 511. The substrate 511 is configured to carry the lens barrel 52, the light source 53 and the circuit board 512. The material of the substrate 511 may be plastic, such as at least one of Polyethylene Glycol Terephthalate (PET), Polymethyl Methacrylate (PMMA), Polycarbonate (PC), Polyimide (PI). That is, the substrate 511 may be made of a single plastic material of any one of PET, PMMA, PC or PI. As a result, the substrate 511 is light in weight and has sufficient support strength.

The circuit board 512 may be any one of a printed circuit board, a flexible circuit board, and rigid-flex board. The circuit board 512 may be provided with a via hole 513. The via hole 513 may be configured to accommodate the light source 53 therein. A part of the circuit board 512 is covered by the lens barrel 52, and another part thereof extends out and is connected to a connector 57. The connector 57 may connect the laser projection module 100 to a main board of the electronic device.

Figure 48:
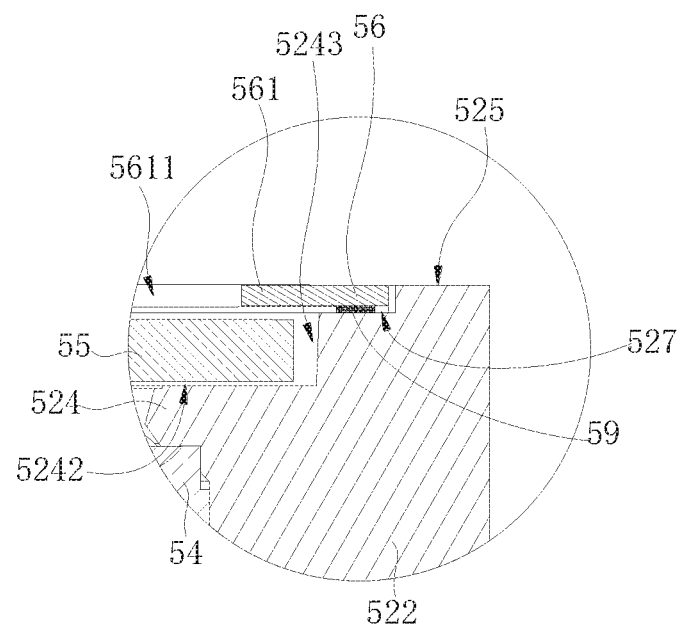
FIG. 48 is an enlarged schematic view illustrating a portion XLVIII of the laser projection module in FIG. 47.

As illustrated in FIGS. 46-48, the lens barrel 52 is disposed on the substrate assembly 51 and defines a receiving cavity 521 together with the substrate assembly 51. The lens barrel 52 includes a barrel side wall 522, and the barrel side wall 522 is provided with a side-wall groove 523. Specifically, the lens barrel 52 may be connected to the circuit board 512 of the substrate assembly 51. The lens barrel 52 and the circuit board 512 may be bonded by adhesive to improve the airtightness of the receiving cavity 521. Certainly, the lens barrel 52 and the substrate assembly 51 may be connected in other specific manners, for example, by a snap connection. The receiving cavity 521 may be configured to accommodate the collimation element 54 and the diffractive optical element 55, and the receiving cavity 521 also serves as a part of the optical path of the laser projection module 100. In the fifth part of the embodiments of the present disclosure, the lens barrel 52 has a hollow cylindrical shape, and the lens barrel 52 includes a barrel side wall 522.

The barrel side wall 522 encloses the receiving cavity 521, and an outer surface of the barrel side wall 522 may be provided with a positioning structure and a mounting structure, so as to fix a position of the laser projection module 100 when the laser projection module 100 is mounted in the electronic device. The lens barrel 52 includes a first end surface 525 and a second end surface 526 facing away from each other. One opening of the receiving cavity 521 is formed in the second end surface 526 and the other opening thereof is formed in the first end surface 525. The second end surface 526 is joined to the circuit board 512, for example, being glued to the circuit board 512. The lens barrel 52 includes a joint surface 527 between the first end surface 525 and the second end surface 526, and the joint surface 527 is a contact surface of the protection cover 56 and the lens barrel 52.

Figure 49:
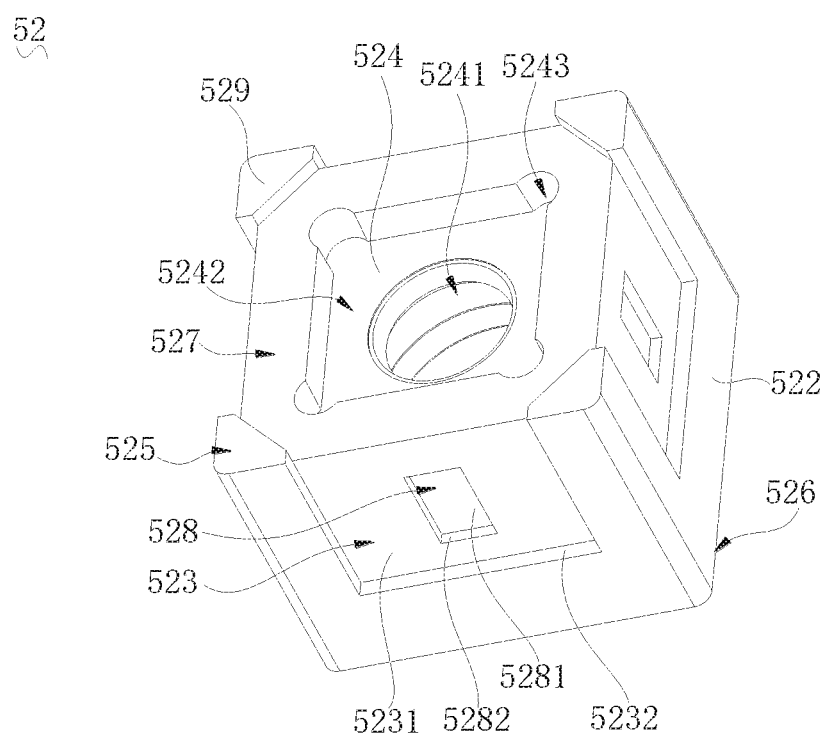
FIG. 49 is a perspective view illustrating a lens barrel of a laser projector according to a fifth part of embodiments of the present disclosure.
Figure 50:
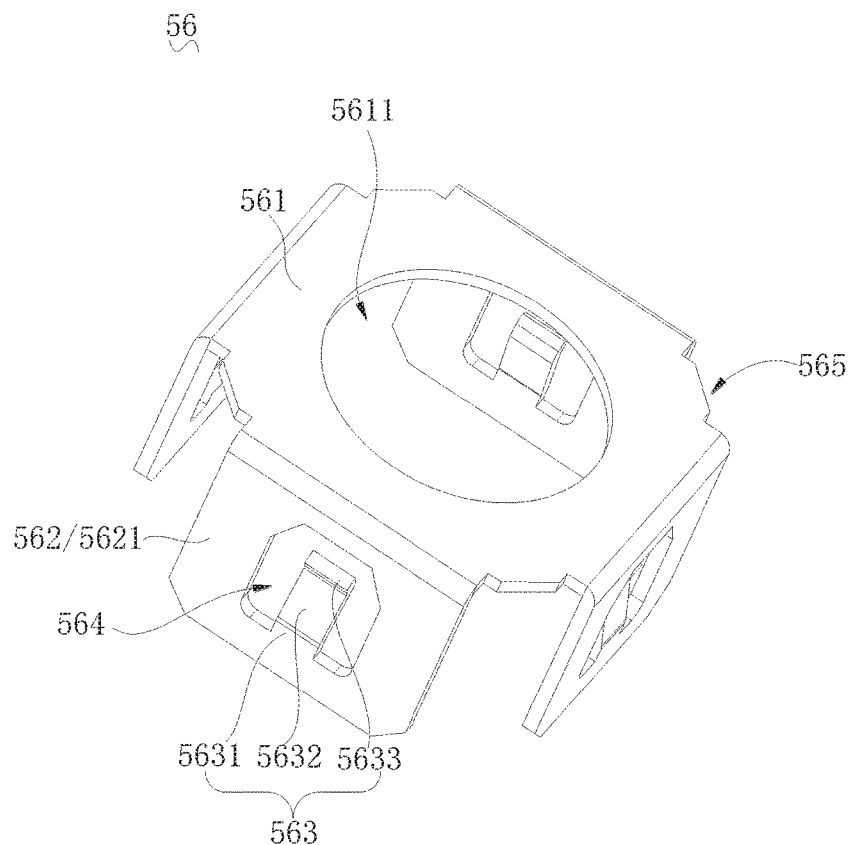
FIG. 50 is a perspective view illustrating a protection cover of a laser projector according to a fifth part of embodiments of the present disclosure.

As illustrated in FIGS. 49 and 50, the barrel side wall 522 is provided with the side-wall groove 523. Specifically, the side-wall groove 523 is defined by a groove bottom 5231 and a groove side wall 5232 extending from a periphery of the groove bottom 5231. A plurality of the side-wall grooves 523 are provided, and spaced apart from one another. The side-wall groove 523 is configured to engage with the protection cover 56 so as to fix the protection cover 56 to the lens barrel 52.

As illustrated in FIG. 46, the light source 53 is disposed on the substrate assembly 51. Specifically, the light source 53 may be disposed on the circuit board 512 and electrically connected to the circuit board 512. The light source 53 may also be disposed on the substrate 511 and be accommodated in the via hole 513. In this case, the light source 53 may be electrically connected to the circuit board 512 through the arrangement of wires. The light source 53 is configured to emit laser, and the laser may be infrared light. In an example, the light source 53 may include a semiconductor substrate and a laser emitter disposed on the semiconductor substrate. The semiconductor substrate is arranged on the substrate 511. The laser emitter may be a Vertical Cavity Surface Emitting Laser (VCSEL). The semiconductor substrate may be provided with a single laser emitter or an array laser consisting of a plurality of laser emitters. Specifically, the plurality of laser emitters may be arranged on the semiconductor substrate in a regular or irregular two-dimensional pattern.

As illustrated in FIG. 46, the collimation element 54 may be an optical lens and is configured to collimate the laser emitted by the light source 53. The collimation element 54 is received in the receiving cavity 521 and may be assembled into the receiving cavity 521 in a direction from the second end surface 526 to the first end surface 525. The collimation element 54 includes an optical portion 541 and a mounting portion 542. The mounting portion 542 is configured to engage with the barrel side wall 522 so as to fix the collimation element 54 in the receiving cavity 521. In the fourth part of the embodiments of the present disclosure, the optical portion 541 includes two curved surfaces on two sides facing away from each other of the collimation element 54.

Figure 45:
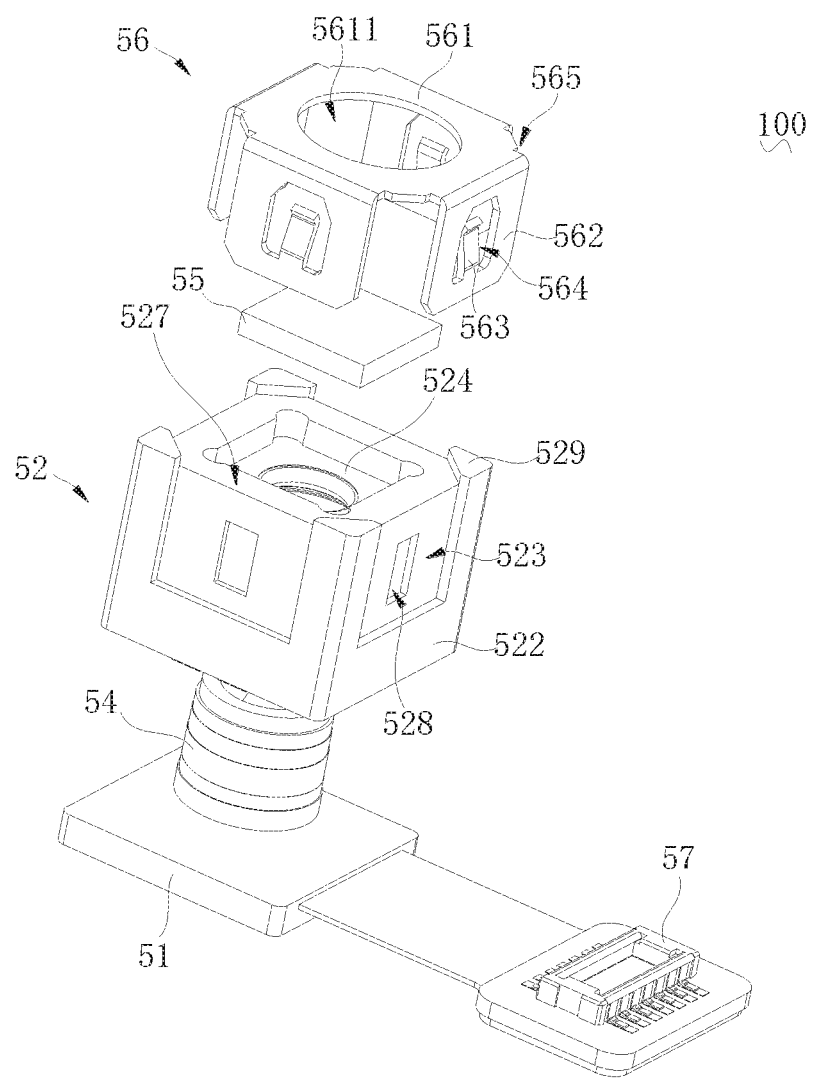
FIG. 45 is an exploded perspective view illustrating a laser projection module according to a fifth part of embodiments of the present disclosure.

As illustrated in FIGS. 45 and 46, the diffractive optical element 55 is accommodated in the receiving cavity 521. In the fifth part of the embodiments of the present disclosure, the diffractive optical element 55 is provided with a diffractive structure, and the diffractive optical element 55 may project the laser collimated by the collimation element 54 into a laser pattern corresponding to the diffractive structure. The diffractive optical element 55 may be made of glass or of a composite plastic such as PET.

As illustrated in FIGS. 45, 46 and 50, the protection cover 56 is engaged with the lens barrel 52 for limiting a position of the diffractive optical element 55. Specifically, the protection cover 56 can stop the diffractive optical element 55 from moving in the light-emitting direction of the laser projection module 100. The protection cover 56 includes a protection top wall 561 and a protection side wall 562.

The protection top wall 561 can limit the position of the diffractive optical element 55. Specifically, the protection top wall 561 can stop the diffractive optical element 55 from moving in the light-emitting direction of the laser projection module 100. The protection top wall 561 is provided with a light through hole 5611, and the position of the light through hole 5611 corresponds to the diffractive optical element 55. The laser passes through the collimation element 54, the diffractive optical element 55 and the light through hole 5611, and then is emitted from the laser projection module 100. In the fifth of the embodiments of the present disclosure, the light through hole 5611 may have a regular-polygon shape, a circular shape, a rectangular shape, an elliptical shape, a trapezoidal shape or the like. The light through hole 5611 has an aperture smaller than at least one of a width or a length of the diffractive optical element 55 to restrict the diffractive optical element 55 by the protection top wall 561. In the embodiment illustrated in FIG. 46, when the protection cover 56 is engaged with the lens barrel 52, the protection top wall 561 abuts against the joint surface 527. In the embodiment illustrated in FIG. 48, a glue layer 59 is provided between the protection top wall 561 and the joint surface 527. The protection top wall 561 is bonded to the joint surface 527 by glue, so as to make engagement of the protection cover 56 and the lens barrel 52 more reliable.

As illustrated in FIGS. 46, 49 and 50, the protection side wall 562 extends from the periphery of the protection top wall 561. When the lens barrel 52 is covered by the protection cover 56, the protection side wall 562 extends into the side-wall groove 523 and is engaged with the barrel side wall 522. Specifically, the protection side wall 562 includes a plurality of protection segments 5621 spaced apart from one another. When the lens barrel 52 is covered by the protection cover 56, the side-wall groove 523 guides the protection segment 5621 to mount the protection cover 56 on the laser projection module 100. An inner wall surface of the protection segment 5621 is engaged with the groove bottom 1232 of the side-wall groove 523, and a side wall surface of the protection segments 161 is engaged with the groove side wall 5232 of the side-wall groove 523, so as to limit the position of the protection segments 161. The protection segment 5621 may also be joined to the barrel side wall 522 by adhering. Thus, the lens barrel 52 may be covered by the protection cover 56, and the protection top wall 561 prevents the diffractive optical element 55 from falling off in the light-emitting direction of the laser projection module 100.

Accordingly, in the laser projection module 100 according to the fifth part of the embodiments of the present disclosure, since the protection side wall 562 of the protection cover 56 extends into the side-wall groove 523 of the lens barrel 52 so as to join the protection cover 56 to the lens barrel 52, the protection top wall 561 of the protection cover 56 can stop the diffractive optical element 55 from moving in the light-emitting direction of the laser projection module 100, which prevents the laser from being emitted after passing through the diffractive optical element 55, thereby protecting the user and improving the safety.

As illustrated in FIGS. 46, 47 and 49, in some embodiments, the lens barrel 52 includes a position limiting protrusion 524 that protrudes from the barrel side wall 522 into the receiving cavity 521. The diffractive optical element 55 is mounted on the position limiting protrusion 524 and is arranged between the position limiting protrusion 524 and the protection top wall 561. Specifically, the position limiting protrusion 523 may have a continuous annular shape, or a plurality of position limiting protrusions 523 may be provided and spaced apart from one another. The position limiting protrusion 523 defines a light via hole 5241, and the light via hole 5241 serves as a part of the receiving cavity 521. The laser passes through the light via hole 5241 and then penetrates into the diffractive optical element 55. The light via hole 5241 corresponds to the light through hole 5611. The laser passes through the light through hole 5611 after passing through the diffractive optical element 55. In the embodiment illustrated in FIG. 46, the position limiting protrusion 524 is arranged between the second end surface 526 and the joint surface 527, and a part of the receiving cavity 521 between the position limiting protrusion 524 and the first end surface 525 may be configured to accommodate the diffractive optical element 55. One of the curved surfaces of the collimation element 54 extends into the light via hole 5241. Moreover, during the assembling of the laser projection module 100, when the diffractive optical element 55 abuts against the position limiting protrusion 524, it may be understood that the diffractive optical element 55 is mounted in place; when the collimation element 54 abuts against the position limiting protrusion 524, it may be understood that the collimation element 54 is mounted in place.

As illustrated in FIGS. 46 and 49, in some embodiments, the barrel side wall 522 also defines a position limiting groove 528. Specifically, the position limiting groove 528 is formed in the groove bottom 5231 of the side-wall groove 523 and further may be located in a central portion of the groove bottom 5231. The protection cover 56 includes an elastic hook 563 protruding inwards from the protection side wall 562. The number of the hooks 563 is the same with the number of the position limiting grooves 528, and the position of the hook 563 is corresponding to the position of the position limiting groove 528. Each hook 563 extends into the corresponding position limiting groove 528. Specifically, the hook 563 has certain elasticity. During the process of covering the lens barrel 52 with the protection cover 56, the hook 563 extends into the position limiting groove 528 and engages with the position limiting groove 528. That is, the hook 563 is elastically deformed and abuts against a side wall of the position limiting groove 528. It can be understood that, after the lens barrel 52 is covered by the protection cover 56, in the case that no external force is applied to move the protection side wall 562 in the light-emitting direction of the laser projection module 100, the protection cover 56 can always be covered on the lens barrel 52 due to the position limiting action of the hook 563, such that the protection top wall 561 prevents the diffractive optical element 55 from coming out of the lens barrel 52.

As illustrated in FIGS. 46, 49 and 50, in some embodiments, the hook 563 includes a connecting portion 5631, an extending portion 5632 and a abutting portion 5633. The position limiting groove 528 is defined by a position limiting bottom wall 5281 and a position limiting side wall 5282 extending from a periphery of the position limiting bottom wall 5281.

Specifically, the connecting portion 5631 is connected to the protection side wall 562, the extending portion 5632 is connected to the connecting portion 5631, and the abutting portion 5633 is connected to the extending portion 5632. That is, the protection side wall 562, the connecting portion 5631, the extending portion 5632 and the abutting portion 5633 are connected in sequence. The extending portion 5632 extends from the protection segment 5621 to the interior of the protection cover 56, and the abutting portion 5633 extends from the extending portion 5632 to the exterior of the protection cover 56. The included angle between the extending portion 5632 and the connecting portion 5631 is an obtuse angle, and the included angle between the abutting portion 5633 and the extending portion 5632 is a right angle or an obtuse angle. During the process of covering the lens barrel 52 by the protection cover 56, the extending portion 5632 abuts against the position limiting bottom wall 5281, and the hook 563 is fitted with the position limiting groove 528 until the extension portion 5632 and the abutting portion 5633 extend into the position limiting groove 528. Since the extending portion 5632 and the abutting portion 5633 have certain elasticity, the extending portion 5632 is elastically deformed in a direction running away from the position limiting groove 528, and the abutting portion 5633 abuts against the position limiting bottom wall 5281 of the position limiting groove 528. When mounted in place, the abutting portion 5633 abuts against the position limiting side wall 5282 of the position limiting groove 528 adjacent to the joint surface 527, so as to prevent the protection cover 56 from falling off from the lens barrel 52. When the protection cover 56 is to be removed from the lens barrel 52, the abutting portion 5633 is pulled and the extending portion 5632 is deformed in the direction running away from the position limiting groove 528 until the extending portion 5632 and the abutting portion 5633 extend out of the position limiting groove 528, i.e., pulling the hook 563 outwards, and then the protection cover 56 is further pulled off in the light-emitting direction of the laser projection module 100. Thus, the engagement of the protection cover 56 with the lens barrel 52 is ensured to be reliable, and it is also easy to remove the protection cover 56 from the lens barrel 52.

As illustrated in FIGS. 46 and 50, in some embodiments, the protection side wall 562 is provided with a relief hole 564 at a position corresponding to the hook 563. During the process of covering the lens barrel 52 by the protection cover 56, when the hook 563 abuts against the position limiting groove 528 and is elastically deformed, the relief hole 564 provides a deformation space for the elastic deformation of the hook 563. That is, the hook 563 is elastically deformed and protrudes into the relief hole 564. Specifically, when the hook 563 abuts against the position limiting groove 528, the hook 563 is elastically deformed outwards, and the hook 563 extends into the relief hole 564 to avoid a motion interference with the protection side wall 562. In addition, it is also convenient for the user to observe the fit between the hook 563 and the position limiting groove 528 through the relief hole 564, for example, to determine whether all the hooks 563 are engaged with the corresponding position limiting grooves 528.

As illustrated in FIGS. 47, 49 and 50, in some embodiments, the lens barrel 52 further includes a position limiting corner 529 protruding from the joint surface 527. The protection side wall 562 includes a plurality of protection segments 5621. The protection top wall 561 is provided with a position limiting notch 565, and the position limiting notch 565 spaces two adjacent protection segments 5621 apart from each other, and the position limiting corner 529 is fitted with the position limiting notch 565.

Specifically, the position limiting corner 529 is arranged at a periphery of the joint surface 527. A top surface of the position limiting corner 529 may be the first end surface 525. When the lens barrel 52 is covered by the protection cover 56, the protection top wall 561 is located between the top surface of the position limiting corner 529 and the joint surface 527. A periphery of the protection top wall 561 is provided with the position limiting notch 565, and the position limiting notch 565 is fitted with the position limiting corner 529 to limit the position of the protection top wall 561, so as to avoid a translation of the protection top wall 561 on the joint surface 527, and to make it convenient for the user to extend the protection segment 5621 into the side-wall groove 523 along the groove side wall 5232 of the side-wall groove 523.

As illustrated in FIGS. 48 and 49, in some embodiments, the position limiting protrusion 524 includes a position limiting surface 5242, and the diffractive optical element 55 is mounted on the position limiting surface 5242. A bottom surface of the diffractive optical element 55 is joined to the position limiting surface 5242. A top surface of the diffractive optical element 55 may be flush with the joint surface 527 or may be slightly lower than the joint surface 527. The lens barrel 52 is provided with a mounting groove 5243 at a periphery of the position limiting protrusion 524. Specifically, the mounting groove 5243 is formed in a periphery of the position limiting surface 5242, so as to facilitate mounting and removal of the diffractive optical element 55. For example, if the diffractive optical element 55 is damaged, such as an unclear diffraction pattern, since the gap between the mounting groove 5243 and the diffractive optical element 55 is large, the diffractive optical element 55 can be easily taken out from the mounting groove 5243. A plurality of mounting grooves 5243 may be provided, and evenly distributed at the periphery of the light via hole 5241 around the axis of the light via hole 5241, such that the diffractive optical element 55 can be smoothly taken out.

Figure 51:
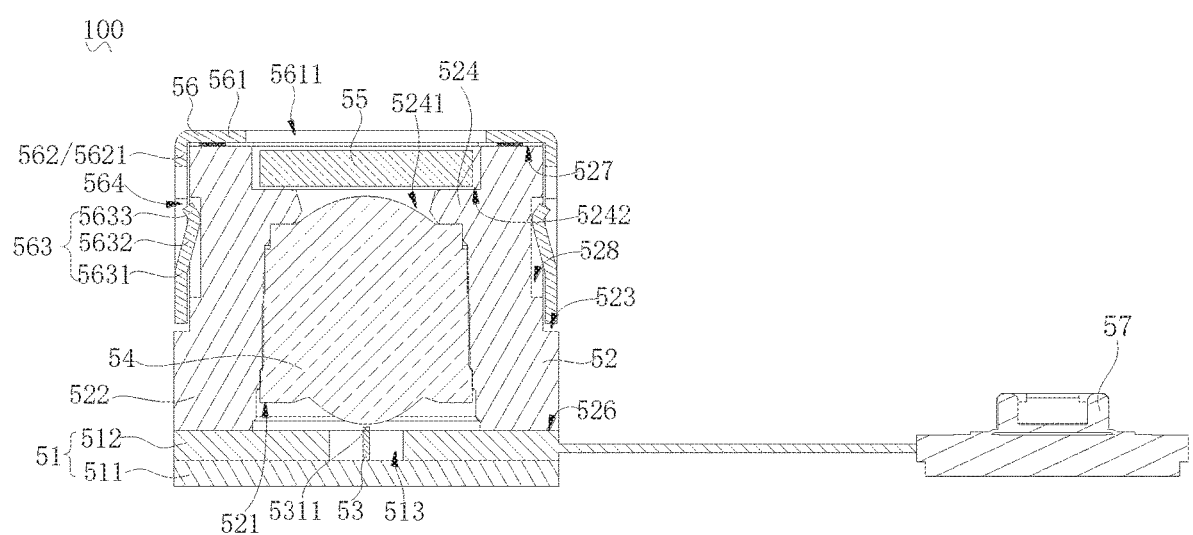
FIG. 51 is another sectional view of the laser projection module taken along line XLVI-XLVI in FIG. 44.

As illustrated in FIG. 51, in some embodiments, the light source 53 includes an edge-emitting laser (EEL) 531. Specifically, the edge-emitting laser 531 may be a Distributed Feedback Laser (DFB). The edge-emitting laser 531 has columnar shape in whole, and an end surface of the edge-emitting laser 531 away from the substrate assembly 51 is configured as a light emitting surface 5311. The laser is emitted from the light emitting surface 5311, and the light emitting surface 5311 faces the collimation element 54. The edge-emitting laser 531 is used as the light source 53. On one hand, the edge-emitting laser 531 has a lower temperature drift than the VCSEL array. On the other hand, since the edge-emitting laser 531 has a single-point light-emitting structure, no array structure needs to be provided and the manufacturing is easy, such that the cost of the light source 531 of the laser projection module 100 is low.

Figure 52:
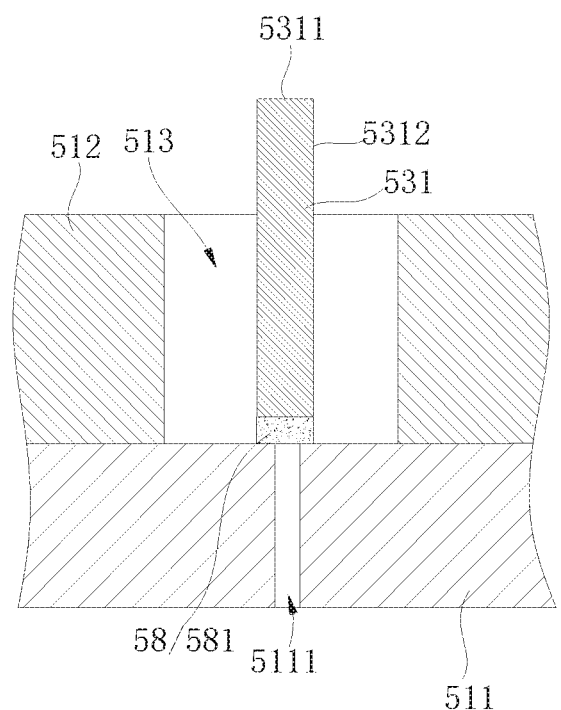
FIGS. 52 to 54 are partial schematic views illustrating a laser projector according to a fifth part of embodiments of the present disclosure.

As illustrated in FIGS. 51 and 52, in some embodiments, the laser projection module 100 further includes a fixing member 58 for fixing the edge-emitting laser 531 to the substrate assembly 51. When the laser of the distributed feedback laser propagates, the power gain is obtained through feedbacks of a grating structure. In order to enhance the power of the distributed feedback laser, the injected current and/or the length of the distributed feedback laser need to be increased. Since increasing the injected current will increase the power consumption of the distributed feedback laser and cause a severe heat emission, in order to ensure that the distributed feedback laser can operate normally, it is required to increase the length of the distributed feedback laser, such that the distributed feedback laser generally has a slender structure. When the light-emitting surface 5311 of the edge-emitting laser 531 faces the collimation element 54, the edge-emitting laser 531 is arranged vertically. Since the edge-emitting laser 531 has the slender structure, the edge-emitting laser 531 tends to encounter accidents such as dropping, shifting or shaking. As such, the fixing member 58 is provided to fix the edge-emitting laser 531 so as to prevent the edge-emitting laser 531 from encountering accidents such as dropping, shifting or shaking.

Specifically, as illustrated in FIG. 52, in some embodiments, the fixing member 58 includes a sealant 581 arranged between the edge-emitting laser 531 and the substrate assembly 51. More specifically, a surface of the edge-emitting laser 531 facing away from the light emitting surface 5311 is bonded to the substrate assembly 51. In the example illustrated in FIG. 53, a side surface 5312 of the edge-emitting laser 531 may also be bonded to the substrate assembly 51. The sealant 581 wraps around the surrounding side surfaces 5312, or may also bond only one of the side surfaces 5312 or some of the side surfaces 5312 to the substrate assembly 51. Further, the sealant 581 may be a thermal conductive adhesive to conduct heat generated by the operation of the light source 53 to the substrate assembly 51. In order to improve the heat dissipation efficiency, the substrate 511 may further be provided with a heat dissipation hole 5111, and the heat generated during the operation of the light source 53 or the circuit board 512 may be dissipated through the heat dissipation hole 5111. The heat dissipation hole 5111 may also be filled with a thermal conductive adhesive to further improve the heat dissipation performance of the substrate assembly 51.

Figure 54:
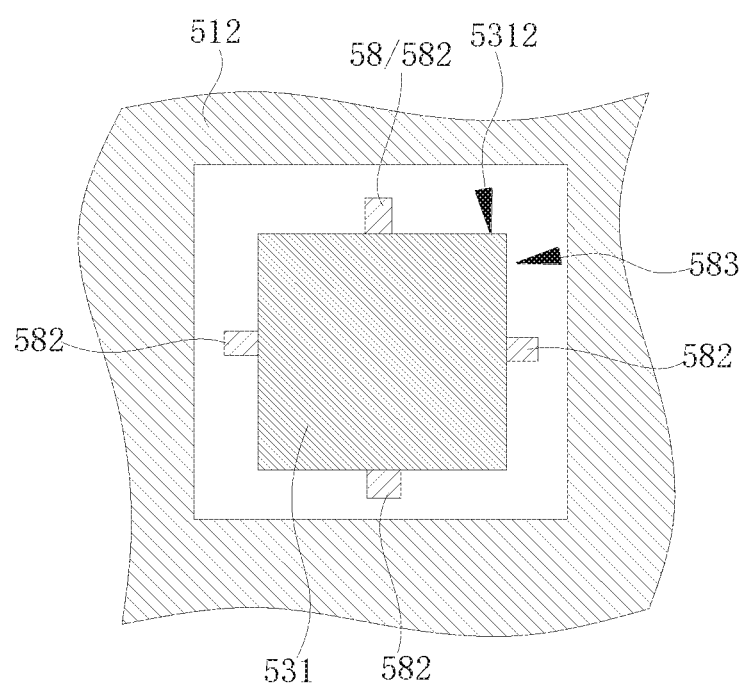

As illustrated in FIG. 54, in some embodiments, the fixing member 58 includes at least two elastic support frames 582 disposed on the substrate assembly 51. The at least two support frames 582 define a receiving space 583 together, and the receiving space 583 is configured to receive the edge-emitting laser 531. The at least two supporting frames 582 are configured to support the edge-emitting laser 531, so as to further prevent the edge-emitting laser 531 from shaking.

In some embodiments, the substrate 511 may be omitted and the light source 53 may be directly fixed to the circuit board 512 so as to reduce the overall thickness of the laser projection module 100.

Figure 55:
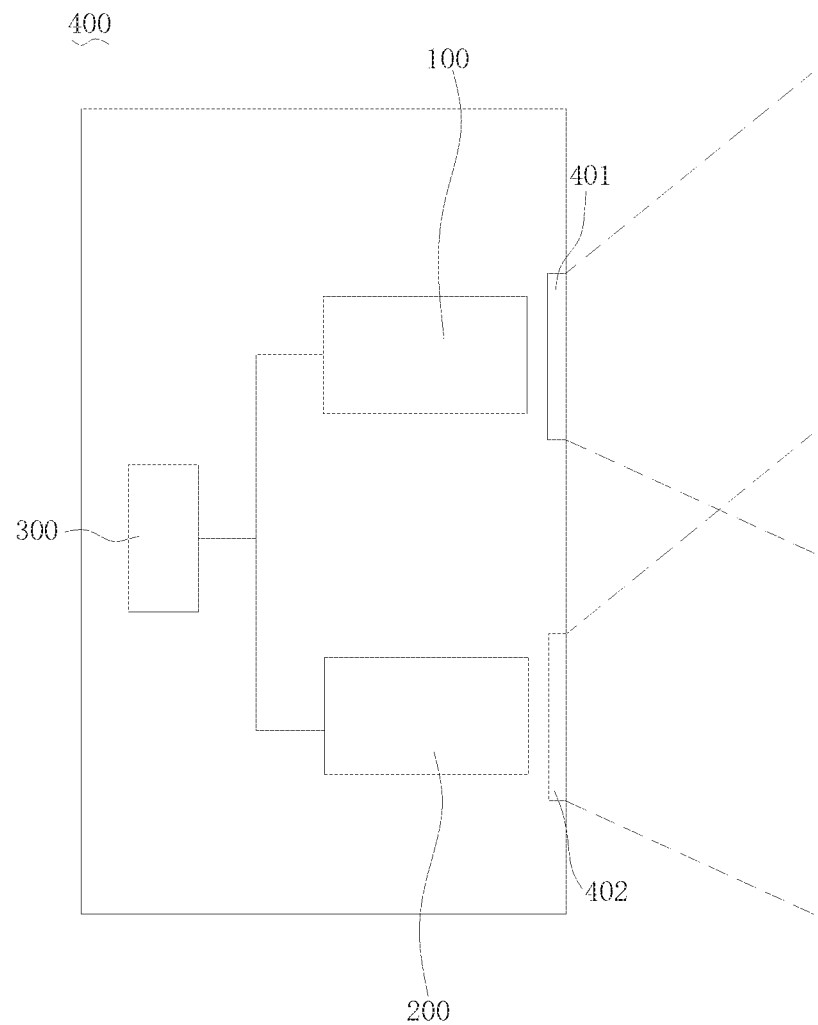
FIG. 55 is a schematic view illustrating a depth camera according to embodiments of the present disclosure.

As illustrated in FIG. 55, a depth camera 400 according to embodiments of the present disclosure includes a laser projection module, an image collector 200 and a processor 300. The laser projection module is the laser projection module 100 according to any one of the above parts (the first part, the second part, the third part, the fourth part, the fifth part) of the embodiments. The image acquirer 200 is configured to collect a laser pattern projected into a target space after passing through the diffractive optical element. The processor 300 is connected to the laser projection module 100 and the image acquirer 200, respectively. The processor 300 is configured to process the laser pattern to obtain a depth image.

Specifically, the laser projection module 100 projects the laser pattern into the target space through a projection window 401, and the image acquirer 200 collects the laser pattern modulated by a target object through an acquisition window 402. In an example, the laser projected by the laser projection module 100 is an infrared light, and the image acquirer 200 is an infrared camera. The processor 300 calculates a deviation value between each pixel point in the laser pattern and a corresponding pixel point in a reference pattern with an image matching algorithm, and then obtains the depth image of the laser pattern based on the deviation value. The image matching algorithm may be a digital image correlation (DIC) algorithm. Certainly, other image matching algorithms may be adopted to replace the DIC algorithm.

Figure 53:
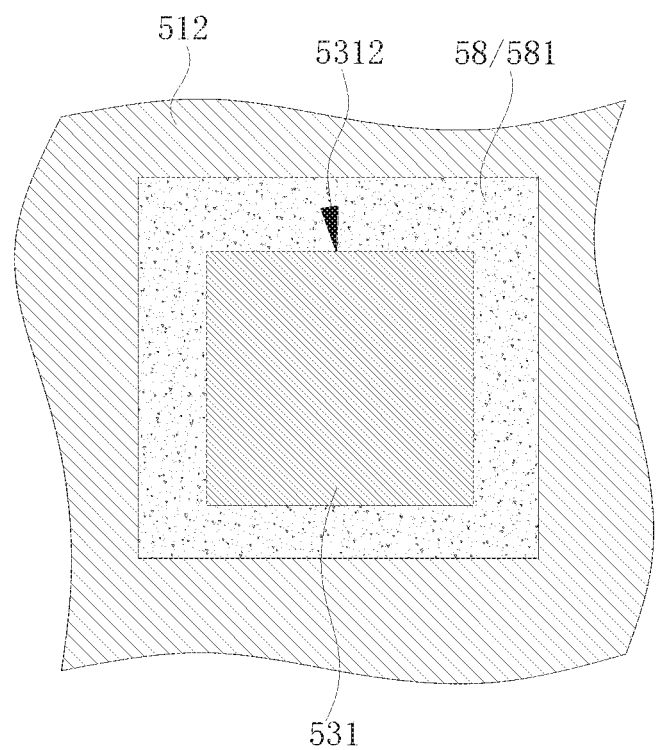
Figure 56:
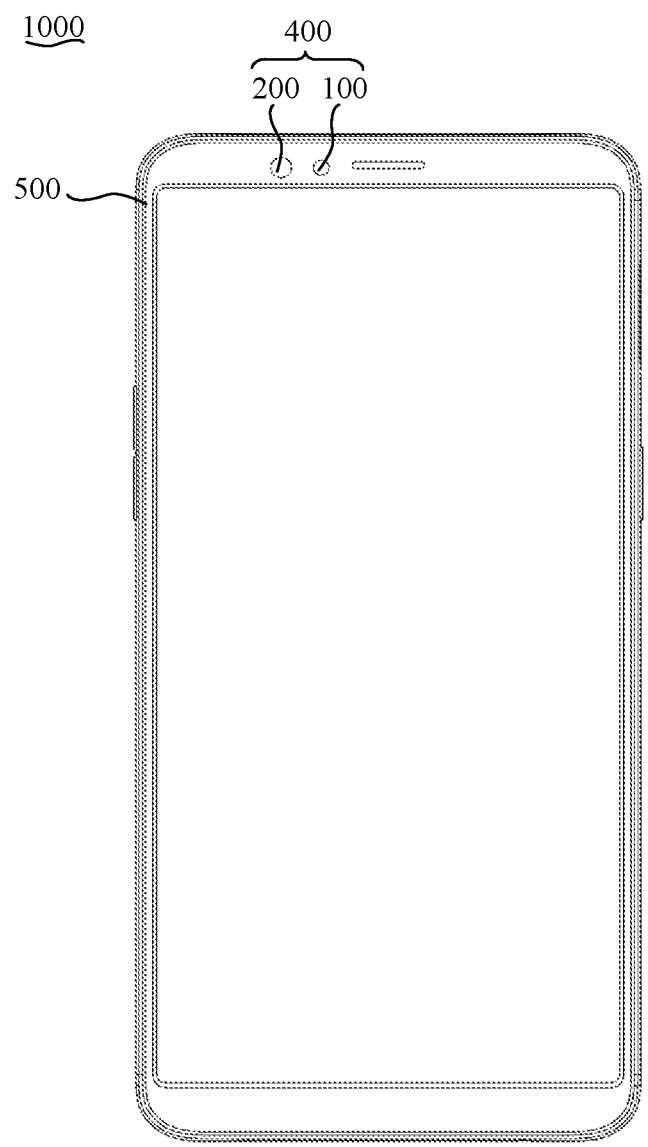
FIGS. 56 to 58 are schematic views illustrating an electronic device according to embodiments of the present disclosure.
Figure 57:
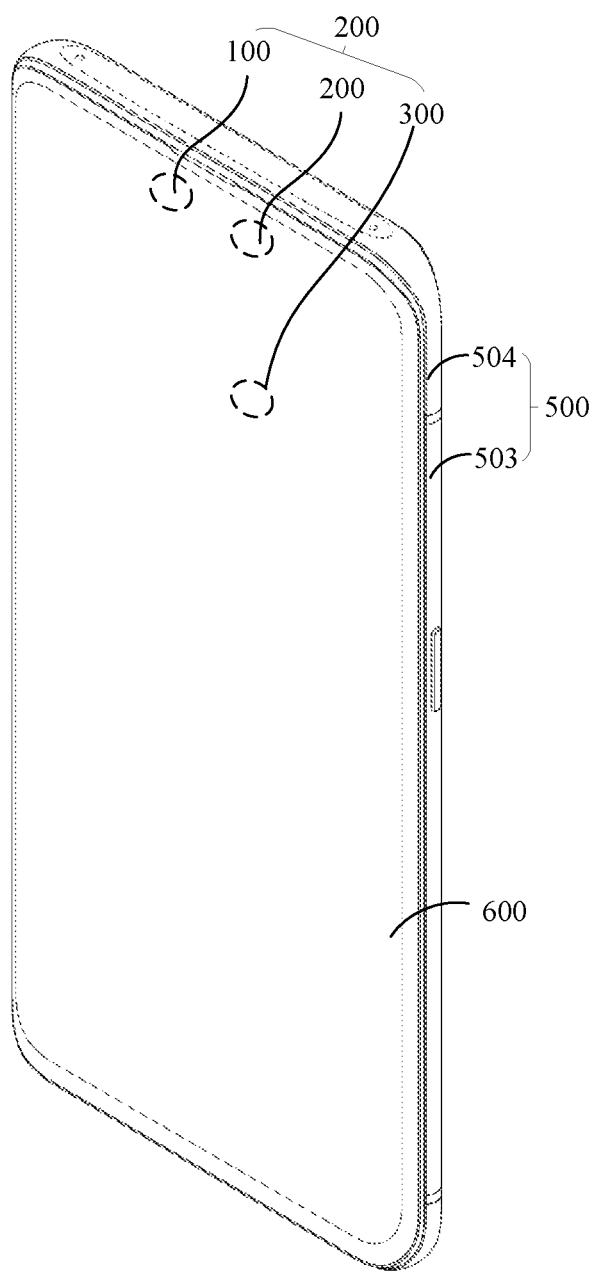
Figure 58:
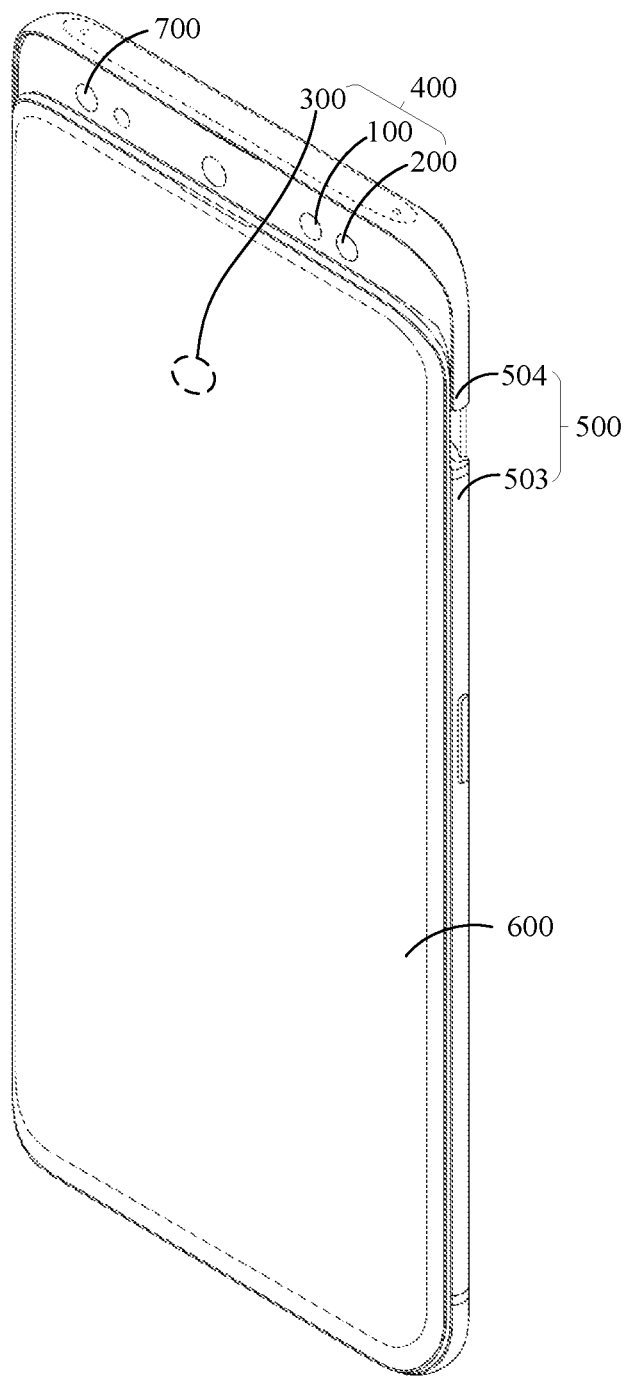

As illustrated in FIGS. 56-58, an electronic device 1000 according to embodiments of the present disclosure includes a housing 500 and the depth camera 400 according to the above embodiments. The depth camera 400 is arranged in the housing 500 and configured to be exposed from the housing 500 to acquire a depth image. The housing 500 can protect the depth camera 400 from dust, water, drop, or the like. The housing 500 is provided with a hole corresponding to the depth camera 400 so as to allow light to go into or out of the housing 500 through the hole. The electronic device 1000 may be a mobile phone, a tablet computer, a laptop computer, a game machine, a head display device, an access control system, a teller machine, a notebook computer, a smart bracelet, a smart helmet, etc. The electronic device 1000 in the embodiments illustrated in FIGS. 53-55 is a mobile phone. It can be understood that the electronic device 1000 may have other specific forms, which is not limited herein.

As illustrated in FIGS. 57 and 58, in an example, the depth camera 400 is accommodated in the housing 500 and is able to extend from the housing 500. In this case, it is not necessary to provide a hole corresponding to a light in-out direction of the depth camera 400 in the housing 500. For example, the housing 500 includes a main body 503 and a movable portion 504, and components such as the depth camera 400 and a visible light camera 700 are mounted to the movable portion 504. The movable portion 504 is configured to move relative to the main body 503 under the driving of a driving device. The movable portion 504 is configured to slide relative to the main body 503 into the main body 503 (as illustrated in FIG. 57) or out of the main body 503 (as illustrated in FIG. 58). When the depth camera 400 needs to be used, the movable portion 504 drives the depth camera 400 to extend out of the housing 500 to the outside. When the depth camera 400 does not need to be used, the movable portion 504 drives the depth camera 400 to be received inside the housing 500 from the outside. In another embodiment, as illustrated in FIG. 54, the electronic device 1000 further includes a display screen 600, and the depth camera 400 is received in the housing 500 and arranged below the display screen 600. In this case, it is also not necessary to provide a hole corresponding to the light in-out direction of the depth camera 400 in the housing 500.

Reference throughout this specification to "an embodiment", "some embodiments", "an example", "a specific example", or "some examples" means that a particular feature, structure, material, or characteristic described in connection with the embodiment or example is included in at least one embodiment or example of the present disclosure. In this specification, exemplary descriptions of aforesaid terms are not necessarily referring to the same embodiment or example. Furthermore, the particular features, structures, materials, or characteristics may be combined in any suitable manner in one or more embodiments or examples. In addition, without conflicting, various embodiments or examples or features of various embodiments or examples described in the present specification may be combined by those skilled in the art.

Moreover, the terms "first" and "second" are used for descriptive purposes only and are not to be construed as indicating or implying a relative importance or implicitly indicating the number of technical features. Thus, features defining "first" or "second" may include at least one of the features, either explicitly or implicitly. In the description of the present disclosure, the meaning of "a plurality" is at least two, for example two, three, unless specifically defined otherwise.

Although embodiments of present disclosure have been shown and described above, it should be understood that above embodiments are just explanatory, and cannot be construed to limit the present disclosure, for those skilled in the art, changes, alternatives, and modifications can be made to the embodiments without departing from the scope of the present disclosure.

What is claimed is:

1. A laser projection module, comprising:
   a substrate assembly;
   a lens barrel assembly comprising a lens barrel and a stop member coupled to the lens barrel, the lens barrel being disposed on the substrate assembly and configured to define a receiving cavity together with the substrate assembly;
   a light source disposed on the substrate assembly, accommodated in the receiving cavity, and configured to emit laser to the receiving cavity; and
   a diffractive optical element and a collimation element accommodated in the receiving cavity, the light source, the collimation element and the diffractive optical element being sequentially disposed in an optical path of the light source, and the stop member being configured to prevent the diffractive optical element from moving in a light-emitting direction of the laser projection module;
   wherein the stop member is configured as a connecting member,
   the lens barrel comprises a first end surface and a second end surface facing away from each other and defines the receiving cavity passing through the first end surface and the second end surface, the first end surface is recessed towards the second end surface to define a mounting groove communicating with the receiving cavity, the diffractive optical element is mounted in the mounting groove, and the collimation element is mounted in the receiving cavity and arranged between the second end surface and the diffractive optical element,
   the connecting member is mounted on a side of the lens barrel where the first end surface is, and the diffractive optical element is clamped between the connecting member and a bottom surface of the mounting groove, wherein the lens barrel further comprises an inner surface located in the receiving cavity and an outer surface facing away from the inner surface, the outer surface of the lens barrel is recessed towards the receiving cavity to provide an annular notch, and a side surface of the notch is provided with an external thread, wherein the connecting member comprises a top wall and a connecting side wall extending from a side of the top wall, the connecting side wall is disposed around the top wall and is provided with an internal thread, the internal thread is screwed with the external thread to mount the connecting member to the lens barrel, the top wall abuts against the diffractive optical element, and an outer surface of the connecting side wall is flush with an outer surface of the barrel.

2. The laser projection module according to claim 1, wherein the lens barrel further comprises an inner surface located in the receiving cavity and an outer surface facing away from the inner surface, and the inner surface enclosing the mounting groove is provided with an internal thread, wherein the connecting member has a cylindrical shape, and an outer side surface of the connecting member is provided with an external thread, and the external thread is screwed with the internal thread to mount the connecting member in the mounting groove.

3. A depth camera, comprising:
a laser projection module, the laser projection module comprising:
  a substrate assembly;
  a lens barrel assembly comprising a lens barrel and a stop member coupled to the lens barrel, the lens barrel being disposed on the substrate assembly and configured to define a receiving cavity together with the substrate assembly;
  a light source disposed on the substrate assembly and accommodated in the receiving cavity; and
  a diffractive optical element and a collimation element accommodated in the receiving cavity, and the stop member being configured to prevent the diffractive optical element from moving in a light-emitting direction of the laser projection module; and
an image acquirer configured to acquire a laser pattern projected by the laser projection module into a target space and reflected back by a target object after modulation;
wherein the stop member is configured as a connecting member,
the lens barrel comprises a first end surface and a second end surface facing away from each other and defines the receiving cavity passing through the first end surface and the second end surface, the first end surface is recessed towards the second end surface to define a mounting groove communicating with the receiving cavity, the diffractive optical element is mounted in the mounting groove, and the collimation element is mounted in the receiving cavity and arranged between the second end surface and the diffractive optical element,
the connecting member is mounted on a side of the lens barrel where the first end surface is, and the diffractive optical element is clamped between the connecting member and a bottom surface of the mounting groove,
wherein the lens barrel further comprises an inner surface located in the receiving cavity and an outer surface facing away from the inner surface, the outer surface of the lens barrel is recessed towards the receiving cavity to provide an annular notch, and a side surface of the notch is provided with an external thread,
wherein the connecting member comprises a top wall and a connecting side wall extending from a side of the top wall, the connecting side wall is disposed around the top wall and is provided with an internal thread, the internal thread is screwed with the external thread to mount the connecting member to the lens barrel, the top wall abuts against the diffractive optical element, and an outer surface of the connecting side wall is flush with an outer surface of the barrel.

4. An electronic device, comprising:
a housing; and
a depth camera disposed in the housing and configured to be exposed from the housing, the depth camera comprising:
  a laser projection module, the laser projection module comprising:
    a substrate assembly;
    a lens barrel assembly comprising a lens barrel and a stop member coupled to the lens barrel, the lens barrel being disposed on the substrate assembly and configured to define a receiving cavity together with the substrate assembly;
    a light source disposed on the substrate assembly and accommodated in the receiving cavity; and
    a diffractive optical element and a collimation element accommodated in the receiving cavity, and the stop member being configured to prevent the diffractive optical element from moving in a light-emitting direction of the laser projection module; and
  an image acquirer configured to acquire a laser pattern projected by the laser projection module into a target space and reflected back by a target object after modulation;
wherein the stop member is configured as a connecting member,
the lens barrel comprises a first end surface and a second end surface facing away from each other and defines the receiving cavity passing through the first end surface and the second end surface, the first end surface is recessed towards the second end surface to define a mounting groove communicating with the receiving cavity, the diffractive optical element is mounted in the mounting groove, and the collimation element is mounted in the receiving cavity and arranged between the second end surface and the diffractive optical element,
the connecting member is mounted on a side of the lens barrel where the first end surface is, and the diffractive optical element is clamped between the connecting member and a bottom surface of the mounting groove,
wherein the lens barrel further comprises an inner surface located in the receiving cavity and an outer surface facing away from the inner surface, the outer surface of the lens barrel is recessed towards the receiving cavity to provide an annular notch, and a side surface of the notch is provided with an external thread,
wherein the connecting member comprises a top wall and a connecting side wall extending from a side of the top wall, the connecting side wall is disposed around the top wall and is provided with an internal thread, the internal thread is screwed with the external thread to mount the connecting member to the lens barrel, the top wall abuts against the diffractive optical element, and an outer surface of the connecting side wall is flush with an outer surface of the barrel.

\* \* \* \* \*